(12) United States Patent
Lin et al.

(10) Patent No.: US 11,855,164 B2
(45) Date of Patent: *Dec. 26, 2023

(54) SEMICONDUCTOR DEVICE AND FABRICATION METHOD THEREOF

(71) Applicant: TAIWAN SEMICONDUCTOR MANUFACTURING CO., LTD., Hsinchu (TW)

(72) Inventors: Cheng-Ming Lin, Kaohsiung (TW); Peng-Soon Lim, Johor (MY); Zi-Wei Fang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 112 days.

This patent is subject to a terminal disclaimer.

(21) Appl. No.: 17/327,584

(22) Filed: May 21, 2021

(65) Prior Publication Data
US 2021/0280679 A1 Sep. 9, 2021

Related U.S. Application Data

(60) Continuation of application No. 16/875,877, filed on May 15, 2020, now Pat. No. 11,018,232, which is a division of application No. 16/059,900, filed on Aug. 9, 2018, now Pat. No. 10,665,685.

(60) Provisional application No. 62/593,129, filed on Nov. 30, 2017.

(51) Int. Cl.
| | |
|---|---|
| *H01L 29/417* | (2006.01) |
| *H01L 21/8234* | (2006.01) |
| *H01L 29/78* | (2006.01) |
| *H01L 29/66* | (2006.01) |
| *H01L 21/8238* | (2006.01) |

(52) U.S. Cl.
CPC ........ *H01L 29/41791* (2013.01); *H01L 21/823437* (2013.01); *H01L 21/823842* (2013.01); *H01L 29/66545* (2013.01); *H01L 29/66795* (2013.01); *H01L 29/785* (2013.01); *H01L 21/823821* (2013.01)

(58) Field of Classification Search
CPC ....... H01L 21/82384; H01L 21/823437; H01L 21/823821; H01L 20/0847; H01L 29/0653; H01L 29/41791; H01L 29/823842; H01L 29/785; H01L 29/0847; H01L 29/66545

See application file for complete search history.

(56) References Cited

U.S. PATENT DOCUMENTS

| | | | |
|---|---|---|---|
| 6,110,571 A * | 8/2000 | Yaginuma | C23C 14/024 428/472 |
| 2004/0253776 A1 | 12/2004 | Hoffmann | |
| 2010/0048009 A1 | 2/2010 | Hasegawa | |
| 2010/0072170 A1 | 3/2010 | Wu | |
| 2010/0102417 A1 | 4/2010 | Ganguli | |

(Continued)

*Primary Examiner* — Galina G Yushina
(74) *Attorney, Agent, or Firm* — Maschoff Brennan

(57) ABSTRACT

A semiconductor device includes a substrate, a semiconductor fin extending from the substrate, a gate dielectric layer over the semiconductor fin, a metal nitride layer comprising a first portion over the gate dielectric layer and a second portion over the first portion, and a fill layer over the metal nitride layer. The second portion has an aluminum concentration greater than an aluminum concentration of the first portion.

20 Claims, 72 Drawing Sheets

(56) References Cited

U.S. PATENT DOCUMENTS

| | | | |
|---|---|---|---|
| 2011/0207273 A1* | 8/2011 | Jeong | H01L 29/517 |
| | | | 438/231 |
| 2013/0277748 A1* | 10/2013 | Lee | H01L 29/785 |
| | | | 257/288 |
| 2014/0264630 A1* | 9/2014 | Huang | H01L 21/76898 |
| | | | 257/401 |
| 2016/0141179 A1* | 5/2016 | Wu | H01L 21/28556 |
| | | | 257/288 |
| 2016/0322471 A1 | 11/2016 | Jangjian | |
| 2016/0351444 A1 | 12/2016 | Schloss | |
| 2016/0372470 A1 | 12/2016 | Ok | |
| 2017/0025259 A1 | 1/2017 | Ramachers | |
| 2017/0236759 A1 | 8/2017 | Jangannathan | |
| 2017/0263604 A1 | 9/2017 | Lin | |
| 2020/0227756 A1* | 7/2020 | Ashizawa | H01M 4/66 |

* cited by examiner

SEMICONDUCTOR DEVICE AND FABRICATION METHOD THEREOF

PRIORITY CLAIM AND CROSS-REFERENCE

The present application is a continuation of the U.S. application Ser. No. 16/875,877, filed May 15, 2020, now U.S. Pat. No. 11,018,232, issued May 25, 2021, which is a divisional of the U.S. application Ser. No. 16/059,900, filed Aug. 9, 2018, now U.S. Pat. No. 10,665,685, issued May 26, 2020, which claims priority to U.S. Provisional Application Ser. No. 62/593,129, filed Nov. 30, 2017, all of which are herein incorporated by reference in their entirety.

BACKGROUND

The electronics industry has experienced an ever increasing development for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
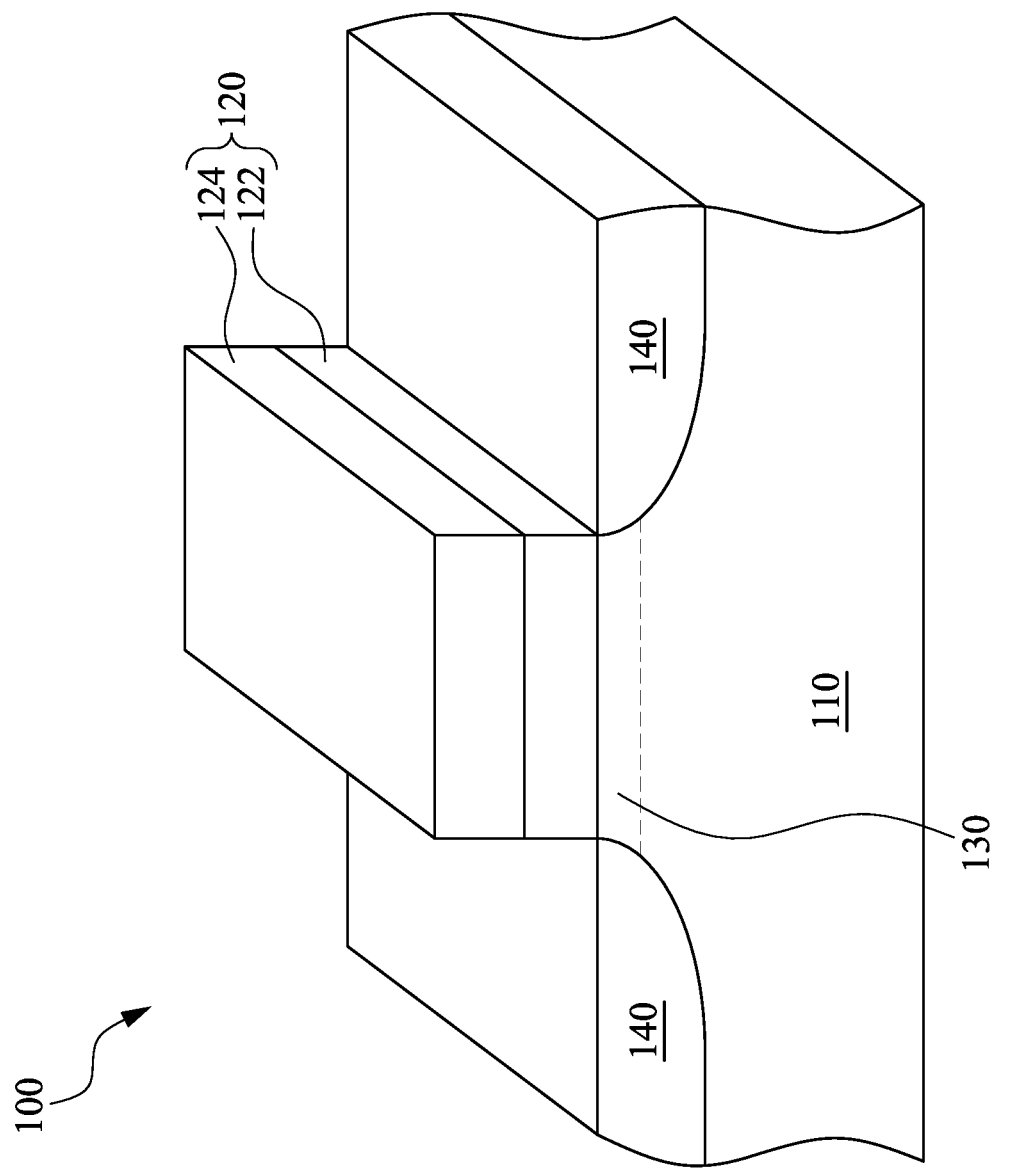
FIG. 1 is a cross-sectional view of a planar transistor according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Present disclosure presents embodiments in the form of methods of gate stack formation and related gate stack structures, which may be employed in any of a variety of device types. For example, embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure. For example, some embodiments as described herein may also be applied to the formation of contacts, vias, or interconnects.

With reference to the example of FIG. 1, illustrated therein is an MOS transistor 100, providing an example of merely one device type which may include embodiments of the present disclosure. It is understood that the exemplary transistor 100 is not meant to be limiting in any way, and those of skill in the art will recognize that embodiments of the present disclosure may be equally applicable to any of a variety of other device types, such as those described above. The transistor 100 is fabricated on a substrate 110 and includes a gate stack 120. The substrate 110 may be a semiconductor substrate such as a silicon substrate. The substrate 110 may include various layers, including conductive or insulating layers formed on the substrate 110. The substrate 110 may include various doping configurations. The substrate 110 may also include other semiconductors such as germanium, silicon carbide (SiC), silicon germanium (SiGe), or diamond. Alternatively, the substrate 110 may include a compound semiconductor and/or an alloy semiconductor. Further, in some embodiments, the substrate 110 may include an epitaxial layer (epi-layer), the substrate 110 may be strained for performance enhancement, the substrate 110 may include a silicon-on-insulator (SOI) structure, and/or the substrate 110 may have other suitable enhancement features.

The gate stack 120 includes a gate dielectric layer 122 and a gate electrode 124 disposed on the gate dielectric layer 122. In some embodiments, the gate dielectric layer 122 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some embodiments, the gate dielectric layer 122 includes a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric layer 122 may include silicon dioxide or other suitable dielectric. The gate dielectric layer 122 may be formed by ALD, physical vapor deposition (PVD), oxidation, and/or other suitable methods. In some embodiments, the gate electrode 124 may be deposited as part of a gate first or gate last (e.g., replacement gate) process. In various embodiments, the gate electrode 124 includes a conductive layer such as W, TiN, TaN, WN, Re, Ir, Ru, Mo, Al, Cu, Co, Ni, combinations thereof, and/or other suitable compositions. In some examples, the gate electrode 124 may include a first metal material suitable for an N-type transistor and a second metal material suitable for a P-type transistor. Thus, the transistor 100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 130 of the transistor 100. Similarly, the second metal material (e.g., for P-type devices) may include metals having a work function substantially aligned with a work function of the substrate valence band, or at least substantially aligned with a work function of the valence band of the channel region 130 of the transistor 100. Thus, the gate electrode 124 may provide a gate electrode for the transistor 100, including both N-type and P-type devices. In some embodiments, the metal suitable for the N-type transistor can be referred to as an N-work function metal (or N-type work-function), which has a work function lower than a mid-gap wok function (about 4.5 eV) that is in the middle of the valance band and the conduction band of silicon. On the other hand, the metal suitable for the P-type transistor can be referred to as a P-work function metal (or P-type work-function) having a work function higher than the mid-gap work function of silicon. In some embodiments, the gate electrode 124 may alternately or additionally include a polysilicon layer. In various examples, the gate electrode 124 may be formed using PVD, CVD, electron beam (e-beam) evaporation, and/or other suitable process. In some embodiments, gate spacers are formed on sidewalls of the gate stack 120. Such gate spacers may include a dielectric material such as silicon oxide, silicon nitride, silicon carbide, silicon oxynitride, or combinations thereof.

The transistor 100 further includes source/drain region 140 formed within the semiconductor substrate 110, adjacent to and on opposite sides of the gate stack 120. In some embodiments, the source/drain regions 140 include diffused source/drain regions, ion implanted source/drain regions, epitaxially grown regions, or combinations thereof. The channel region 130 of the transistor 100 is defined as the region between the source/drain regions 140 and under the gate dielectric layer 122, and within the semiconductor substrate 110. When a bias voltage greater than a threshold voltage ($V_t$) (i.e., turn-on voltage) for the transistor 100 is applied to the gate electrode 124 along with a concurrently applied bias voltage between the source/drain regions 140, an electric current (e.g., a transistor drive current) flows between the source/drain regions 140 through the channel region 130. The amount of drive current developed for a given bias voltage (e.g., applied to the gate electrode 124 or between the source and drain regions 140) is a function of, among others, the mobility of the material used to form the channel region 130. In some embodiments, the channel region 130 includes silicon (Si) and/or a high-mobility material such as germanium, as well as any of the plurality of compound semiconductors or alloy semiconductors discussed previously. High-mobility materials include those materials with electron and/or hole mobility greater than silicon (Si), which has an intrinsic electron mobility at room temperature (300 K) of about 1350 $cm^2$/V-s and a hole mobility of about 480 $cm^2$/V-s.

Figure 2:
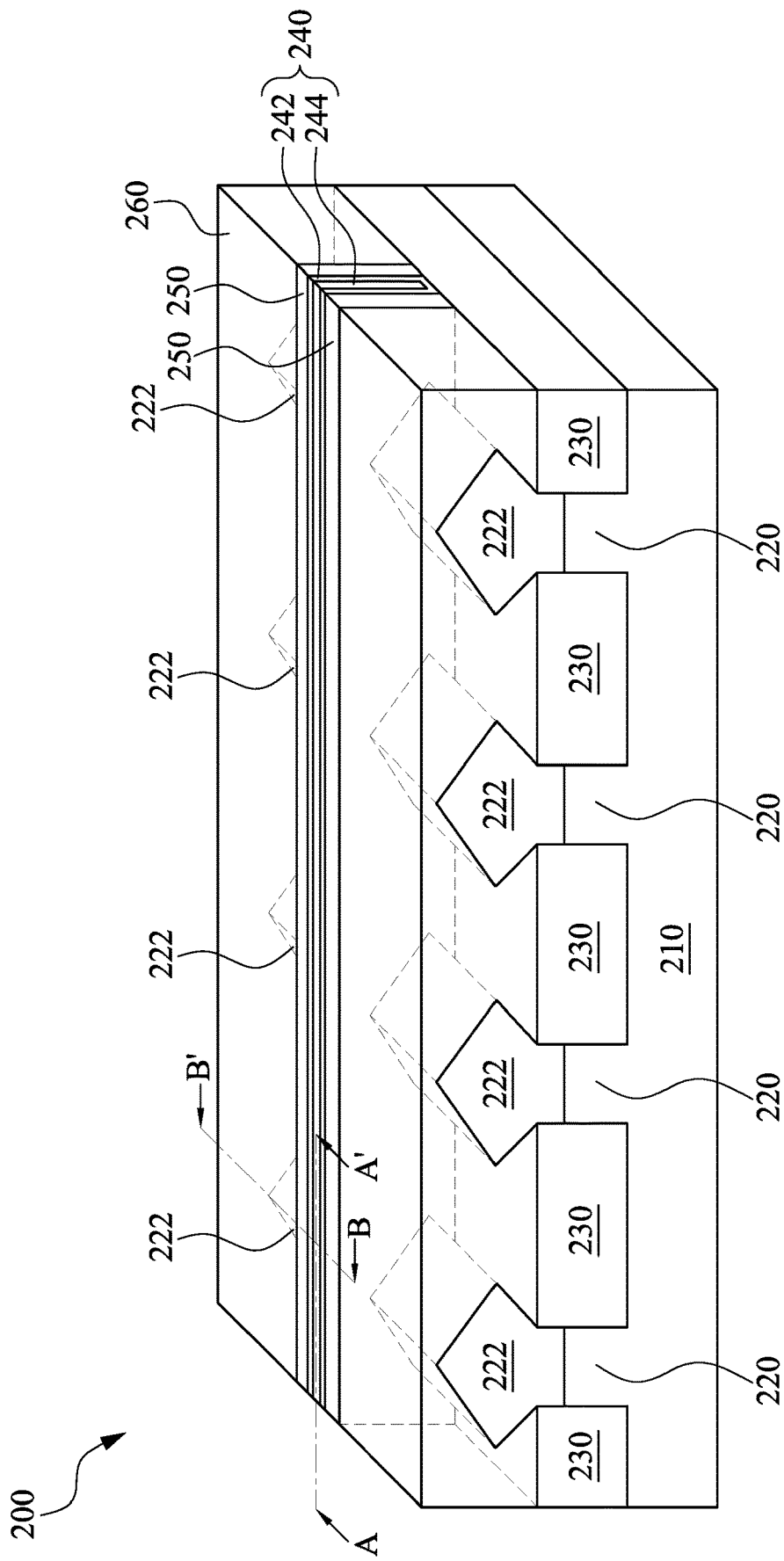
FIG. 2 is perspective view of a FinFET according to some embodiments of the present disclosure.

Referring to FIG. 2, illustrated therein is a FinFET device 200, providing an example of an alternative device type which may include embodiments of the present disclosure. By way of example, the FinFET device 200 includes one or more fin-based, multi-gate field-effect transistors (FETs). The FinFET device 200 includes a substrate 210, one or more fins 220 extending from the substrate 210, isolation regions 230, a gate stack 240 wrapping around one or more fins 220, gate spacers 250 along opposite sides of the gate stack 240, and an interlayer dielectric (ILD) layer 260 over source/drain regions 222 formed on the fins 220. The substrate 210 may be a semiconductor substrate such as a silicon substrate. In various embodiments, the substrate 210 may be substantially the same as the substrate 110, as described above.

The fins 220, like the substrate 210, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 220 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, pattering the resist to form the making element may be performed using an electron beam (e-beam) lithography process. The masking element may then be used to protect regions of the substrate while an etch process forms recesses into the silicon layer, thereby leaving an extending fin 220. The recesses may be etched using a dry etch (e.g., chemical oxide removal), a wet etch, and/or other suitable processes. Numerous other embodiments of methods to form the fins 220 on the substrate 210 may also be used.

Each of the plurality of fins 220 include source/drain regions 222 where the source/drain regions 222 are formed in, on, and/or surrounding the fin 220. The source/drain regions 222 may be epitaxially grown over the fins 220. In addition, a channel region of a transistor is disposed within the fin 220, underlying the gate stack 240. In some embodiments, the channel region of the fin includes a high-mobility material, as described above.

The isolation regions 230 may be shallow trench isolation (STI) features. Alternatively, a field oxide, a local oxidation of silicon (LOCOS) feature, and/or other suitable isolation features may be implemented on and/or within the substrate 210. The isolation regions 230 may be composed of silicon oxide, silicon nitride, silicon oxynitride, fluorine-doped silicate glass (FSG), a low-k dielectric, combinations thereof, and/or other suitable material. In some embodiments, the isolation structures are STI features and are formed by etching trenches in the substrate 210. The trenches may then be filled with isolating material, followed by a chemical mechanical polish (CMP) process. However, other embodiments are possible. In some embodiments, the isolation regions 230 may include a multi-layer structure, for example, having one or more liner layers.

The gate stack 240 is formed between gate spacers 250. The gate stack 240 includes a gate dielectric layer 242 formed over the channel region of the fin 220, and a gate electrode 244 formed over the gate dielectric layer 242. In some embodiments, the gate dielectric layer 242 is substantially the same as the gate dielectric layer 122 and may include high-k dielectrics similar to that used for the gate dielectric layer 122. Similarly, in various embodiments, the gate electrode 244 is substantially the same as the gate electrode 124, described above. The gate spacers 250 may include a dielectric material such as silicon oxide, silicon nitride, silicon carbide, silicon oxynitride, the like, or combinations thereof.

Embodiments of the present disclosure offer advantages, though it is understood that other embodiments may offer different advantages, not all advantages are necessarily discussed herein, and no particular advantage is required for all embodiments. For example, embodiments discussed herein are directed to a treatment during fabricating a gate stack so as to improve control of threshold voltage of a transistor. In some embodiments, the treatment is a thermal soaking process to soak an intermediate structure of the gate stack in a silicon-containing gas or an aluminum-containing gas in a non-plasma ambient at an elevated temperature, for example, about 200° C. or higher. In some embodiments, the treatment is performed with plasma, such that the silicon-containing gas or aluminum-containing gas can be ionized.

In some embodiments, the treatment and other processes for forming the gate stack (e.g., a subsequent ALD process) may be performed in-situ. In some cases, the treatment and the subsequent ALD process may not be performed sequentially and in-situ. As used herein, the term "in-situ" is used to describe processes that are performed while a device or substrate remains within a processing system (e.g., including a load lock chamber, transfer chamber, processing chamber, or any other fluidly coupled chamber), and where for example, the processing system allows the substrate to remain under vacuum conditions. As such, the term "in-situ" may also generally be used to refer to processes in which the device or substrate being processed is not exposed to an external environment (e.g., external to the processing system). At least some embodiments of the present disclosure are directed to threshold voltage tuning for devices manufactured using a 10 nanometer, 7 nanometer, 5 nanometer or 3 nanometer process technology, although it will be understood that embodiments disclosed herein may be equally applied to other process technologies without departing from the scope of the present disclosure.

Figure 3:
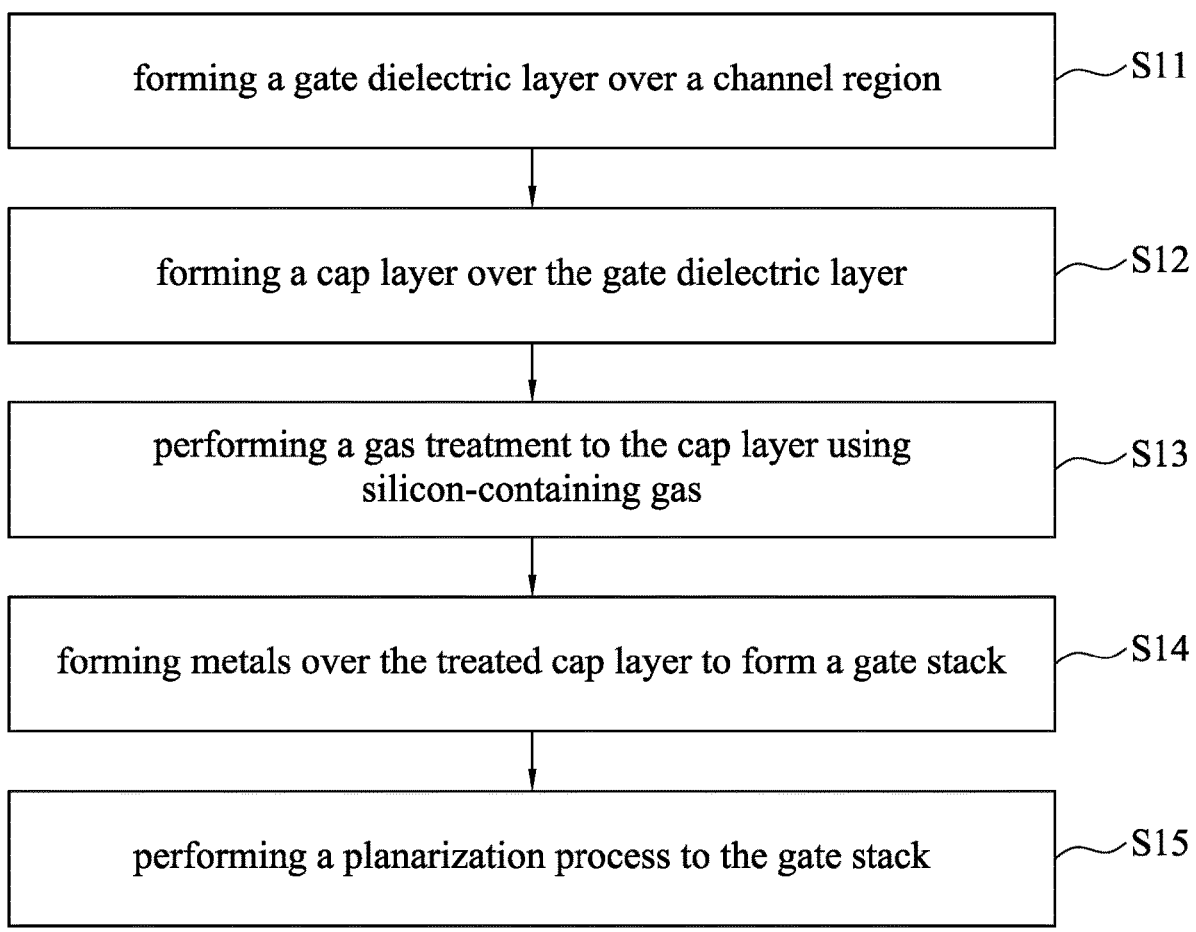
FIG. 3 is a flow chart of a method of forming a gate stack in accordance with some embodiments.

Referring now to FIG. 3, illustrated is a method M1 of forming a gate stack in accordance with some embodiments. The method M1 may be implemented on a planar device, such as the exemplary transistor 100 described above with reference to FIG. 1 as well as on a multi-gate device, such as the FinFET device 200 described above with reference to FIG. 2. Thus, one or more aspects discussed above with reference to the transistor 100 and/or the FinFET device 200 may also apply to the method M1. In various embodiments, the method M1 may be implemented on other devices such as gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices.

It is understood that parts of the method M1 and/or any of the exemplary transistor devices discussed with reference to the method M1 may be fabricated by a complementary metal-oxide-semiconductor (CMOS) technology process flow, and thus some processes are briefly described herein. Further, it is understood that any exemplary transistor devices discussed herein may include various other devices and features, such as additional transistors, bipolar junction transistors, resistors, capacitors, diodes, fuses, etc., but are simplified for a better understanding of the inventive concepts of the present disclosure. Further, in some embodiments, the exemplary transistor device(s) disclosed herein may include a plurality of semiconductor devices (e.g., transistors), which may be interconnected. In addition, in some embodiments, various aspects of the present disclosure may be applicable to either one of a gate-last process or a gate-first process.

FIGS. 4A, 5A, 6A, 7A and 8A are cross-sectional views of a semiconductor device 300 at various stages of the method M1 of FIG. 3 along a first cut (e.g., A-A' cut in FIG. 2) in some embodiments of the present disclosure. FIGS. 4B, 5B, 6B, 7B and 8B are cross-sectional views of the semiconductor device 300 at various stages of the method M1 of FIG. 3 along a second cut (e.g., B-B' cut in FIG. 2) in some embodiments of the present disclosure. FIGS. 4A-8B illustrate fabrication of a gate stack of a FinFET device using a gate-last process, which indicates that the fabrication of gate stack is subsequent to formation of source/drain regions (e.g., source/drain regions 222 as shown in FIG. 2) and an ILD layer (e.g., the ILD layer 260 as shown in FIG. 2) over the source/drain regions. The illustration is merely exemplary and is not intended to be limiting beyond what is specifically recited in the claims that follow. It is understood that additional operations may be provided before, during, and after the operations shown by FIG. 3, and some of the operations described below can be replaced or eliminated for additional embodiments of the method. The order of the operations/processes may be interchangeable.

Figure 4A:
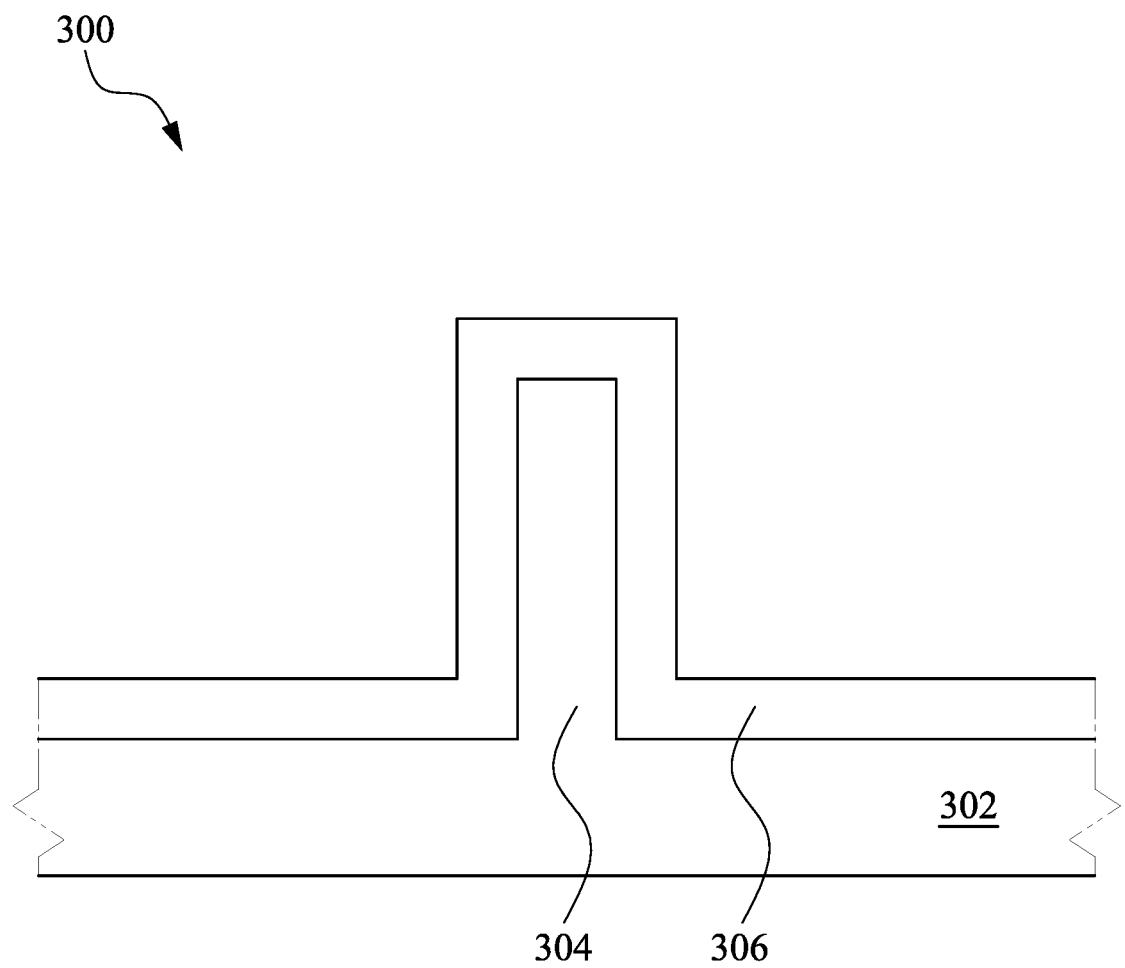
FIGS. 4A, 5A, 6A, 7A and 8A are cross-sectional views of a semiconductor device at various stages of the method of FIG. 3 along a first cut in some embodiments of the present disclosure.
Figure 4B:
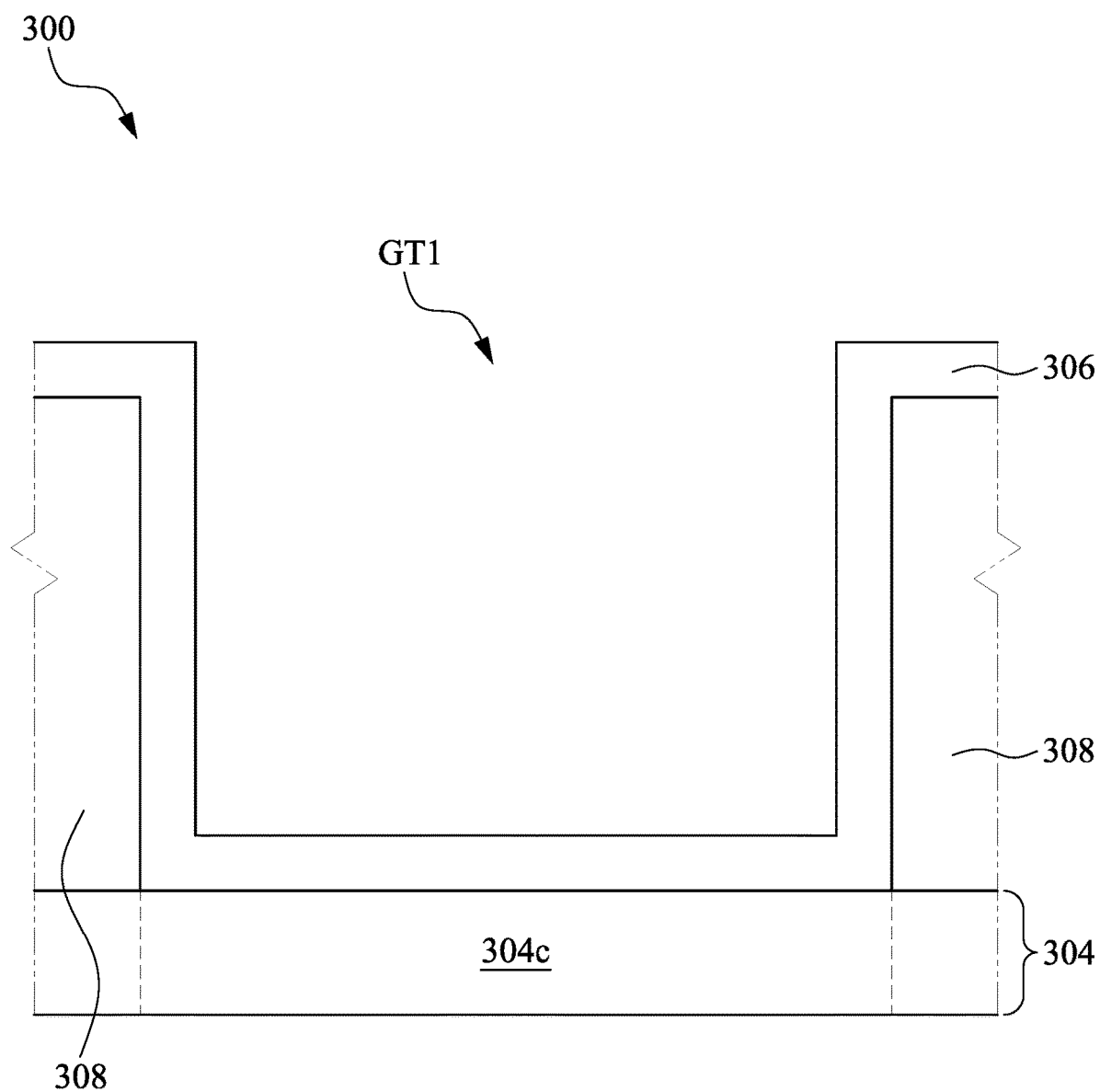
FIGS. 4B, 5B, 6B, 7B and 8B are cross-sectional views of the semiconductor device at various stages of the method of FIG. 3 along a second cut in some embodiments of the present disclosure.

The method M1 begins at block S11 where a gate dielectric layer is formed over a channel region. Referring to FIGS. 4A and 4B, in some embodiments of block S11, a gate dielectric layer 306 is conformally formed over a semiconductor fin 304 extending from a substrate 302, and the gate dielectric layer 306 is conformally formed in a gate trench GT1 between gate spacers 308. The gate trench GT1 is created by removal of a dummy polysilicon gate (not shown) between the gate spacers 308 after formation of an ILD layer (e.g., the ILD layer 260 as shown in FIG. 2). A portion of the semiconductor fin 304 under the gate trench GT1 can serve as a channel region 304c of the semiconductor device 300. The gate dielectric layer 306 includes, for example, a high-k dielectric layer such as $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$, $BaTiO_3$, BaZrO, HfZrO, HfLaO, HfSiO, LaSiO, AlSiO, HfTaO, HfTiO, $(Ba,Sr)TiO_3$, $Al_2O_3$, $Si_3N_4$, oxynitrides, combinations thereof, or other suitable material. In some embodiments, the gate dielectric layer 306 has a thickness from about 10 angstroms to about 30 angstroms. In some embodiments, the gate dielectric layer 306 is a multilayer structure such as one layer of silicon oxide (e.g., interfacial layer) and another layer of high-k material. The gate dielectric layer 306 may be formed by a deposition processes, such as chemical vapor deposition (CVD), physical vapor deposition (PVD), atomic layer deposition (ALD), plasma enhanced CVD (PECVD), other suitable techniques, or combinations thereof.

Figure 5A:
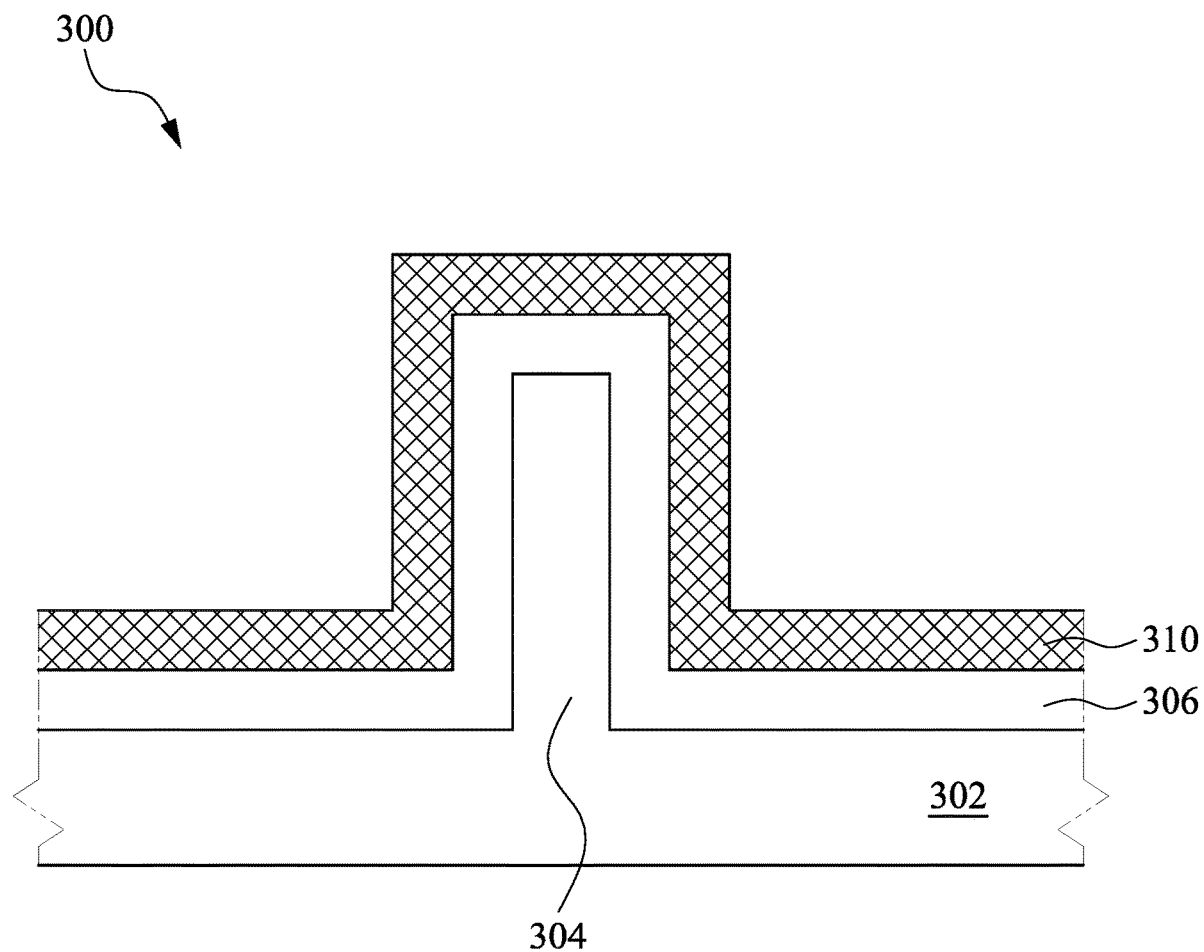
Figure 5B:
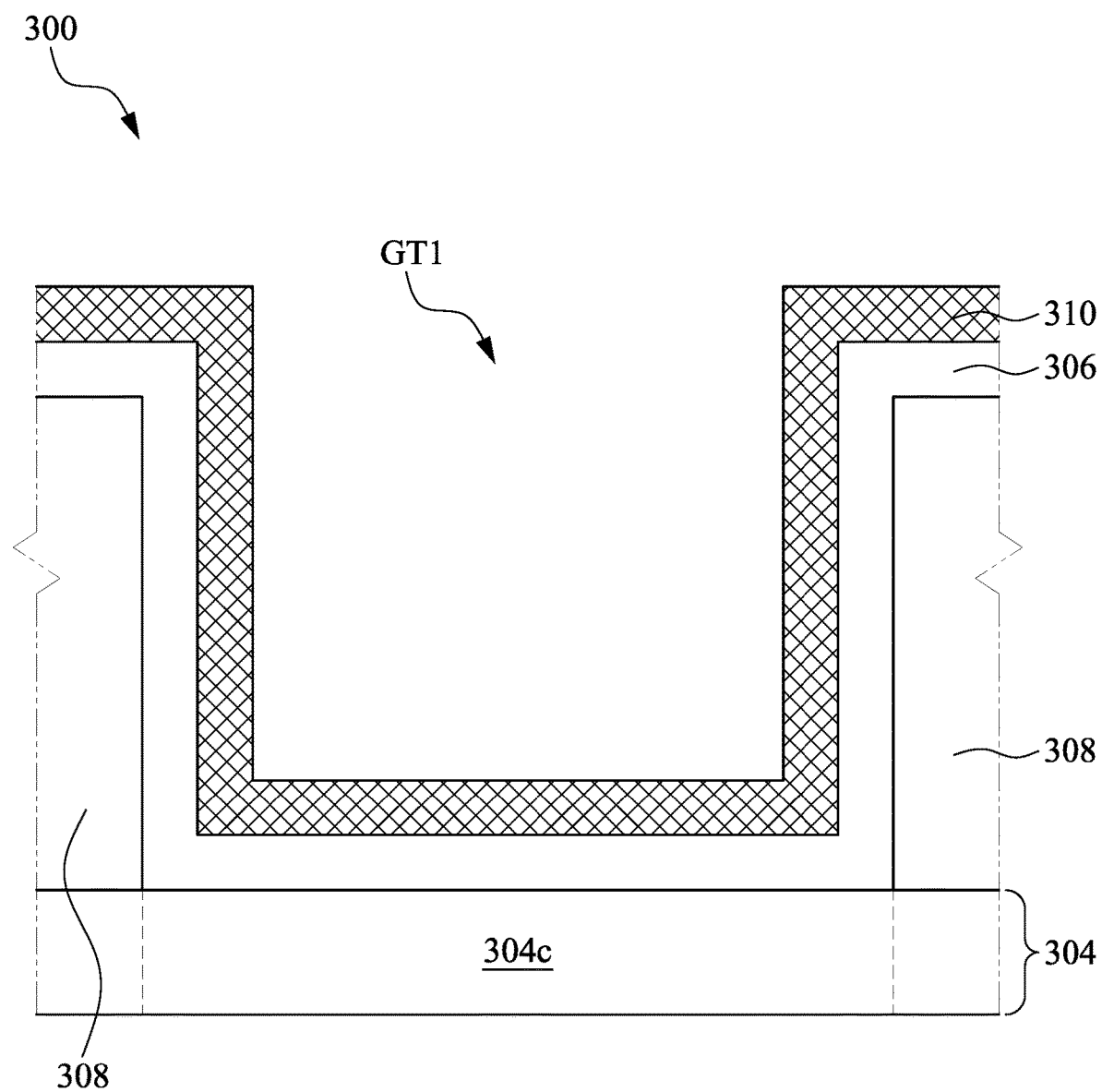

Returning to FIG. 3, the method M1 then proceeds to block S12 where a cap layer is formed over the gate dielectric layer. With reference to FIGS. 5A and 5B, in some embodiments of block S12, a cap layer 310 is conformally formed over the gate dielectric layer 306 and in the gate trench GT1. In some embodiments, the cap layer 310 includes metals such as titanium nitride (TiN), tantalum nitride (TaN), silicide or other suitable materials. The cap layer 310 made of metal may be equivalently referred to as a metal element-containing layer. In some embodiments, the cap layer 310 has a thickness from about 10 angstroms to about 30 angstroms. In some embodiments, the cap layer 310 functions as a diffusion barrier to protect the capped gate dielectric layer 306. In some embodiments, the cap layer 310 is formed by deposition techniques such as at least one of ALD, PVD or CVD. In some embodiments, the capping layer 310 is optional and thus is not formed.

Figure 6A:
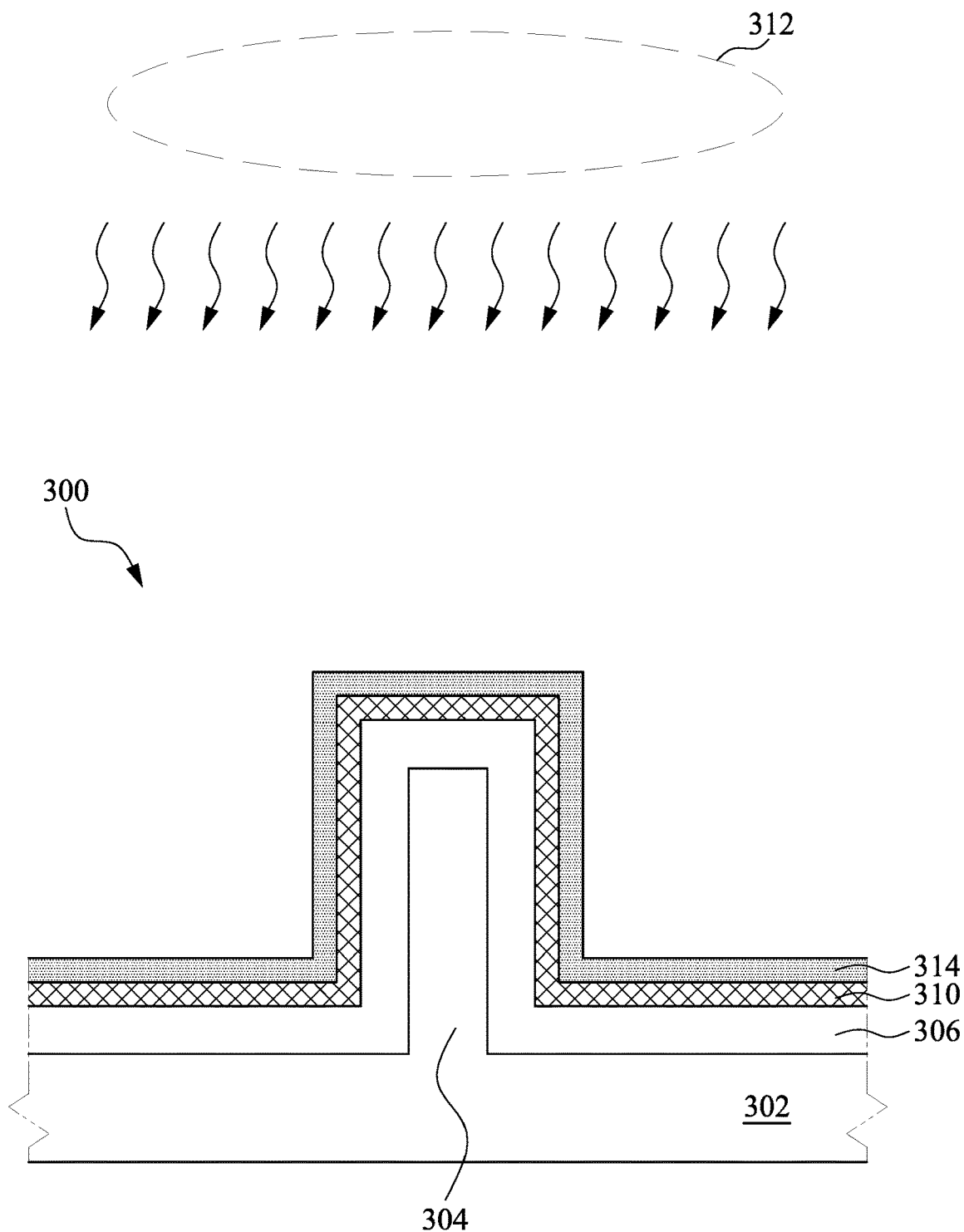
Figure 6B:
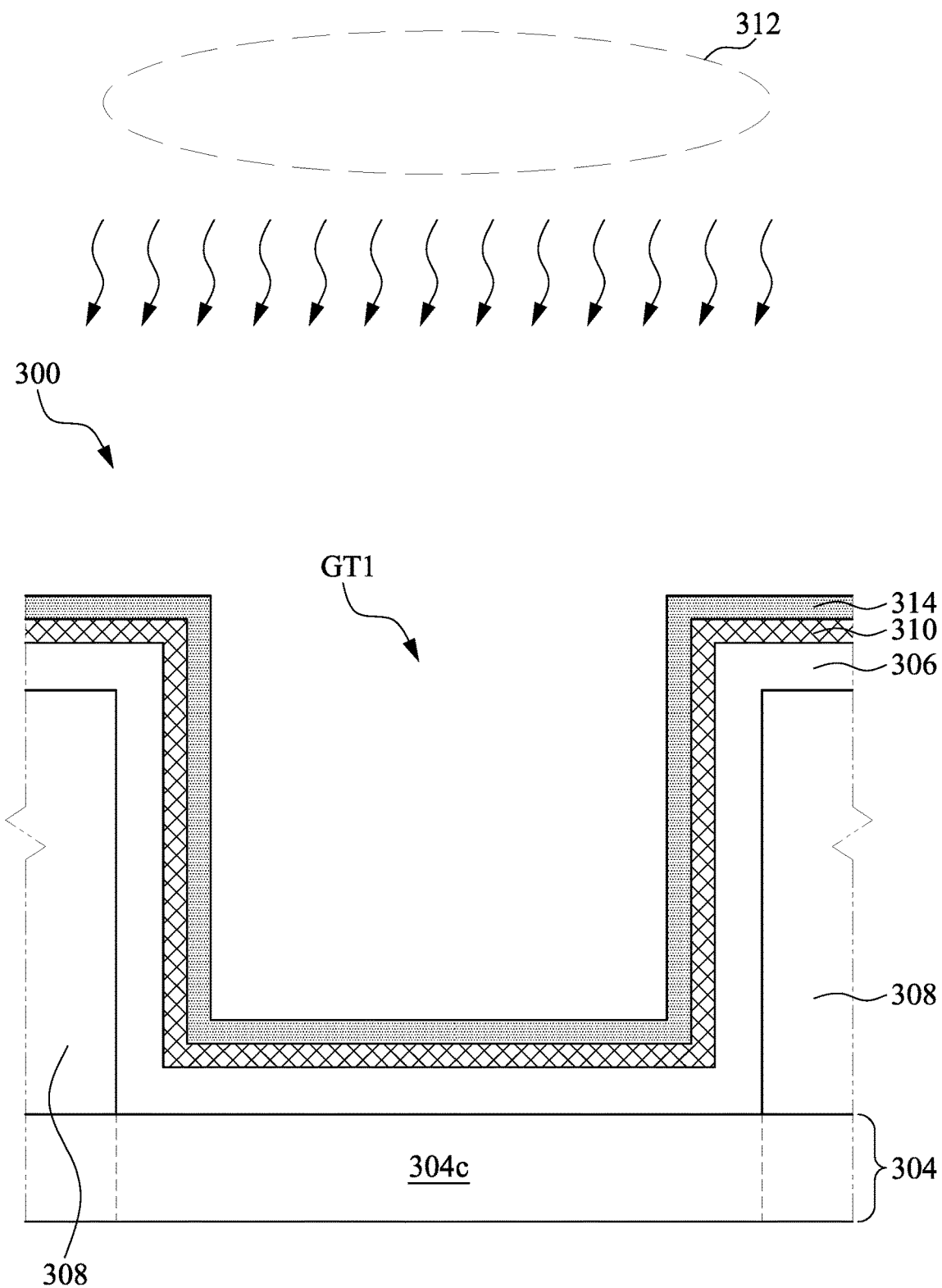

The method M1 then proceeds to block S13 where a treatment using a silicon-containing gas or plasma is performed to the cap layer. With reference to FIGS. 6A and 6B, in some embodiments of block S13, a treatment 312 using the silicon-containing gas or plasma is carried out such that a constituent (e.g., silicon) of the silicon-containing gas or plasma is diffused into the exposed cap layer 310. In this way, some silicon atoms diffuse into the cap layer 310 and in turn bond with atoms in the cap layer 310 to form a silicon compound (e.g., silicon nitride). As a result, a surface layer (i.e., a top portion) of the cap layer 310 is converted to a silicon-containing layer 314 that has higher silicon concentration than the remaining underlying cap layer 310. In some embodiments, the cap layer 310 and the silicon-containing layer 314 are in combination referred to as a metal element-containing layer, wherein the silicon-containing layer 314 is a top portion of the metal element-containing layer, and the cap layer 310 is a bottom portion of the metal element-containing layer. In some embodiments, the silicon concentration of the silicon-containing layer 314 (i.e., the atomic ratio of silicon to all chemical elements in the silicon-containing layer 314, expressed in terms of percentage)

ranges from about 5% to about 30%, while the silicon concentration of the underlying cap layer 310 (i.e., the atomic ratio of silicon to all chemical elements in the cap layer 310, expressed in terms of percentage) is less than about 1%. The resulting silicon-containing layer 314 has a thickness from about 5 Angstroms to about 50 Angstroms. If the thickness of the silicon-containing layer 314 is greater than about 50 Angstroms, the threshold voltage of the gate stack might be unsatisfactory. If the thickness of the silicon-containing layer 314 is less than about 5 Angstroms, the silicon-containing layer 314 might be too thin to prevent oxidation of the cap layer 310. In some embodiments, the silicon-containing layer 314 may be equivalently referred to as a dopant-containing layer that comprises a dopant of the dopant-containing gas (i.e., silicon of the silicon-containing gas). In some embodiments, the silicon-containing layer 314 has a chemical element the same as a chemical element of the cap layer 310 because the silicon-containing layer 314 includes a doped region of the cap layer 310. By way of example, in some embodiments where the cap layer 310 is TiN, the silicon-containing layer 314 includes nitrogen as well. In some embodiments, the silicon-containing layer 314 includes a compound of silicon and a chemical element of the cap layer 310. By way of example, in some embodiments where the cap layer 310 is TiN, silicon in the silicon-containing layer 314 may bond with nitrogen to form a silicon nitride.

In some embodiments, the treatment and deposition of the cap layer 310 are in-situ performed, for example, within a processing system using an ALD cluster tool. In various embodiments, conditions of the treatment 312 (e.g., including selection of the silicon-containing gas, gas treatment temperature, gas treatment pressure, and flow rate of the silicon-containing gas) are selected so as to diffuse silicon atoms into the cap layer 310 to form a silicon-containing layer 314 over the cap layer 310. This is advantageous to prevent the cap layer 310 from oxidation because the cap layer 310 is covered by the silicon-containing layer 314 in an in-situ process. It is understood that oxidation of the cap layer 310 would lead to unwanted increase of threshold voltage of the semiconductor device 300. However, since oxidation of the cap layer 310 is mitigated, the unwanted increase of the threshold voltage can be addressed. In some embodiments, some silicon atoms in the silicon-containing layer 314 may be oxidized so that the silicon-containing layer may include silicon oxide. In some embodiments, the silicon-containing layer 314 may include silicon oxynitride, silicon oxycarbide, the like, or combinations thereof.

In some embodiments, the treatment 312 is a thermal soaking process to soak the semiconductor device 300 in a silicon-containing gas in a non-plasma ambient at an elevated temperature. For example, during the treatment 312, a gas mixture of the silicon-containing gas and an argon gas (serving as a carrier gas) may be introduced into a processing chamber of the processing example, at a temperature from about 200° C. to about 500° C., at a pressure from about system (e.g., where the processing chamber houses the substrate having the cap layer), for 3 torr to about 10 torr, at a silicon-containing-gas-to-the-argon-gas flow rate ratio approximately from 0.5 to 2, and for a duration approximately from 10 seconds to 600 seconds. If the flow rate ratio is higher than about 2, unwanted silicon-containing particles may be formed on the surface of the silicon-containing layer 314. If the flow rate is lower than about 0.5, the silicon-containing layer 314 may be too thin to prevent the cap layer 310 from oxidation. If the temperature is higher than about 500° C., unwanted decomposition of the silicon-containing gas before reaching the semiconductor device 300 might occur. If the temperature is lower than about 200° C., diffusion of the silicon atoms might not occur. If the pressure is higher than about 10 torr, unwanted silicon-containing particles might be formed on the silicon-containing layer 314. If the pressure is lower than about 3 torr, diffusion of the silicon atoms might not occur. If the duration is longer than about 600 seconds, the silicon concentration might be too high to achieve a desired electrical performance. If the duration is shorter than about 10 seconds, diffusion of the silicon atoms might not occur.

In some embodiments, the treatment 312 is performed with plasma, such that the silicon-containing gas can be ionized. The plasma power is in a range from about 50 W to about 500 W. The power supply voltage is in a range from about 15 V to about 30 V. The carrier gas is an argon gas. If the plasma power and the power supply voltage are out of the above-described selected ranges, the silicon concentration of the silicon-containing layer 314 might be unsatisfactory for the gate stack. The treatment 312 with plasma can be performed at a temperature from about 200° C. to about 500° C., at a pressure from about system (e.g., where the processing chamber houses the substrate having the cap layer), for 3 torr to about 10 torr, at a silicon-containing-gas-to-the-argon-gas flow rate ratio approximately from 0.5 to 2, and for a duration approximately from 10 seconds to 600 seconds. If the flow rate ratio is higher than about 2, unwanted silicon-containing particles may be formed on the surface of the silicon-containing layer 314. If the flow rate is lower than about 0.5, the silicon-containing layer 314 may be too thin to prevent the cap layer 310 from oxidation. If the temperature is higher than about 500° C., unwanted decomposition of the silicon-containing gas before reaching the semiconductor device 300 might occur. If the temperature is lower than about 200° C., diffusion of the silicon atoms might not occur. If the pressure is higher than about 10 torr, unwanted silicon-containing particles might be formed on the silicon-containing layer 314. If the pressure is lower than about 3 torr, diffusion of the silicon atoms might not occur. If the duration is longer than about 600 seconds, the silicon concentration might be too high to achieve a desired electrical performance. If the duration is shorter than about 10 seconds, diffusion of the silicon atoms might not occur. The silicon-containing layer 314 resulting from the treatment 312 with plasma has a thickness from about 5 Angstroms to about 50 Angstroms.

It is noted that silicon compound with low molecular weight, such as silicon hydride, has higher tendency to dissociate than other silicon compounds. Thus, in some embodiments, low-molecular-weight gaseous silicon compound (e.g. silicon hydride) can be employed in the treatment 312, which in turn will be advantageous for producing more silicon atoms to diffuse into underlying layers. Examples of silicon hydride gas employed in the treatment 312 include silane ($SiH_4$), disilane ($Si_2H_6$), trisilane ($Si_3H_8$), the like, or combinations thereof. In some embodiments, other gas (e.g., carrier gas) employed in the treatment 312 includes an inert gas that does not react with the silicon compound of silicon-containing gas, so as to facilitate dissociation of the silicon compound to produce silicon atoms. Examples of the carrier gas include Ar, He, the like, or combinations thereof.

As discussed above, in some embodiments, since silicon atoms from the silicon-containing gas are diffused into the cap layer 310 rather than deposited over the cap layer 310, a thickness of a combination of the remaining cap layer 310 and the silicon-containing layer 314 is substantially the same as a thickness of the cap layer 310 before the treatment 312. Accordingly, the treatment 312 results in formation of the silicon-containing layer 314 with substantially no thickness increase of layers deposited in the gate trench GT1. Thus, forming the silicon-containing layer 314 by using the treatment 312 is also advantageous for mitigating potential problems associated with challenge of subsequently filling the gate trench GT1 with metals (e.g. step coverage of a subsequently deposited metal element-containing layer). In some other embodiments, a few silicon atoms or silicon compounds are deposited or otherwise formed over the cap layer 310 and thereby lead to slight increase of thickness of layers formed in the gate trench GT1.

Figure 7A:
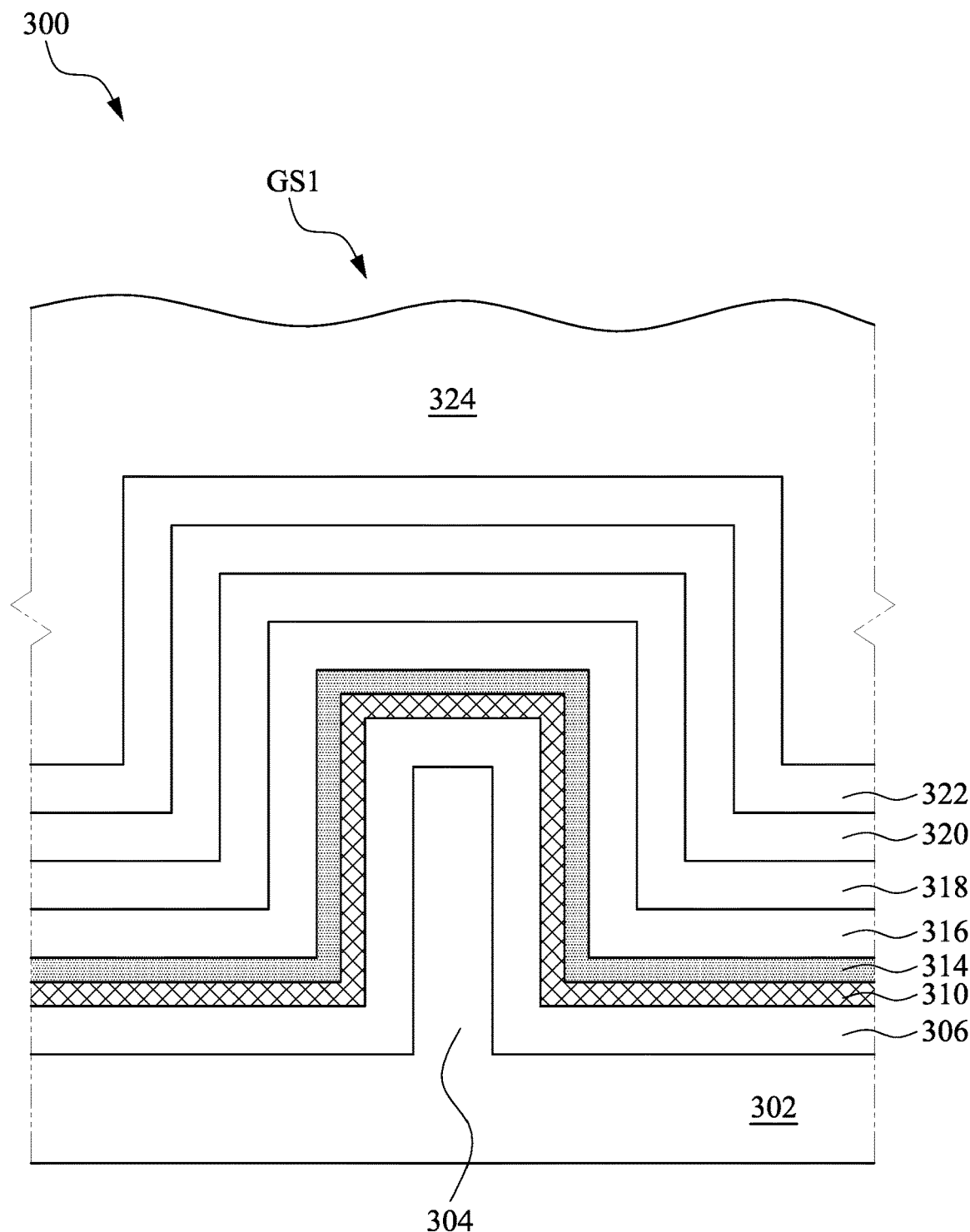
Figure 7B:
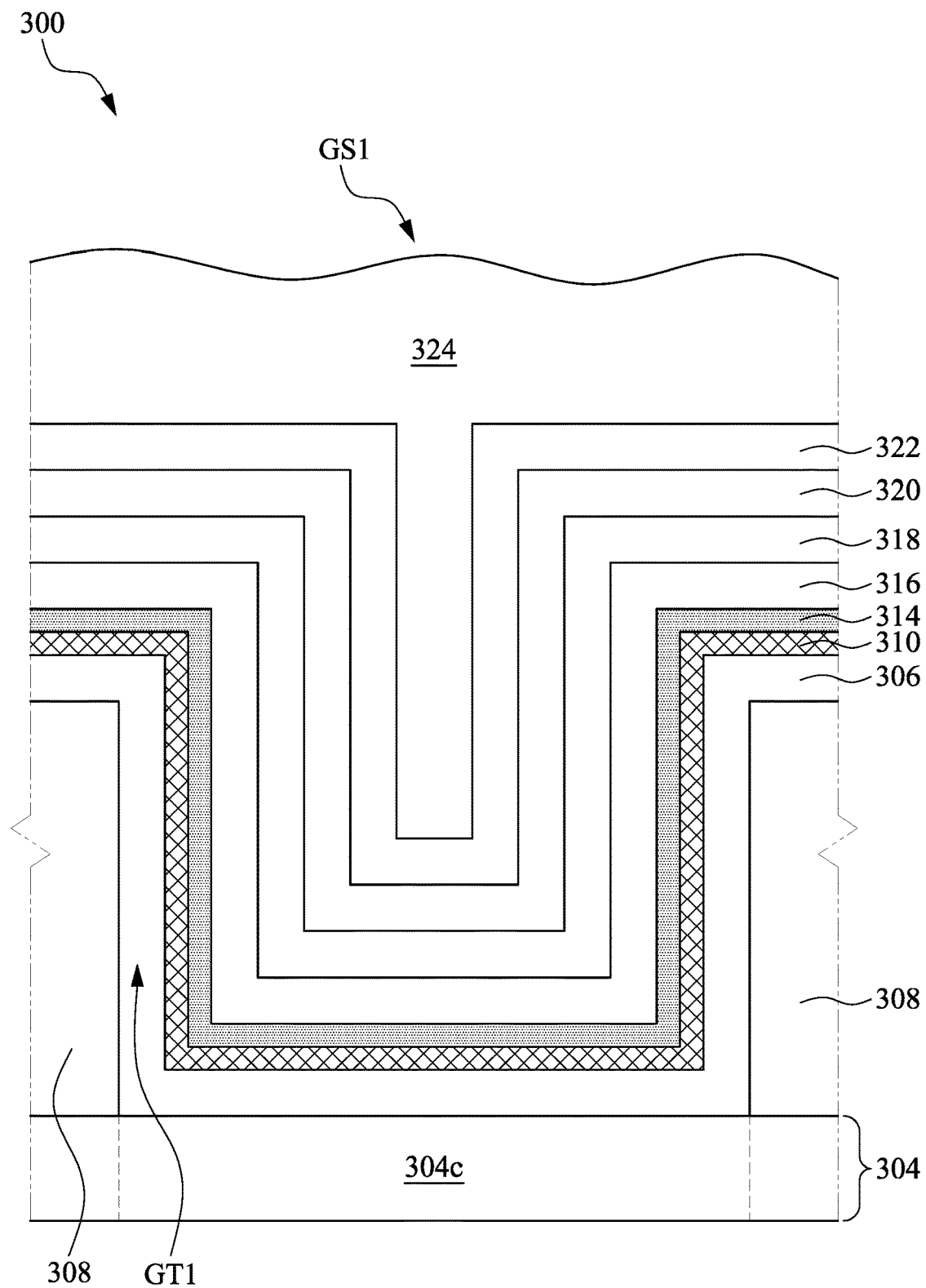

The method M1 then proceeds to block S14 where metals are formed over the treated cap layer to form a gate stack. With reference to FIGS. 7A and 7B, in some embodiments of block S14, an etch stop layer (ESL) 316, a P-type work-function layer 318, an N-type work-function layer 320, a glue layer (or wetting layer) 322, and a fill layer 324 are formed in sequence into the gate trench GT1 and over the silicon-containing layer 314. The gate dielectric layer 306, the cap layer 310, the silicon-containing layer 314, the ESL 316, the P-type work-function layer 318, the N-type work-function layer 320, the glue layer 322 and the fill layer 324 are in combination referred to as a gate stack GS1.

The ESL 316 is formed over the silicon-containing layer 314. In some embodiments, the ESL 316 and the overlying P-type work-function layer 318 have different etch resistance properties, and hence the ESL 316 can slow down or even stop an etch operation performed to pattern the P-type work-function layer 318. For example, the ESL 316 has higher etch resistance to an etchant used to pattern the P-type work-function layer 318 than that of the P-type work-function layer 318. In some embodiments, the ESL 316 includes titanium nitride (TiN), tantalum nitride (TaN), silicide or other suitable materials. In some embodiments, the cap layer 310 has a thickness from about 10 angstroms to about 30 angstroms.

The P-type work-function layer 318 is formed over the ESL 316. In some embodiments, the P-type work-function layer 318 includes a P-work function metal with a work function higher than the mid-gap work function (about 4.5 eV) that is in the middle of the valance band and the conduction band of silicon. The P-type work function metals may exemplarily include, but are not limited to, titanium nitride (TiN), tantalum nitride (TaN), tungsten nitride (WN), tungsten (W), ruthenium (Ru), palladium (Pd), platinum (Pt), cobalt (Co), nickel (Ni), conductive metal oxides, and/or other suitable materials. In some embodiments, the P-type work-function layer 318 has a thickness from about 10 angstroms to about 30 angstroms.

The N-type work-function layer 320 is formed over the P-type work-function layer 318. In some embodiments, the N-type work-function layer 320 includes an N-work function metal with a work function lower than the mid-gap work function (about 4.5 eV) that is in the middle of the valance band and the conduction band of silicon. The N-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In some embodiments, the N-type work-function layer 320 has a thickness from about 10 angstroms to about 40 angstroms.

The glue layer 322 is formed over the N-type work-function layer 320, and the fill layer 326 is formed over the glue layer 322. Material of the glue layer 322 is selected such that adhering strength between the fill layer 326 and the N-type work-function layer 320 can be improved. The glue layer 322 may be, for example, titanium nitride (TiN), tantalum nitride (TaN), silicide or other suitable materials. In some embodiments, the glue layer 322 has a thickness from about 10 angstroms to about 30 angstroms.

In some embodiments, the fill layer 324 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. In some embodiments where the fill layer 324 is tungsten, the fill layer 324 can be formed by using a fluorine-containing precursor, such as tungsten fluoride ($WF_6$) or the like. If the cap layer 310 is not treated with the silicon-containing gas or plasma, a constituent (e.g., fluorine) of the fluorine-containing precursor tends to penetrate through the cap layer 310 and thereby contaminates the cap layer 310. This fluorine contamination would lead to unwanted increase of threshold voltage. However, in some embodiments where the cap layer 310 is treated with silicon-containing gas, silicon atoms in the resulting silicon-containing layer 314 can bond with fluorine atoms coming from the fluorine-containing precursor to form silicon-fluorine bonds, which in turn will stop the penetration of fluorine to the underlying cap layer 310, which in turn will alleviate the unwanted increase of threshold voltage. As a result, control of threshold voltage can be improved because unwanted fluorine penetration can be prevented by the silicon-containing layer 314. In some embodiments, the silicon-containing layer 314 includes silicon fluoride because silicon bond with fluorine coming from the fluorine-containing precursor.

Figure 8A:
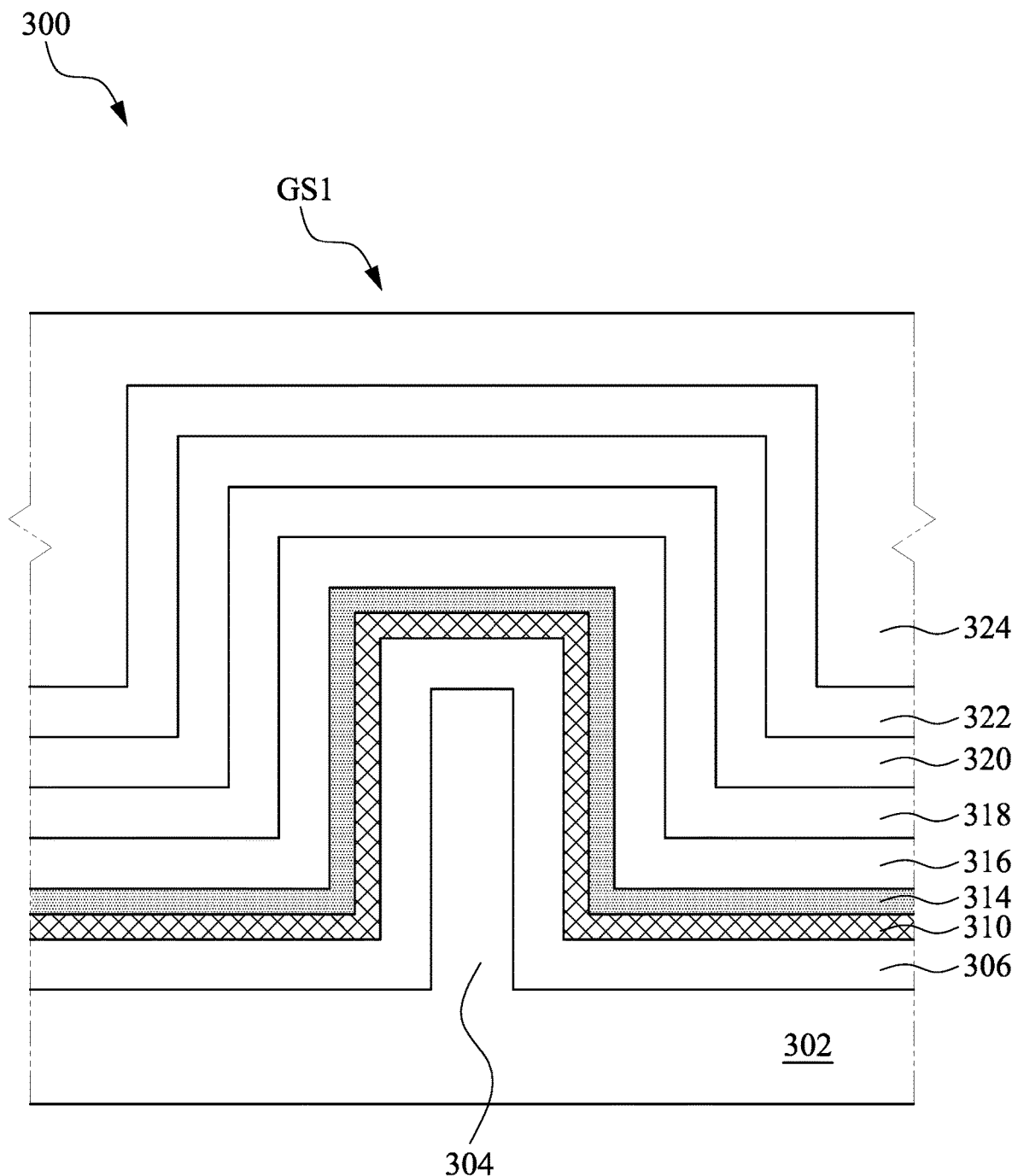
Figure 8B:
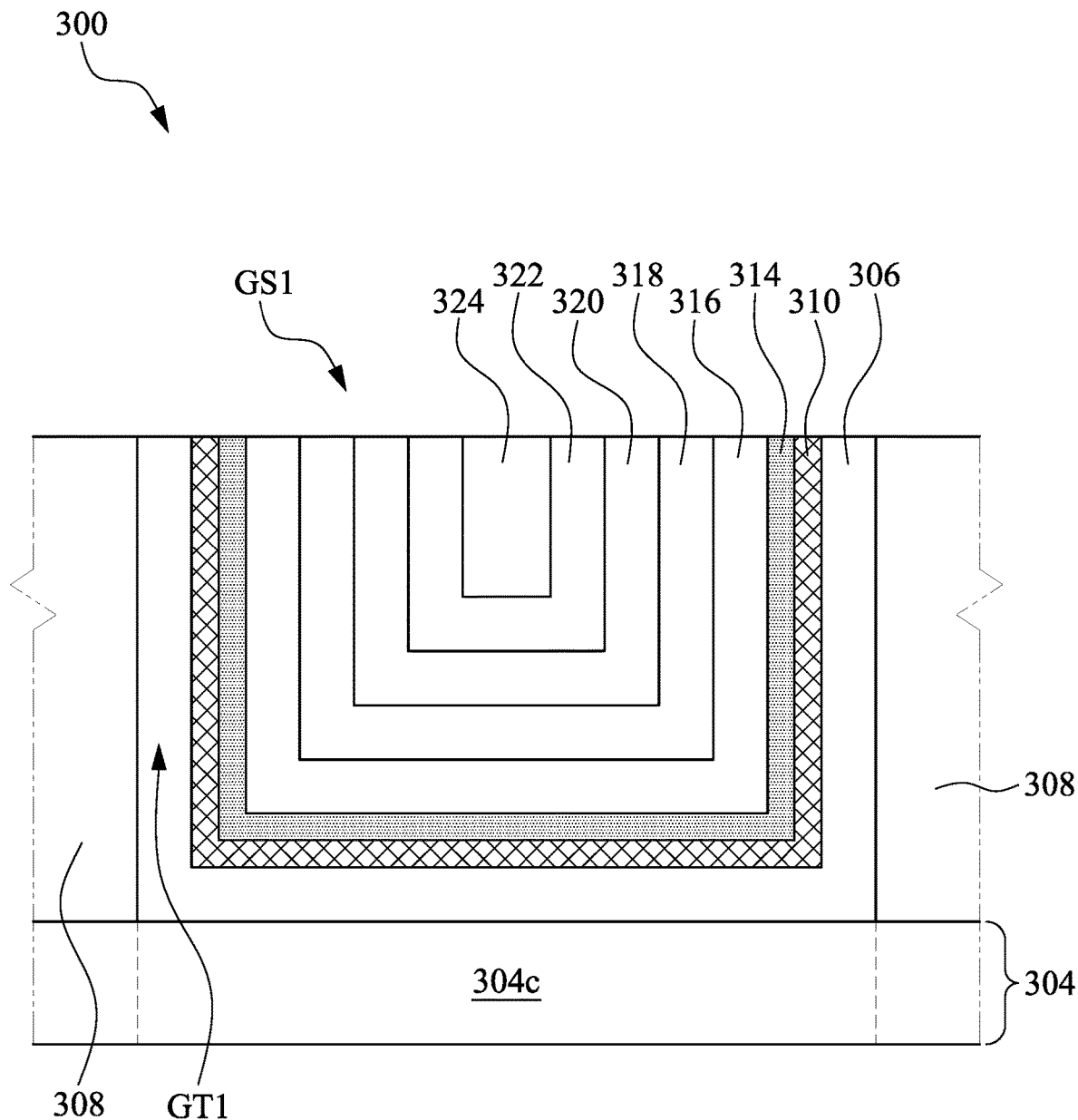

The method M1 then proceeds to block S15 where a planarization process is carried out. With reference to FIGS. 8A and 8B, in some embodiments of block S15, a planarization process, such as a chemical mechanical polish (CMP) process, is performed such that excess materials of the gate stack GS1 outside the gate trench GT1 are removed. As a result of the CMP process, a top surface of the gate stack GS1 may be substantially level with top surfaces of the gate spacers 308.

Figure 9:
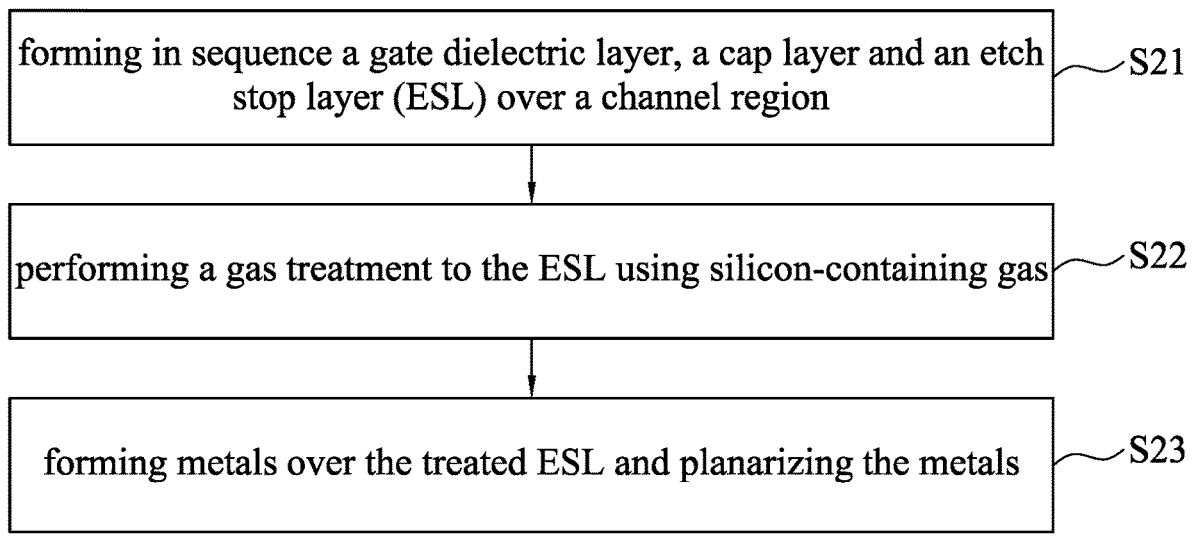
FIG. 9 is a flow chart of a method of forming a gate stack in accordance with some embodiments.

The treatment using the silicon-containing gas or plasma (e.g., silane gas or silane plasma) as discussed above can be used to treat other layers of the gate stack. For example, referring now to FIG. 9, illustrated is a method M2 that includes a treatment performed to an ESL in a gate stack in accordance with some embodiments. Similar to the method M1, the method M2 may be implemented on either a planar device or a multi-gate device, and may be applicable to either one of a gate-last process or a gate first process.

Figure 10A:
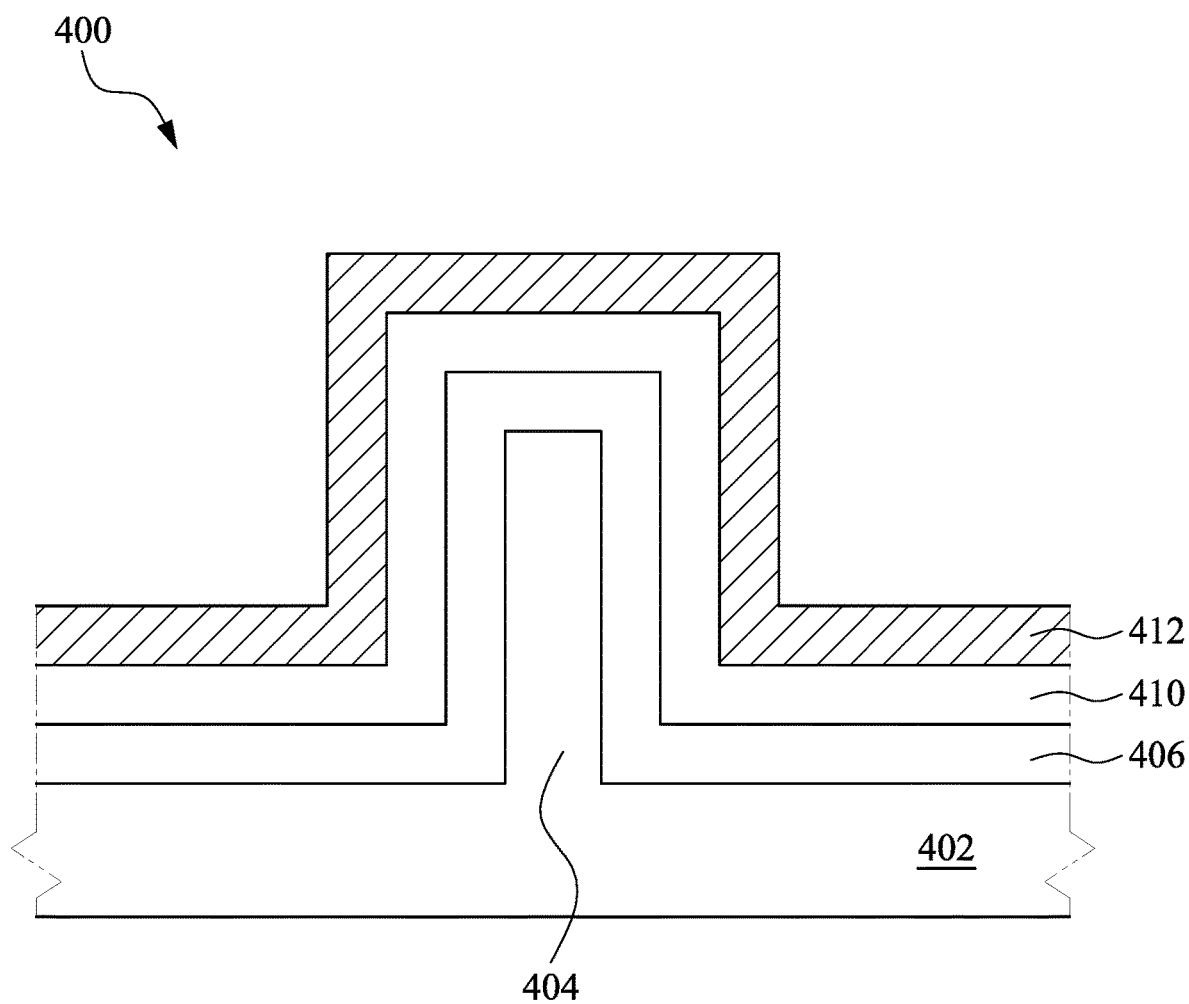
FIGS. 10A, 11A and 12A are cross-sectional views of a semiconductor device at various stages of the method of FIG. 9 along a first cut in some embodiments of the present disclosure.
Figure 10B:
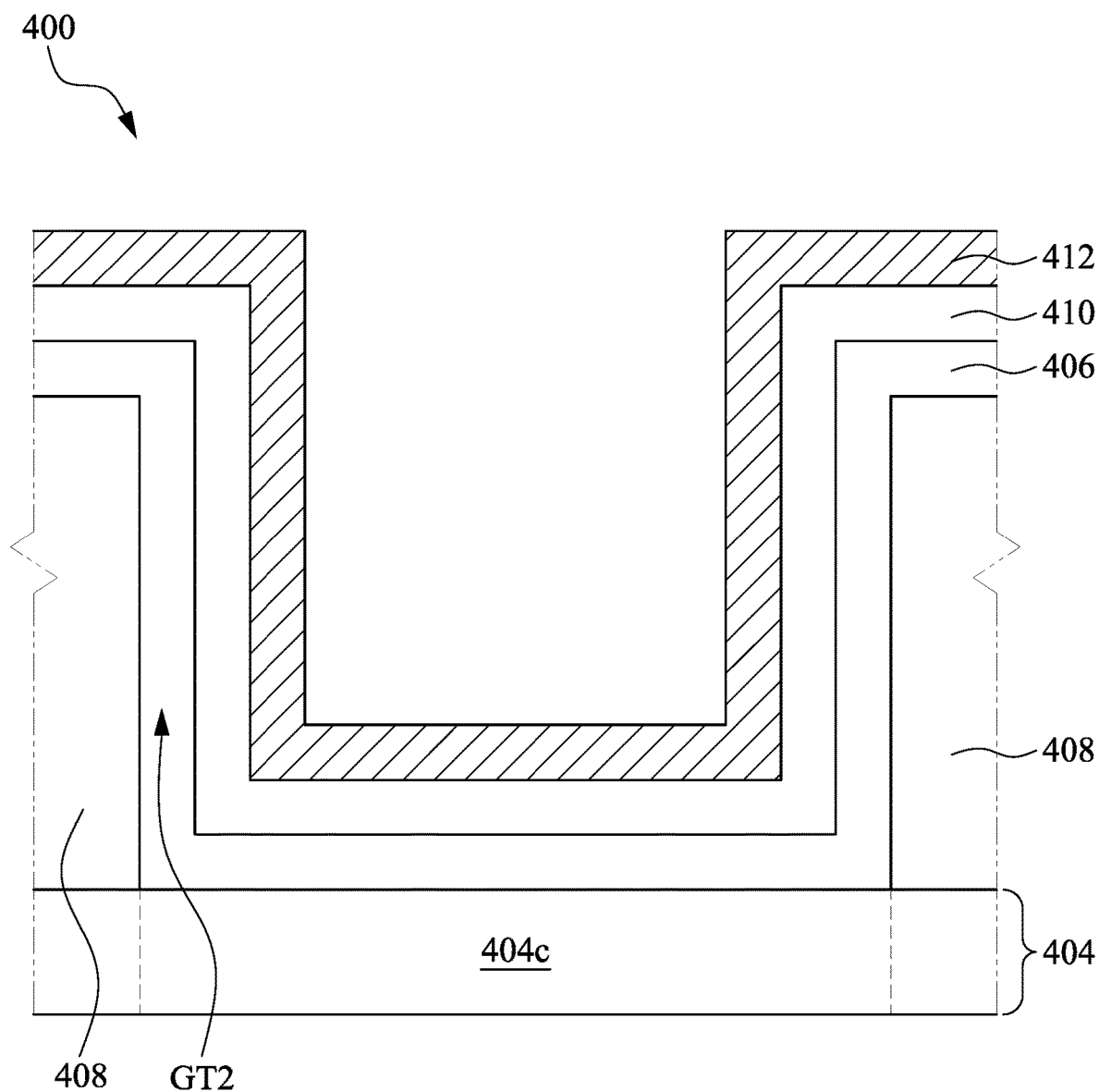
FIGS. 10B, 11B and 12B are cross-sectional views of the semiconductor device at various stages of the method of FIG. 9 along a second cut in some embodiments of the present disclosure.
Figure 11A:
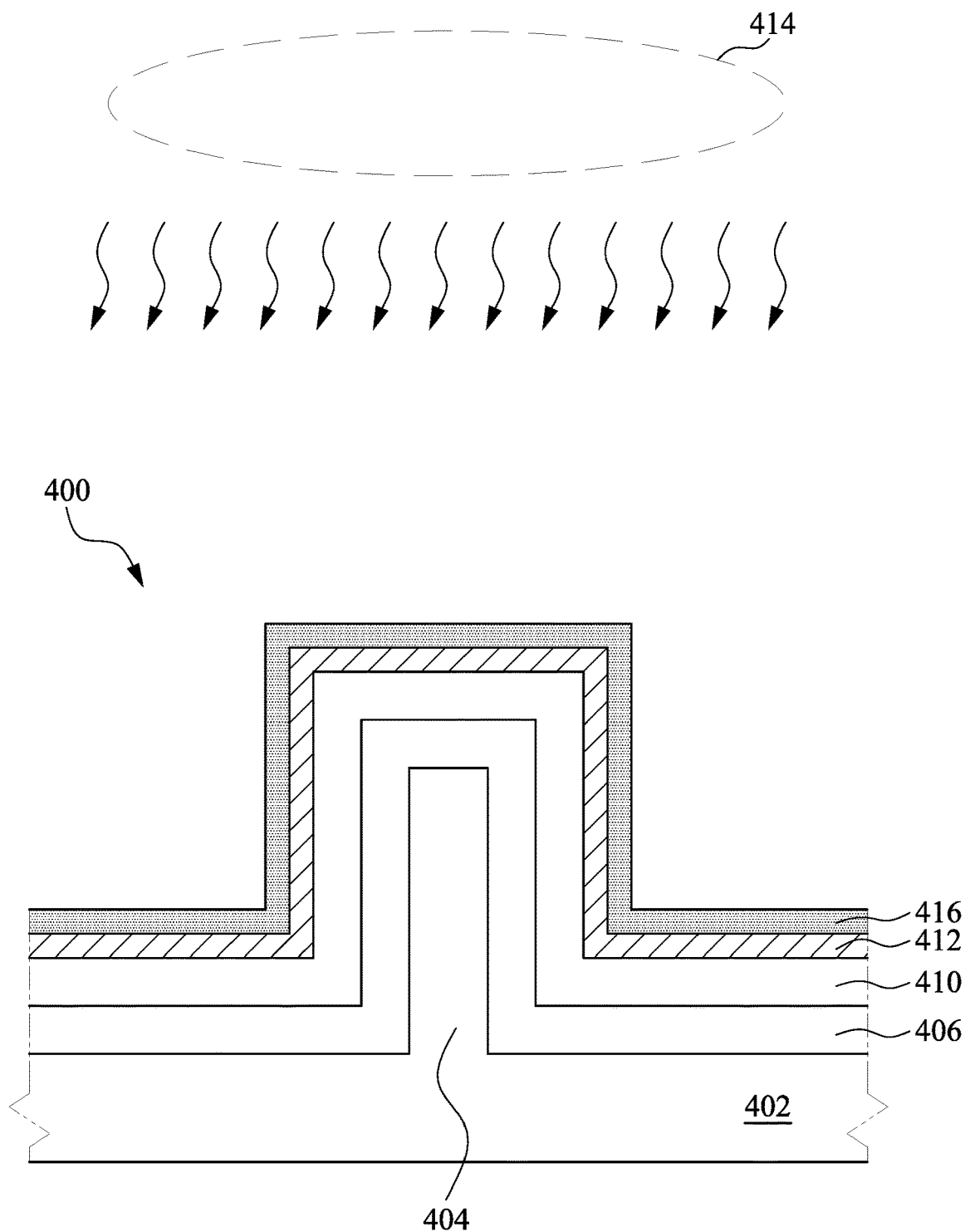
Figure 11B:
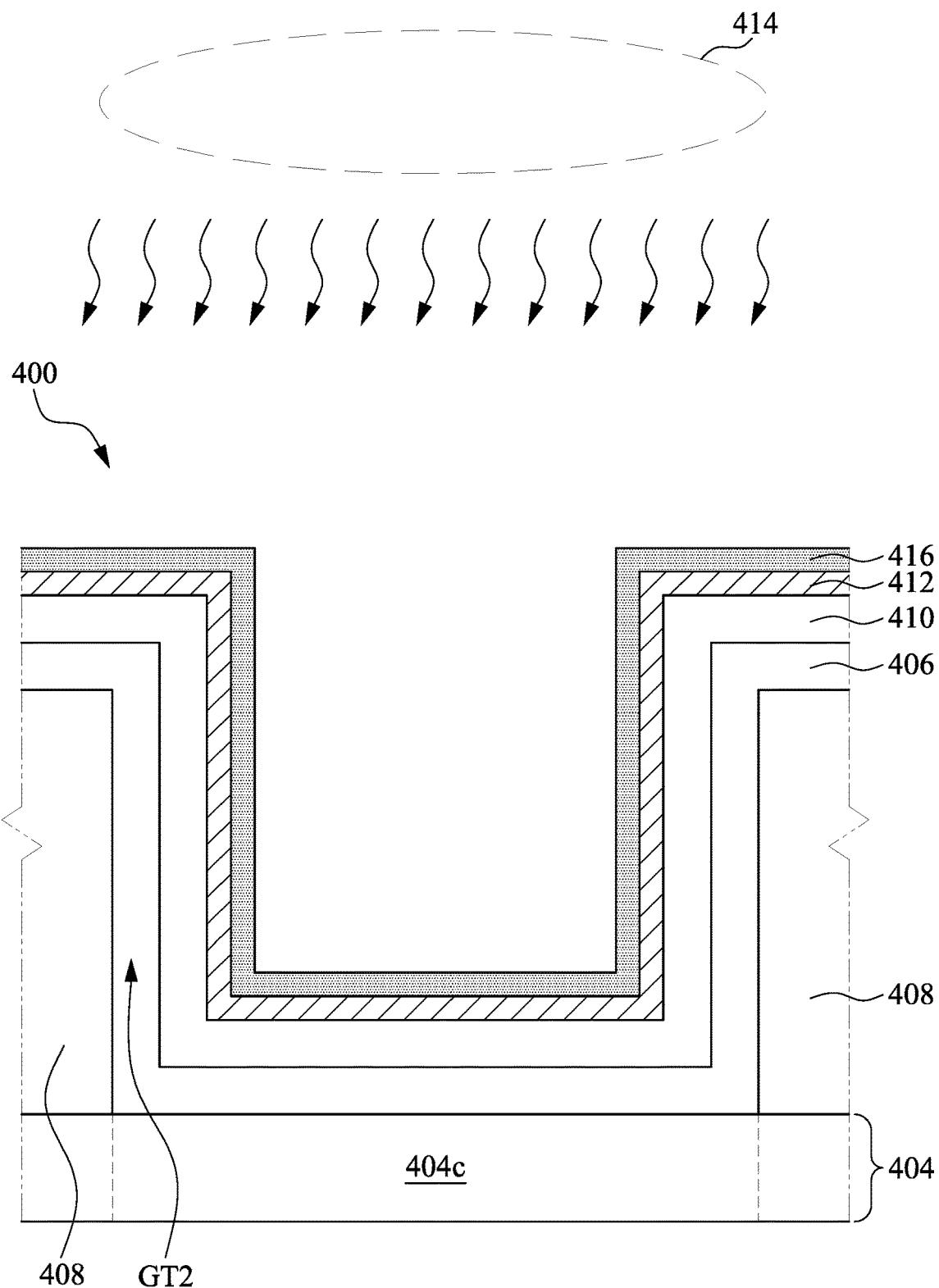
Figure 12A:
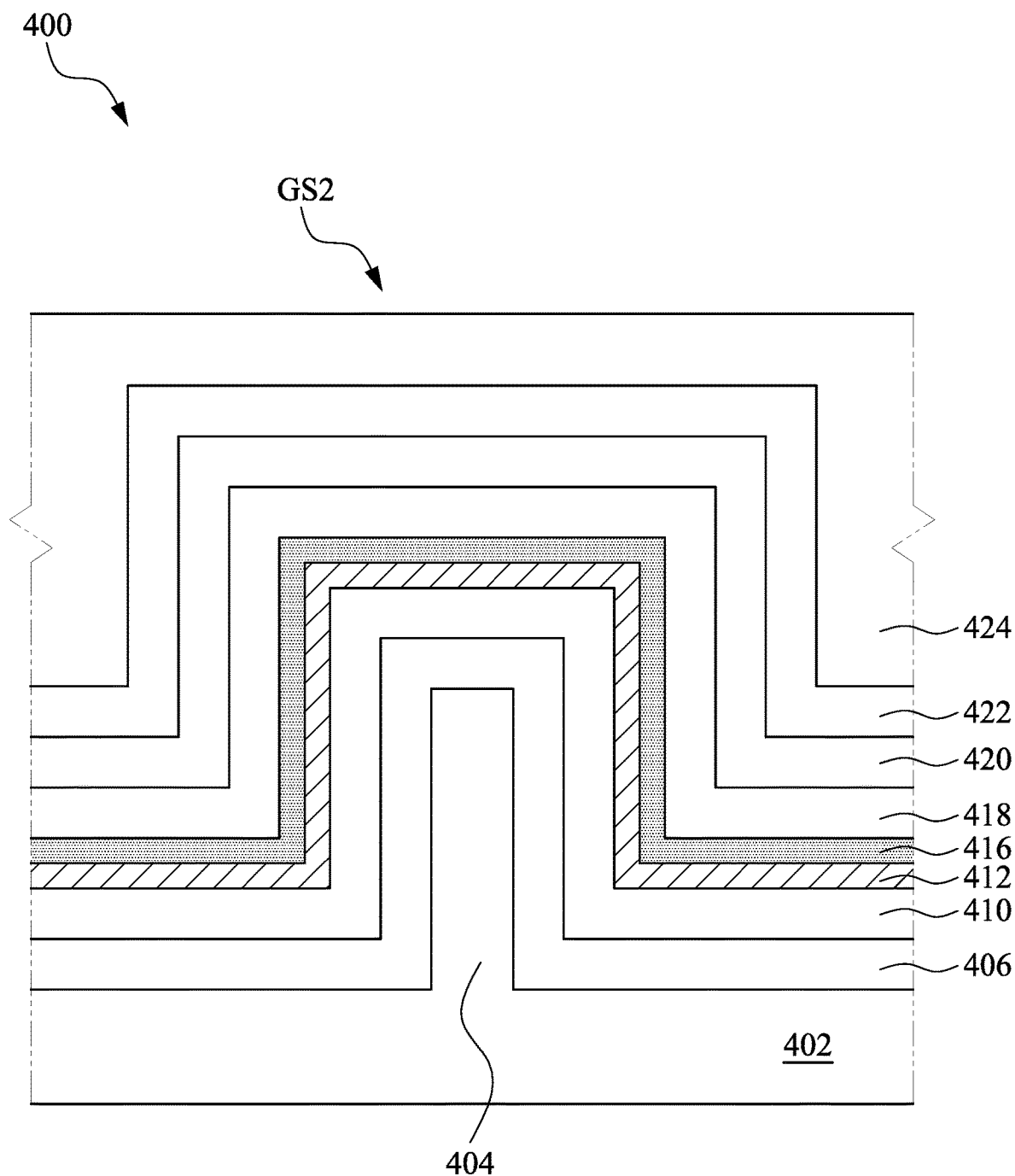
Figure 12B:
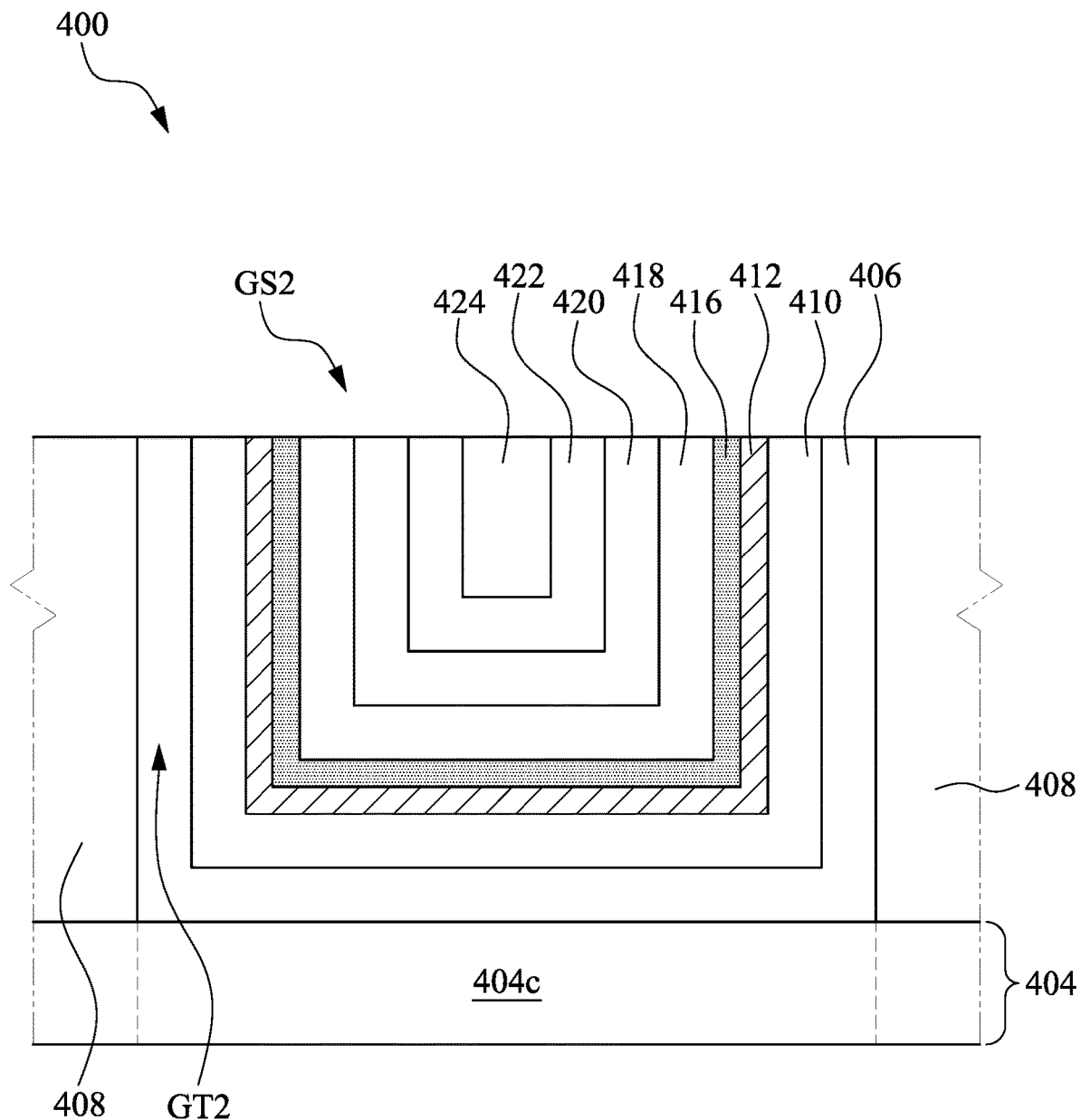

FIGS. 10A, 11A and 12A are cross-sectional views of a semiconductor device 400 at various stages of the method M2 of FIG. 9 along a first cut (e.g., A-A' cut in FIG. 2) in some embodiments of the present disclosure. FIGS. 10B, 11B and 12B are cross-sectional views of the semiconductor device 400 at various stages of the method M2 of FIG. 9 along a second cut (e.g., B-B' cut in FIG. 2) in some embodiments of the present disclosure. FIGS. 10A-13 illustrate fabrication of a gate stack of a FinFET device using a gate-last process. The illustration is merely exemplary and is not intended to be limiting beyond what is specifically recited in the claims that follow. It is understood that additional operations may be provided before, during, and after the operations shown by FIG. 9, and some of the operations described below can be replaced or eliminated for additional embodiments of the method. The order of the operations/processes may be interchangeable.

The method M2 begins at block S21 where a gate dielectric layer, a cap layer and an ESL are formed in sequence over a channel region. Referring to FIGS. 10A and 10B, in some embodiments of block S21, a gate dielectric layer 406, a cap layer 410 and an ESL 412 are formed in sequence over a semiconductor fin 404 extending from a substrate 402 and in a gate trench GT2 between gate spacers 408. A portion of the semiconductor fin 404 under the gate trench GT2 can serve as a channel region 404c of the semiconductor device 400. The gate dielectric layer 406 may be substantially the same as the gate dielectric layer 306, as described above. The cap layer 410 may be substantially the same as the cap layer 310 not treated with the treatment 312. The ESL 412 may be substantially the same as the ESL 316, as described above.

The method M2 then proceeds to block S22 where a treatment using a silicon-containing gas or plasma is performed to the ESL. With reference to FIGS. 11A and 11B, in some embodiments of block S22, a treatment 414 using silicon-containing gas is carried out such that a constituent (e.g., silicon) of the silicon-containing gas or plasma is diffused into the exposed ESL 412. In this way, some silicon atoms diffuse into the ESL 412 and in turn bond with atoms in the ESL 412 to form a silicon compound (e.g., silicon nitride). As a result, a portion of the ESL 412 is converted to a silicon-containing layer 416 with higher silicon concentration than the remaining underlying ESL 412. In some embodiments, the ESL 412 and the silicon-containing layer 416 are in combination referred to as a metal element-containing layer, wherein the silicon-containing layer 416 is a top portion of the metal element-containing layer, and the ESL 412 is a bottom portion of the metal element-containing layer. For example, the silicon concentration of the silicon-containing layer 416 (i.e., the atomic ratio of silicon to all chemical elements in the silicon-containing layer 416, expressed in terms of percentage) ranges from about 5% to about 30%, while the silicon concentration of the underlying ESL 412 is less than about 1% (i.e., the atomic ratio of silicon to all chemical elements in the ESL 412, expressed in terms of percentage). The resulting silicon-containing layer 416 has a thickness from about 5 Angstroms to about 50 Angstroms. If the thickness of the silicon-containing layer 416 is greater than about 50 Angstroms, the threshold voltage of the gate stack might be unsatisfactory. If the thickness of the silicon-containing layer 416 is less than about 5 Angstroms, the silicon-containing layer 416 might be too thin to prevent oxidation of the ESL 412. In some embodiments, the silicon-containing layer 416 may be equivalently referred to as a dopant-containing layer that comprises a dopant of the dopant-containing gas (i.e., silicon of the silicon-containing gas). In some embodiments, the treatment and deposition of the ESL 412 are in-situ performed, for example, within a processing system using an ALD cluster tool. In some embodiments, the treatment 414 is a thermal soaking process with without using plasma, as described above with respect to the treatment 312.

Performing the treatment 414 to the ESL 412 is advantageous to prevent the ESL 412 from oxidation because the ESL 412 is capped or covered by the silicon-containing layer 416. It is understood that oxidation of the ESL 412 would lead to unwanted increase of threshold voltage of the semiconductor device 400. However, since oxidation of the ESL 412 is mitigated due to protection of the silicon-containing layer 416, the unwanted increase of the threshold voltage can be addressed.

Moreover, since silicon atoms from the silicon-containing gas or plasma are diffused into the ESL 412 rather than deposited over the ESL 412, a thickness of a combination of the remaining ESL 412 and the silicon-containing layer 416 is substantially the same as a thickness of the ESL 412 before the treatment 414. The treatment 414 therefore results in formation of the silicon-containing layer 416 with substantially no thickness increase of layers deposited in the gate trench GT2, which in turn will mitigate potential problems associated with challenge of subsequently filling the gate trench GT2 with metals. In some other embodiments, a few silicon atoms are deposited over the ESL 412 and thereby lead to slight increase of thickness of layers formed in the gate trench GT2.

The method M2 then proceeds to block S23 where metals are formed over the treated ESL and planarized to form a gate stack. With reference to FIGS. 12A and 12B, in some embodiments of block S23, a P-type work-function layer 418, an N-type work-function layer 420, a glue layer (or wetting layer) 422, and a fill layer 424 are formed in sequence into the gate trench GT2 and over the silicon-containing layer 416. The gate dielectric layer 406, the cap layer 410, the ESL 412, the silicon-containing layer 416, the P-type work-function layer 418, the N-type work-function layer 420, the glue layer 422 and the fill layer 424 are in combination referred to as a gate stack GS2. The P-type work-function layer 418, the N-type work-function layer 420, the glue layer 422, the fill layer 424 are substantially the same as the P-type work-function layer 318, the N-type work-function layer 320, the glue layer 322, the fill layer 324, respectively.

In some embodiments where the fill layer 424 is tungsten, the fill layer 424 can be formed by using a fluorine-containing precursor, as described above. If the ESL 412 is not treated with the silicon-containing gas, the fluorine might penetrate through the ESL 412 and thereby contaminates the ESL 412. This fluorine contamination would lead to unwanted increase of threshold voltage. In some embodiments where the ESL 412 is treated with the silicon-containing gas or plasma, silicon atoms in the resulting silicon-containing layer 416 can bond with fluorine atoms coming from the fluorine-containing precursor to form silicon-fluorine bonds, which in turn will stop the penetration of fluorine to the underlying ESL 412, which in turn will alleviate the unwanted increase of threshold voltage.

Figure 13:
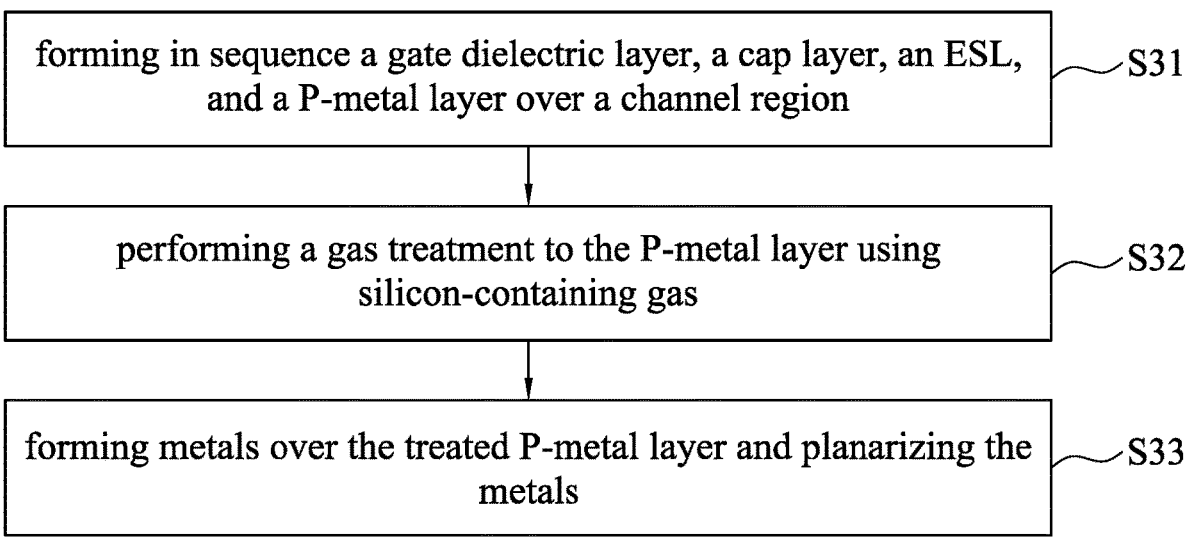
FIG. 13 is a flow chart of a method of forming a gate stack in accordance with some embodiments.

FIG. 13 illustrates another method M3 that includes a treatment performed to a P-type work-function layer in a gate stack in accordance with some embodiments. Similar to the method M1, the method M3 may be implemented on either a planar device or a multi-gate device, and may be applicable to either one of a gate-last process or a gate first process.

Figure 14A:
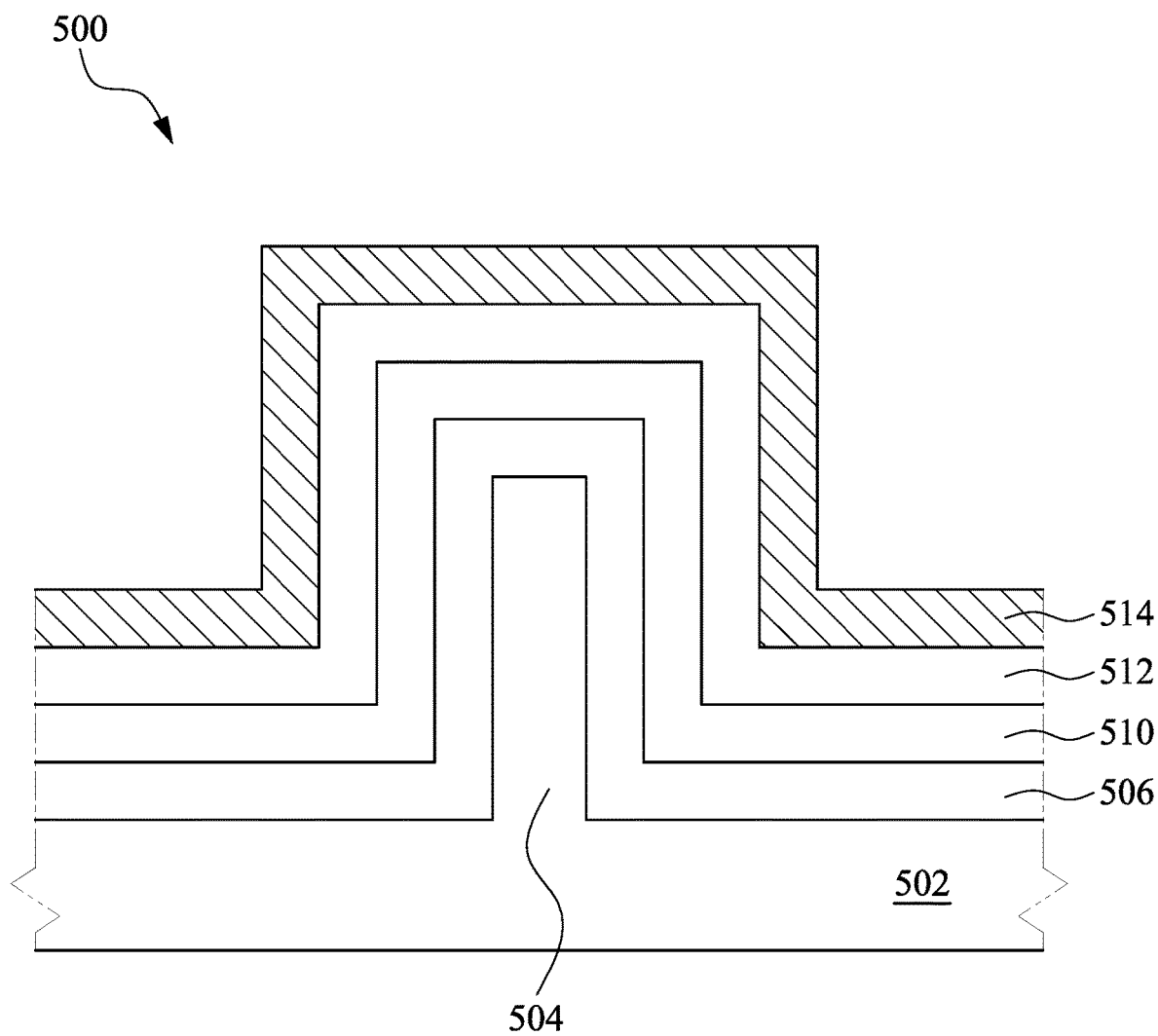
FIGS. 14A, 15A and 16A are cross-sectional views of a semiconductor device at various stages of the method of FIG. 13 along a first cut in some embodiments of the present disclosure.
Figure 14B:
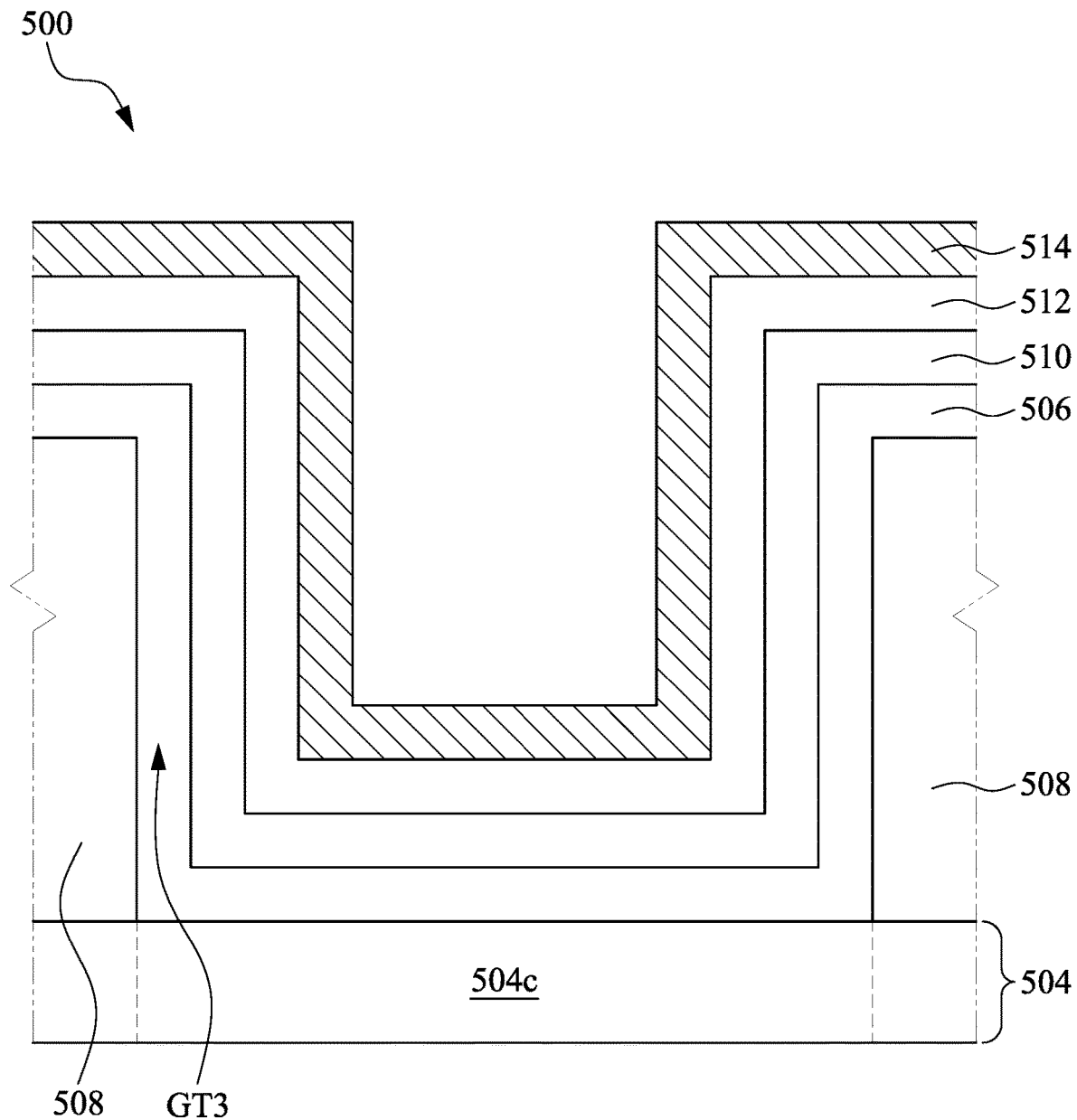
FIGS. 14B, 15B and 16B are cross-sectional views of the semiconductor device at various stages of the method of FIG. 13 along a second cut in some embodiments of the present disclosure.
Figure 15A:
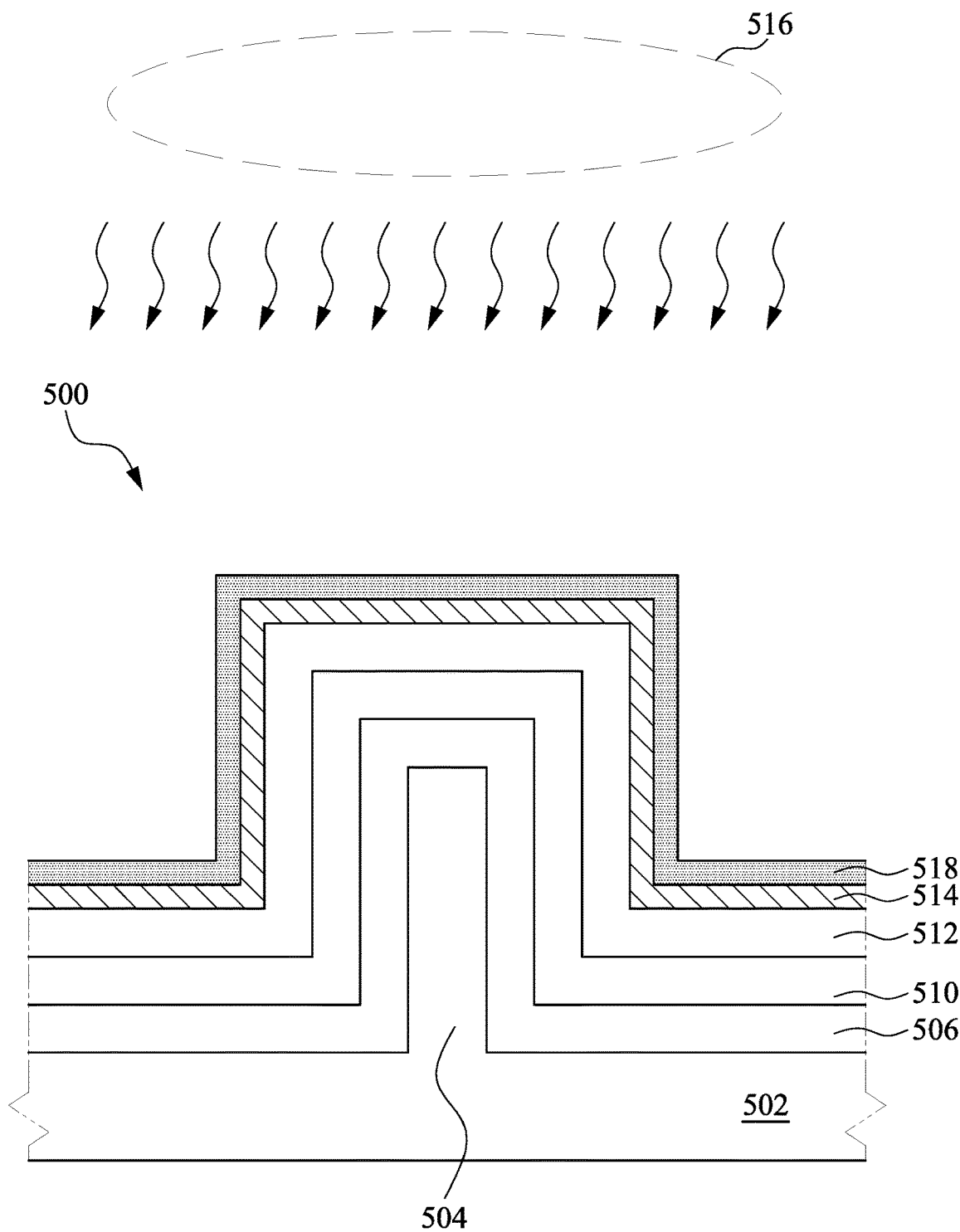
Figure 15B:
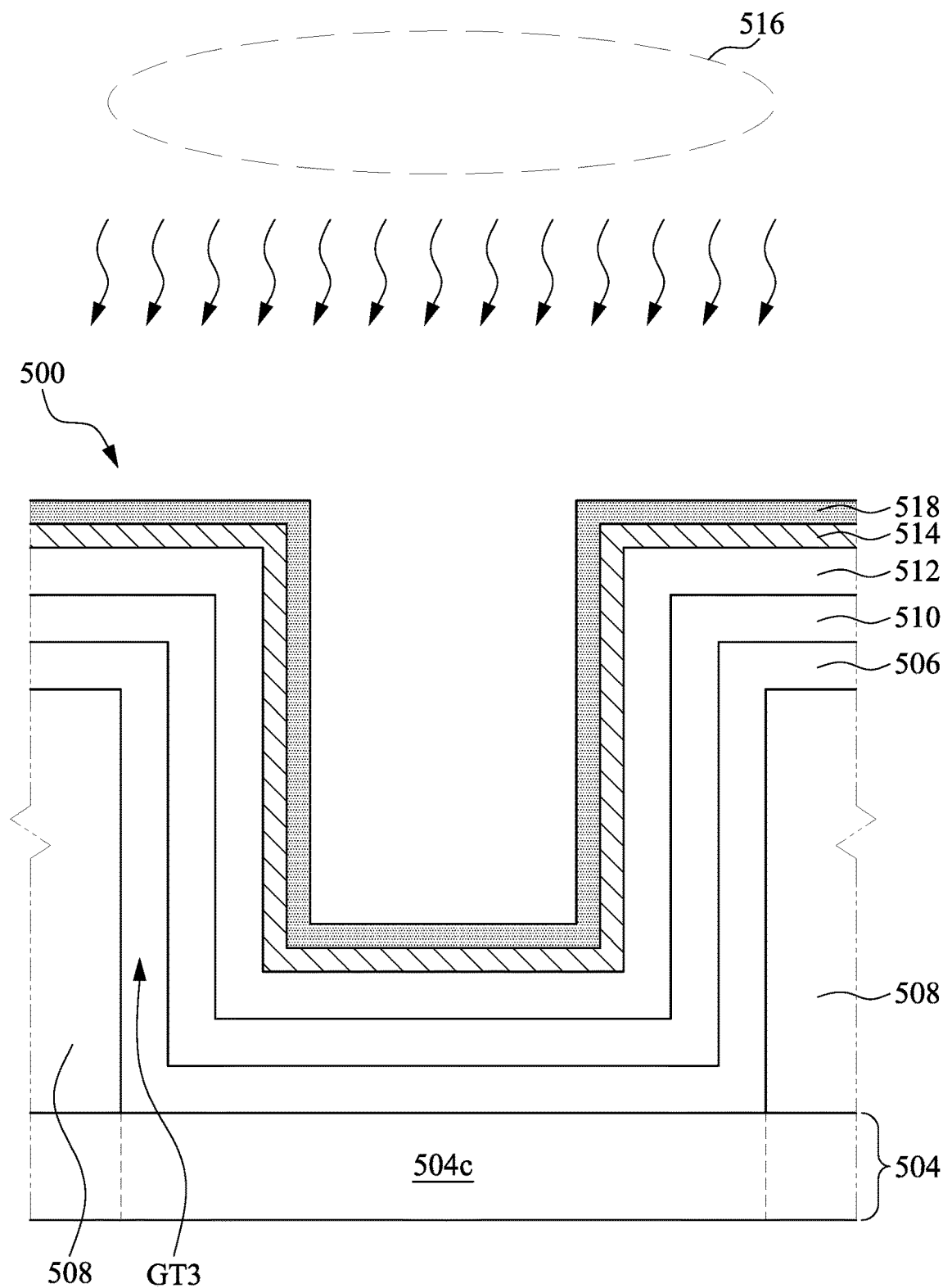
Figure 16A:
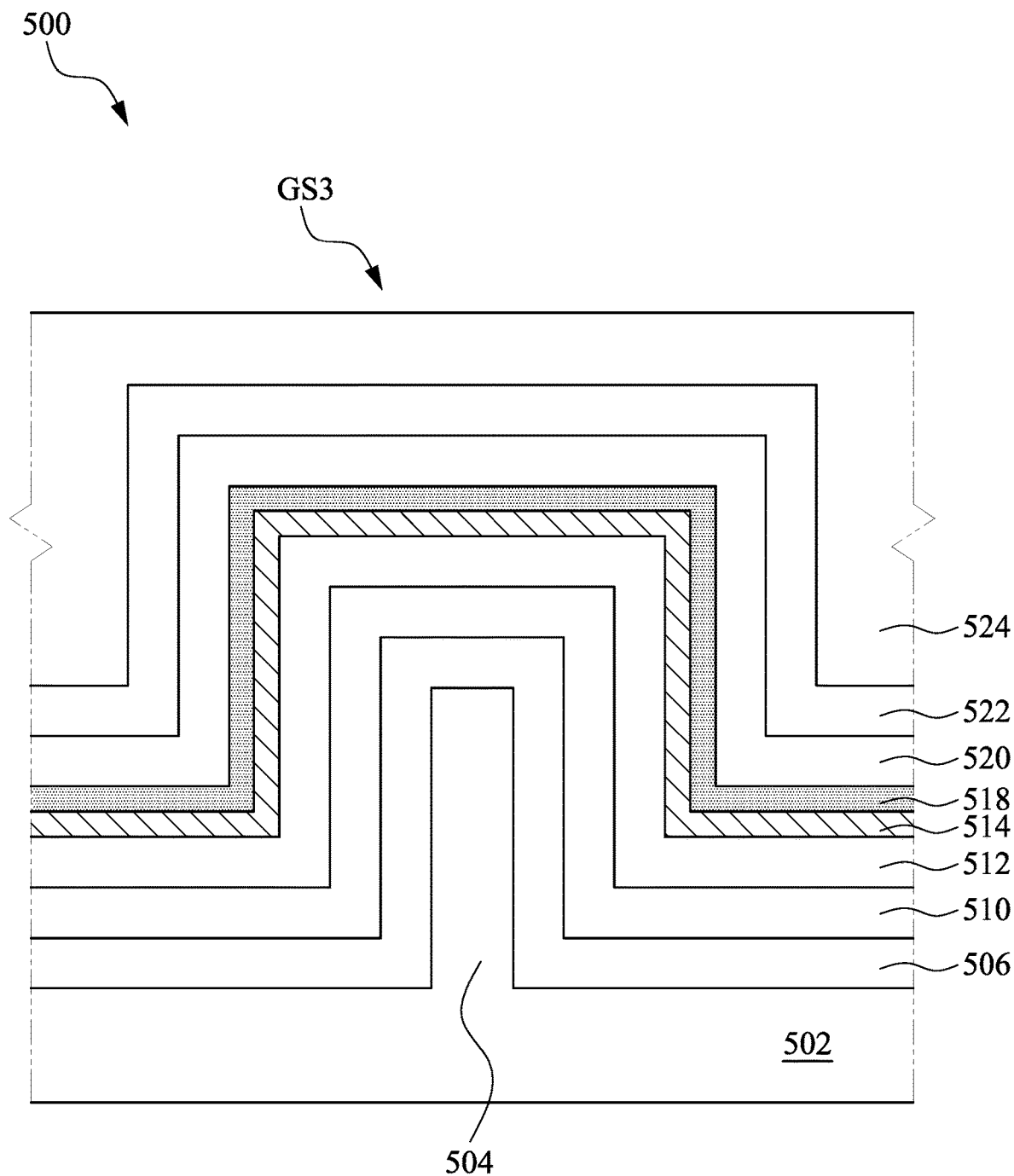
Figure 16B:
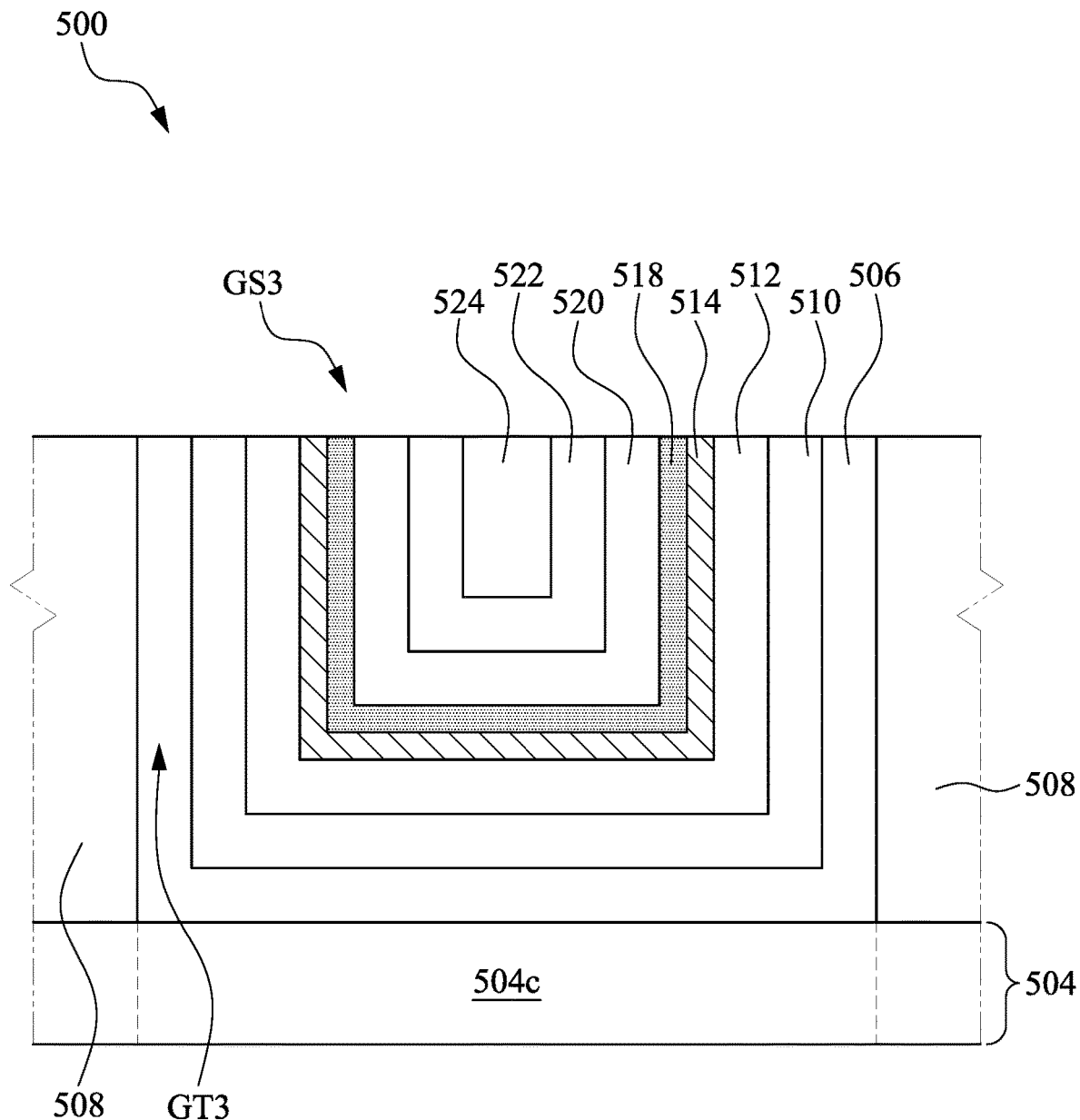

FIGS. 14A, 15A and 16A are cross-sectional views of a semiconductor device 500 at various stages of the method M3 of FIG. 13 along a first cut (e.g., A-A' cut in FIG. 2) in some embodiments of the present disclosure. FIGS. 14B, 15B and 16B are cross-sectional views of the semiconductor device 500 at various stages of the method M3 of FIG. 13 along a second cut (e.g., B-B' cut in FIG. 2) in some embodiments of the present disclosure. FIGS. 14A-16B illustrate fabrication of a gate stack of a FinFET device using a gate-last process. The illustration is merely exemplary and is not intended to be limiting beyond what is specifically recited in the claims that follow. It is understood that additional operations may be provided before, during, and after the operations shown by FIG. 13, and some of the operations described below can be replaced or eliminated for additional embodiments of the method. The order of the operations/processes may be interchangeable.

The method M3 begins at block S31 where a gate dielectric layer, a cap layer, an ESL and a P-type work-function layer are formed in sequence over a channel region. Referring to FIGS. 14A and 14B, in some embodiments of block S31, a gate dielectric layer 506, a cap layer 510, an ESL 512 and a P-type work-function layer 514 are sequentially formed over a semiconductor fin 504 extending from a substrate 502 and in a gate trench GT3 between gate spacers 508. A portion of the semiconductor fin 504 under the gate trench GT3 can serve as a channel region 504c of the semiconductor device 500. The gate dielectric layer 506 may be substantially the same as the gate dielectric layer 306, as described above. The cap layer 510 may be substantially the same as the cap layer 310 not treated with the treatment 312. The ESL 512 may be substantially the same as the ESL 316, as described above. The P-type work-function layer 514 may be substantially the same as the P-type work-function layer 318, as described above.

The method M3 then proceeds to block S32 where a treatment using a silicon-containing gas or plasma is performed to the P-type work-function layer 514. With reference to FIGS. 15A and 15B, in some embodiments of block S32, a treatment 516 using the silicon-containing gas or plasma is carried out such that a constituent (e.g., silicon) of the silicon-containing gas or plasma is diffused into the exposed P-type work-function layer 514. In this way, some silicon atoms diffuse into the P-type work-function layer 514 and in turn bond with atoms in the P-type work-function layer 514 to form a silicon compound (e.g., silicon nitride). As a result, a surface layer of the P-type work-function layer 514 is converted to a silicon-containing layer 518 that has higher silicon concentration than the remaining underlying P-type work-function layer 514. In some embodiments, the P-type work-function layer 514 and the silicon-containing layer 518 are in combination referred to as a metal element-containing layer, wherein the silicon-containing layer 518 is a top portion of the metal element-containing layer, and the P-type work-function layer 514 is a bottom portion of the metal element-containing layer. In some embodiments, the silicon concentration of the silicon-containing layer 518 (i.e., the atomic ratio of silicon to all chemical elements in the silicon-containing layer 518, expressed in terms of percentage) ranges from about 5% to about 30%, while the silicon concentration of the P-type work-function layer 514 (i.e., the atomic ratio of silicon to all chemical elements in the P-type work-function layer 514, expressed in terms of percentage) is less than about 1%. The resulting silicon-containing layer 518 has a thickness from about 5 Angstroms to about 50 Angstroms. If the thickness of the silicon-containing layer 518 is greater than about 50 Angstroms, the threshold voltage of the gate stack might be unsatisfactory. If the thickness of the silicon-containing layer 518 is less than about 5 Angstroms, the silicon-containing layer 514 might be too thin to prevent oxidation of the P-type work-function layer 514. In some embodiments, the silicon-containing layer 518 may be equivalently referred to as a dopant-containing layer that comprises a dopant of the dopant-containing gas (i.e., silicon of the silicon-containing gas). In some embodiments, the treatment and deposition of the P-type work-function layer 514 are in-situ performed. In some embodiments, the treatment 516 is a thermal soaking process with or without using plasma, as described above with respect to the treatment 312.

Performing the treatment 516 to the P-type work-function layer 514 is advantageous to prevent the P-type work-function layer 514 from oxidation because the P-type work-function layer 514 is capped or covered by the silicon-containing layer 518. It is understood that oxidation of the P-type work-function layer 514 would lead to unwanted increase of threshold voltage of the semiconductor device 500. However, since oxidation of the P-type work-function layer 514 is mitigated, the unwanted increase of the threshold voltage can be addressed.

Moreover, since silicon atoms from the silicon-containing gas are diffused into the P-type work-function layer 514 rather than deposited over the P-type work-function layer 514, a thickness of a combination of the remaining P-type work-function layer 514 and the silicon-containing layer 518 is substantially the same as a thickness of the P-type work-function layer 514 before the treatment 516. The treatment 516 therefore results in formation of the silicon-containing layer 518 with substantially no thickness increase of layers deposited in the gate trench GT3, which in turn will mitigate potential problems associated with challenge of subsequently filling the gate trench GT3 with other metals. In some other embodiments, a few silicon atoms are deposited over the P-type work-function layer 514 and thereby lead to slight increase of thickness of layers formed in the gate trench GT3.

The method M3 then proceeds to block S33 where metals are formed over the treated P-type work-function layer and planarized to form a gate stack. With reference to FIGS. 16A and 16B, in some embodiments of block S33, an N-type work-function layer 520, a glue layer (or wetting layer) 522, and a fill layer 524 are formed in sequence into the gate trench GT3 and over the silicon-containing layer 518. The gate dielectric layer 506, the cap layer 510, the ESL 412, the P-type work-function layer 514, the silicon-containing layer 518, the N-type work-function layer 520, the glue layer 522 and the fill layer 524 are in combination referred to as a gate stack GS3. The N-type work-function layer 520, the glue layer 522, the fill layer 524 are substantially the same as the N-type work-function layer 320, the glue layer 322, the fill layer 324, respectively.

In some embodiments where the fill layer 524 is tungsten, the fill layer 524 can be formed by using a fluorine-containing precursor, as described above. If the P-type work-function layer 514 is not treated with the silicon-containing gas or plasma, the fluorine might penetrate through the P-type work-function layer 514 and thereby contaminates the P-type work-function layer 514. This fluorine contamination would lead to unwanted increase of threshold voltage. However, in some embodiments where the P-type work-function layer 514 is treated with silicon-containing gas or plasma, silicon atoms in the resulting silicon-containing layer 518 can bond with fluorine atoms coming from the fluorine-containing precursor to form silicon-fluorine bonds, which in turn will stop the penetration of fluorine to the underlying P-type work-function layer 514, which in turn will alleviate the unwanted increase of threshold voltage.

Figure 17:
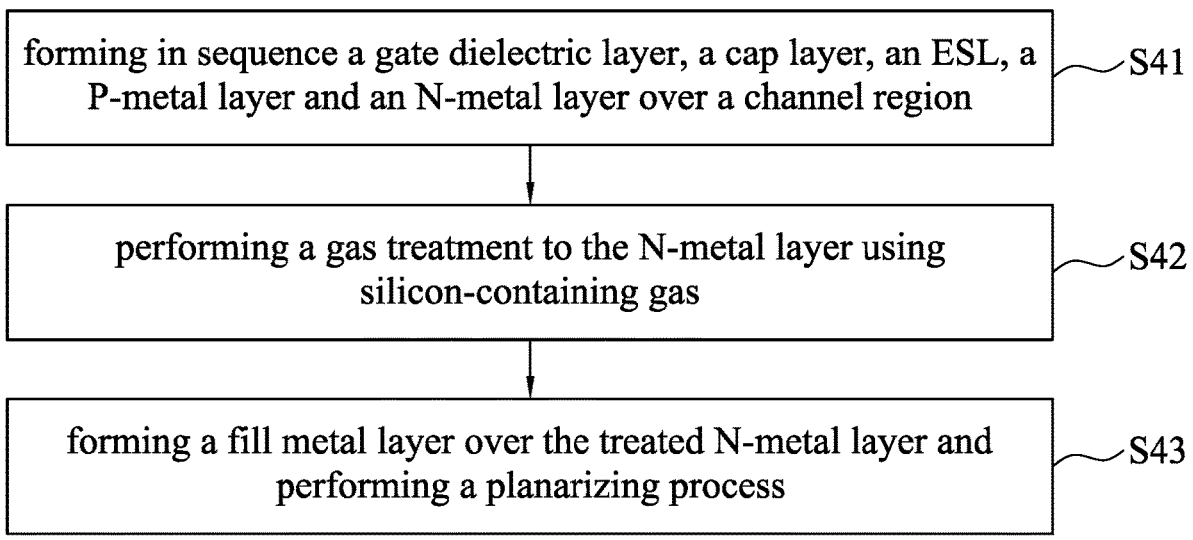
FIG. 17 is a flow chart of a method of forming a gate stack in accordance with some embodiments.

FIG. 17 illustrates another method M4 that includes a treatment performed to an N-type work-function layer in a gate stack in accordance with some embodiments. Similar to the method M1, the method M4 may be implemented on either a planar device or a multi-gate device, and may be applicable to either one of a gate-last process or a gate first process.

Figure 18A:
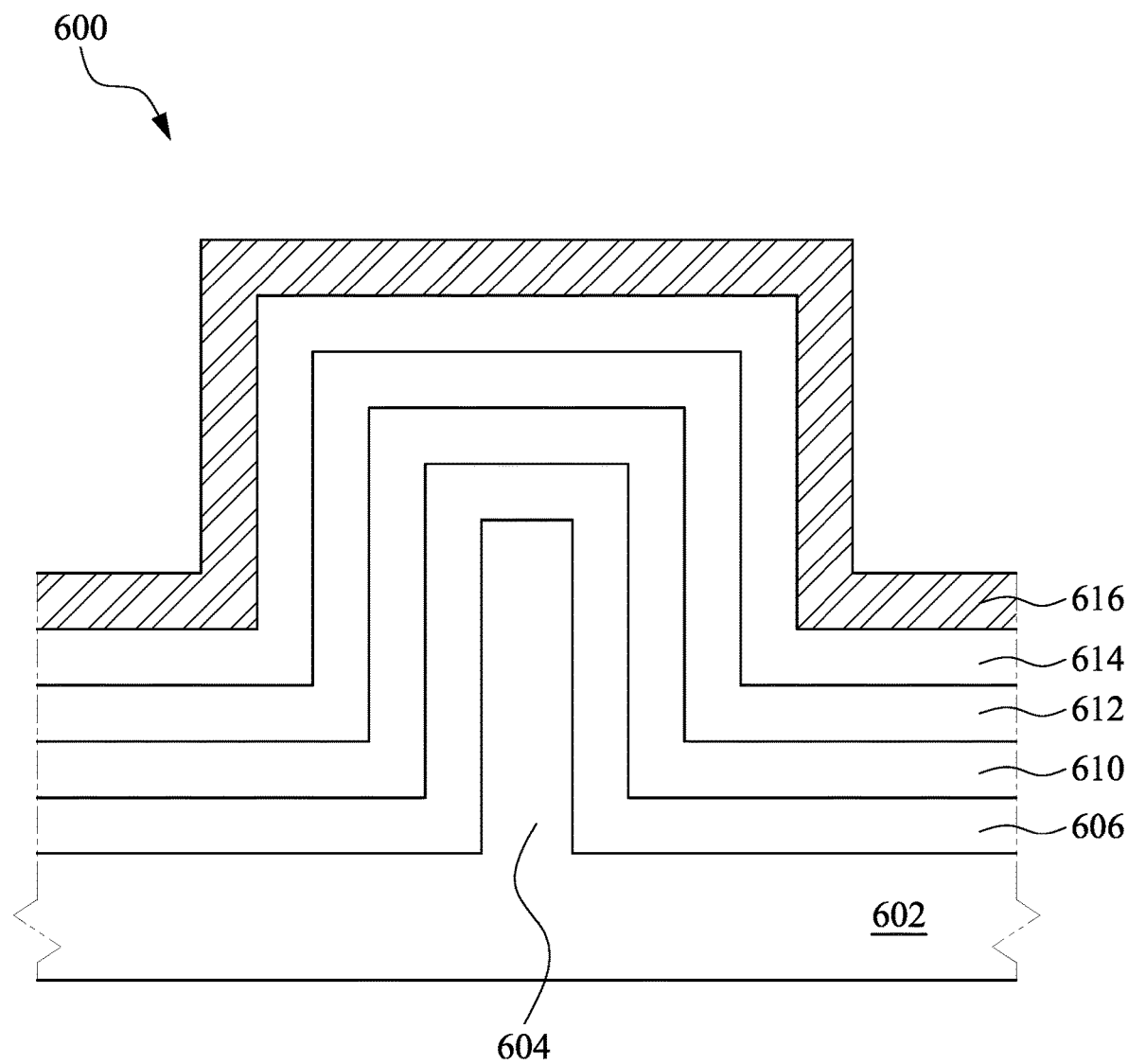
FIGS. 18A, 19A and 20A are cross-sectional views of a semiconductor device at various stages of the method of FIG. 17 along a first cut in some embodiments of the present disclosure.
Figure 18B:
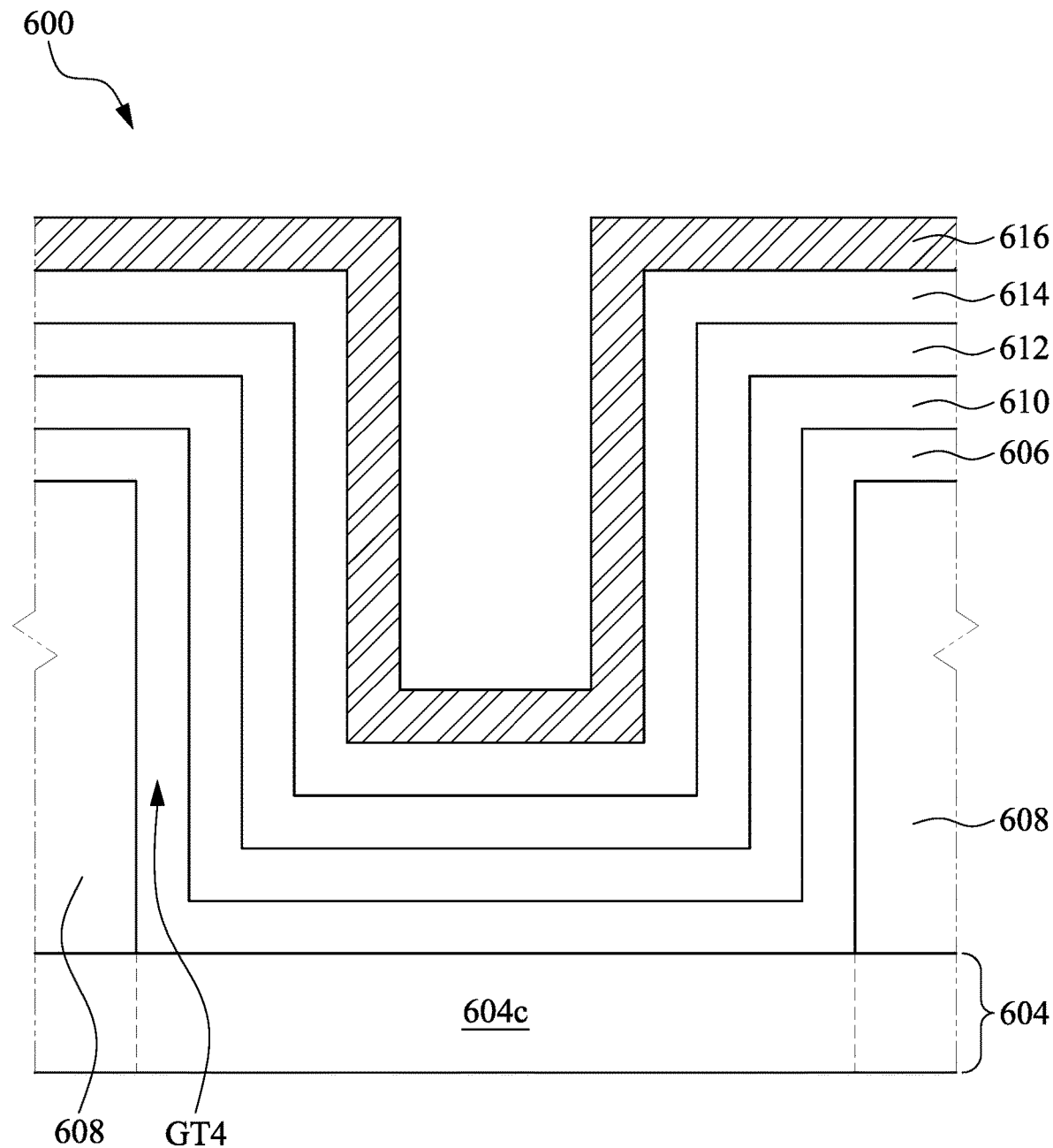
FIGS. 18B, 19B and 20B are cross-sectional views of the semiconductor device at various stages of the method of FIG. 17 along a second cut in some embodiments of the present disclosure.
Figure 19A:
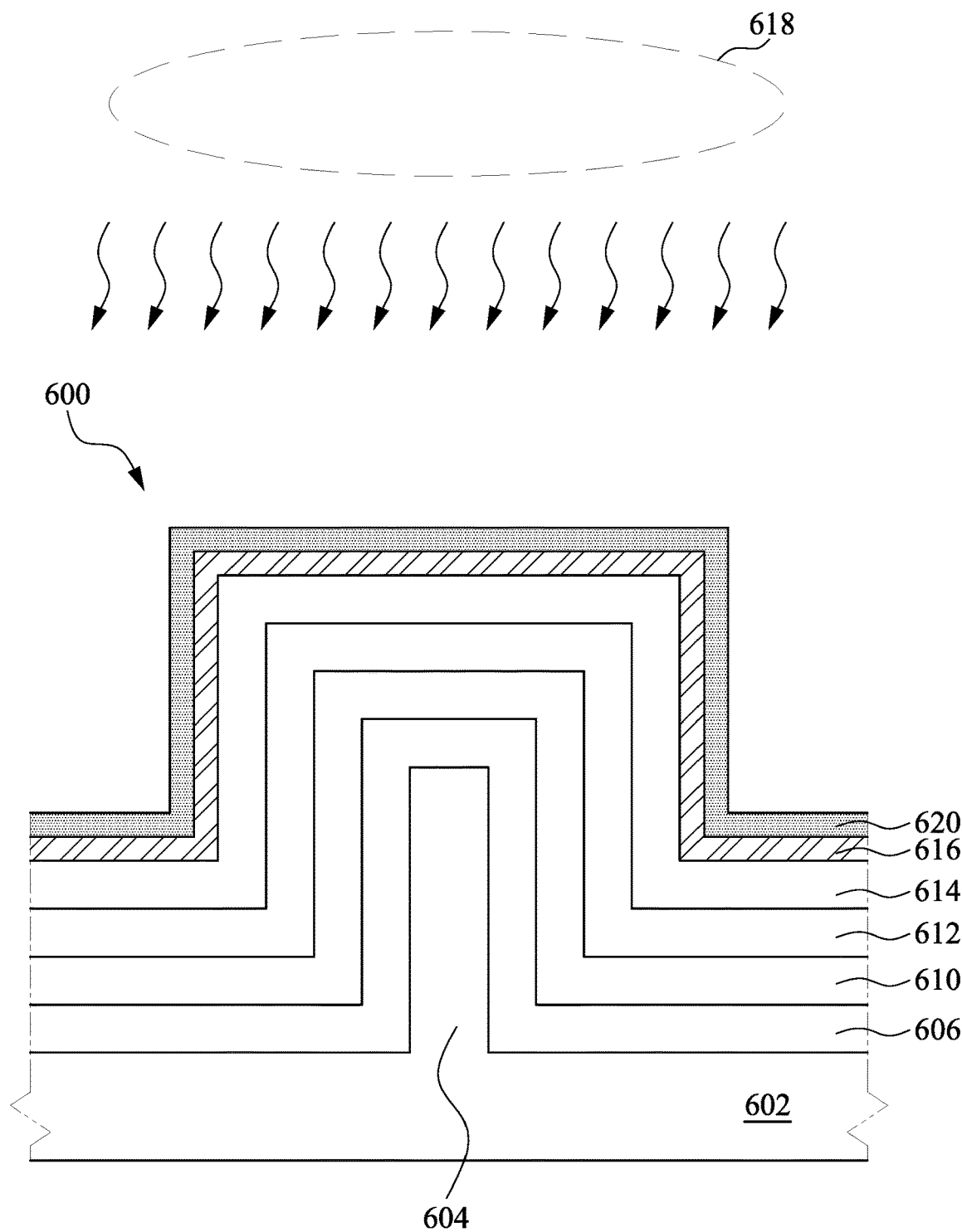
Figure 19B:
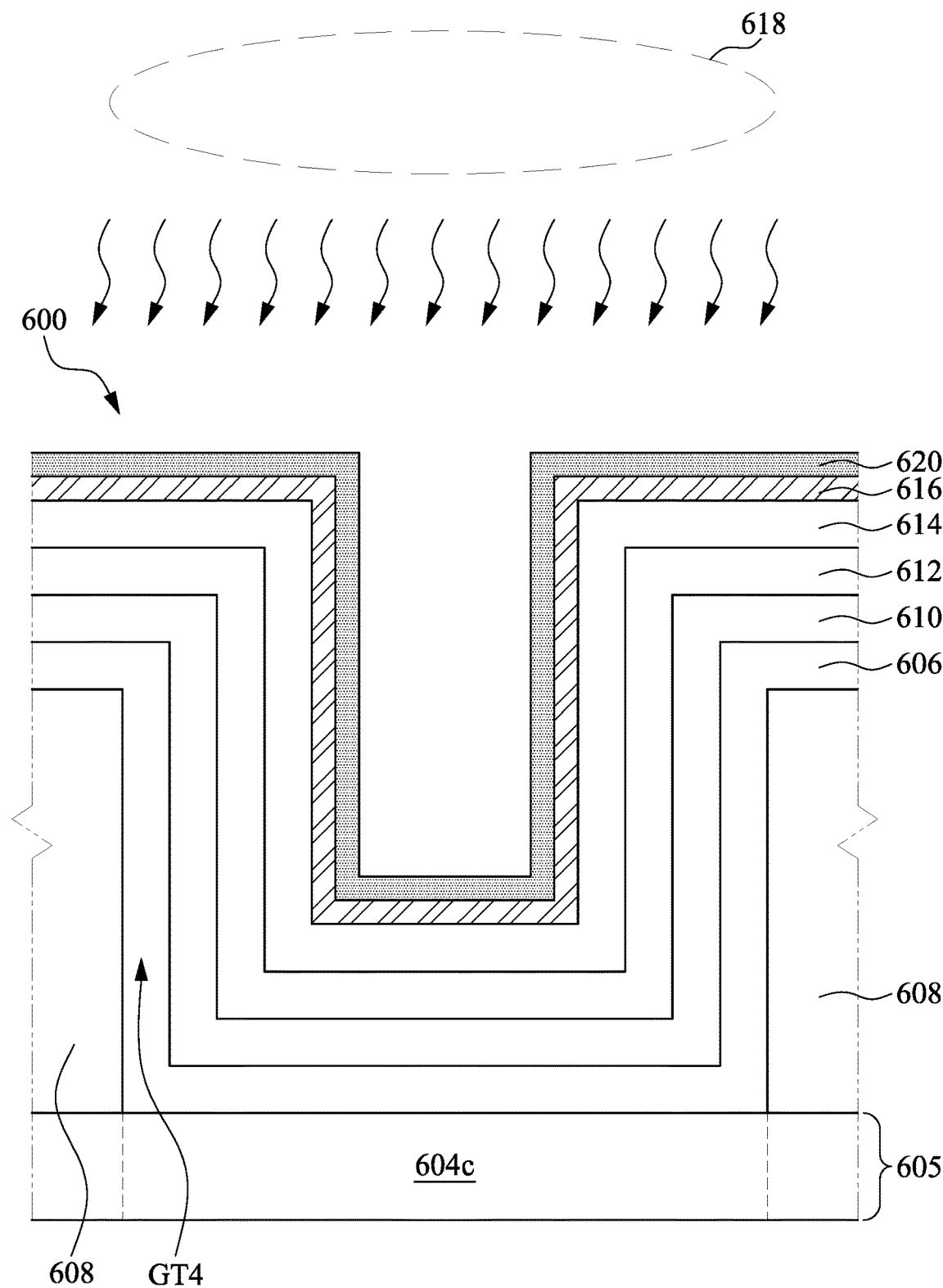
Figure 20A:
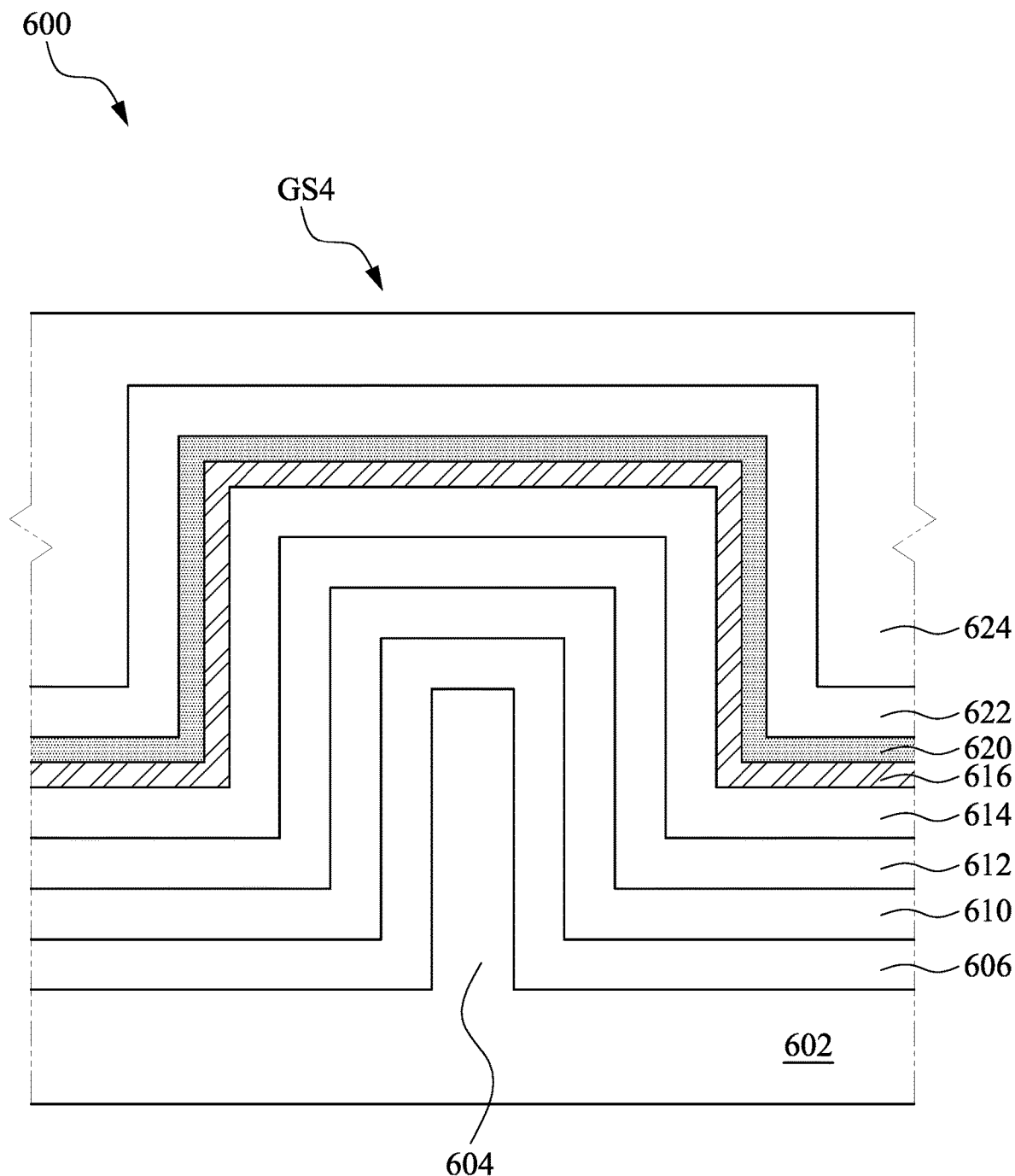
Figure 20B:
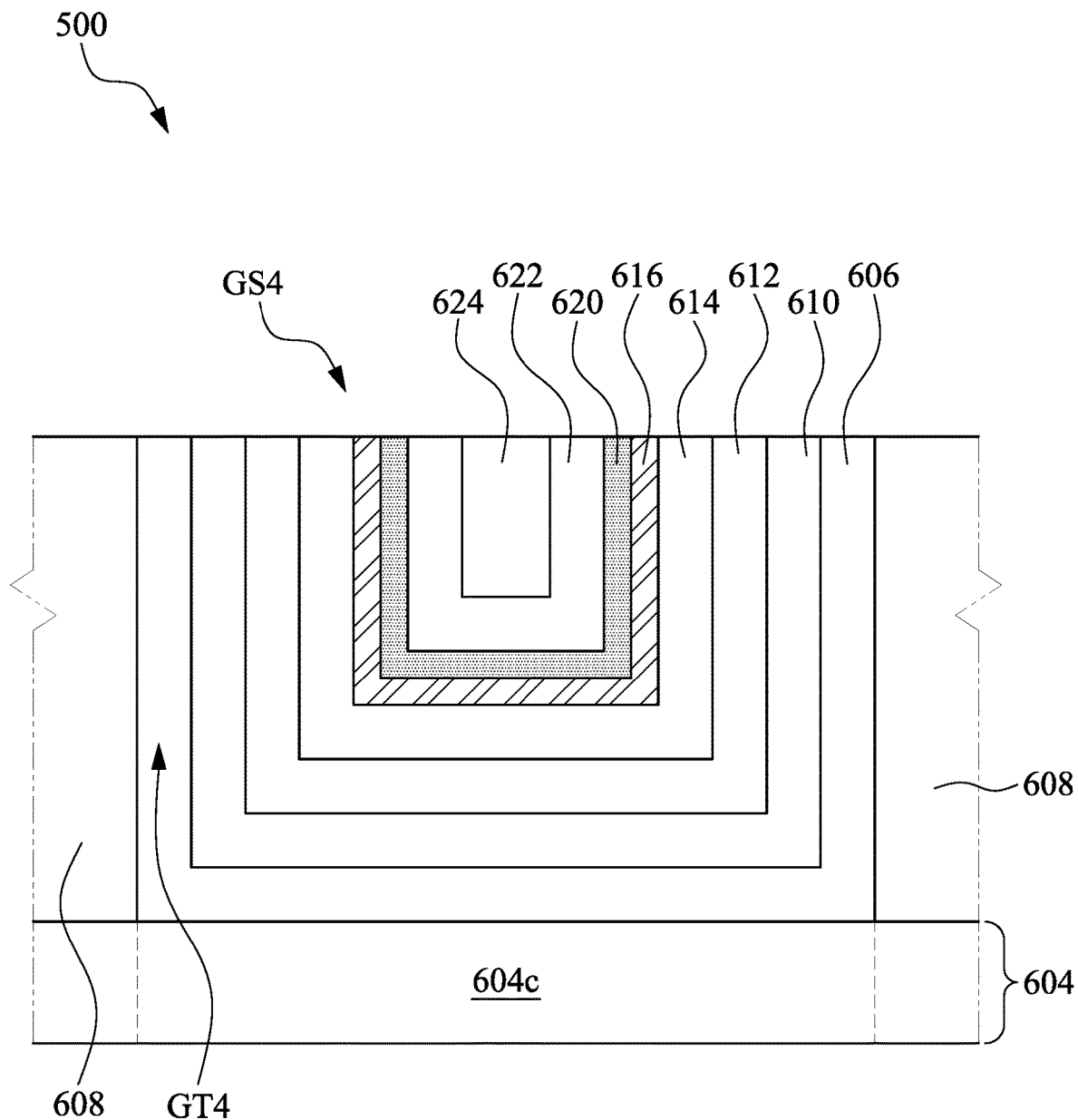

FIGS. 18A, 19A and 20A are cross-sectional views of a semiconductor device 600 at various stages of the method M4 of FIG. 17 along a first cut (e.g., A-A' cut in FIG. 2) in some embodiments of the present disclosure. FIGS. 18B, 19B and 20B are cross-sectional views of the semiconductor device 600 at various stages of the method M4 of FIG. 17 along a second cut (e.g., B-B' cut in FIG. 2) in some embodiments of the present disclosure. FIGS. 18A-20B illustrate fabrication of a gate stack of a FinFET device using a gate-last process. The illustration is merely exemplary and is not intended to be limiting beyond what is specifically recited in the claims that follow. It is understood that additional operations may be provided before, during, and after the operations shown by FIG. 17, and some of the operations described below can be replaced or eliminated for additional embodiments of the method. The order of the operations/processes may be interchangeable.

The method M4 begins at block S41 where a gate dielectric layer, a cap layer, an ESL, a P-type work-function layer and an N-type work-function layer are formed in sequence over a channel region. Referring to FIGS. 18A and 18B, in some embodiments of block S41, a gate dielectric layer 606 and a cap layer 610, an ESL 612, a P-type work-function layer 614 and an N-type work-function layer 616 are sequentially formed over a semiconductor fin 604 extending from a substrate 602 and in a gate trench GT4 between gate spacers 608. A portion of the semiconductor fin 604 under the gate trench GT4 can serve as a channel region 604c of the semiconductor device 600. The gate dielectric layer 606 may be substantially the same as the gate dielectric layer 306, as described above. The cap layer 610 may be substantially the same as the cap layer 310 not treated with the treatment 312. The ESL 612, the P-type work-function layer 614 and the N-type work-function layer 616 may be substantially the same as the ESL 316, the P-type work-function layer 318 and the N-type work-function layer 320, as described above.

The method M4 then proceeds to block S42 where a treatment using a silicon-containing gas or plasma is performed to the N-type work-function layer 616. With reference to FIGS. 19A and 19B, in some embodiments of block S42, a treatment 618 using the silicon-containing gas or plasma is carried out such that a constituent (e.g., silicon) of the silicon-containing gas or plasma is diffused into the exposed N-type work-function layer 616. In this way, some silicon atoms diffuse into the N-type work-function layer 616 and in turn bond with atoms in the N-type work-function layer 616 to form a silicon compound (e.g., silicon nitride). As a result, a surface layer of the N-type work-function layer 616 is converted to a silicon-containing layer 620 that has higher silicon concentration than the remaining underlying N-type work-function layer 616. In some embodiments, the N-type work-function layer 616 and the silicon-containing layer 620 are in combination referred to as a metal element-containing layer, wherein the silicon-containing layer 620 is a top portion of the metal element-containing layer, and the N-type work-function element-containing layer 616 is a bottom portion of the metal element-containing layer. In some embodiments, the silicon concentration of the silicon-containing layer 620 (i.e., the atomic ratio of silicon to all chemical elements in the silicon-containing layer 620, expressed in terms of percentage) ranges from about 5% to about 30%, while the silicon concentration of the underlying N-type work-function layer 616 (i.e., the atomic ratio of silicon to all chemical elements in the N-type work-function layer 616, expressed in terms of percentage) is less than about 1%. The resulting silicon-containing layer 620 has a thickness from about 5 Angstroms to about 50 Angstroms. If the thickness of the silicon-containing layer 620 is greater than about 50 Angstroms, the threshold voltage of the gate stack might be unsatisfactory. If the thickness of the silicon-containing layer 620 is less than about 5 Angstroms, the silicon-containing layer 620 might be too thin to prevent oxidation of the N-type work-function layer 616. In some embodiments, the silicon-containing layer 620 may be equivalently referred to as a dopant-containing layer that comprises a dopant of the dopant-containing gas (i.e., silicon of the silicon-containing gas). In some embodiments, the treatment and deposition of the N-type work-function layer 616 are in-situ performed. In some embodiments, the treatment 618 is a thermal soaking process with or without using plasma, as described above with respect to the treatment 312.

Performing the treatment 618 to the N-type work-function layer 616 is advantageous to prevent the N-type work-function layer 616 from oxidation because the N-type work-function layer 616 is capped or covered by the silicon-containing layer 620 in an in-situ process. It is understood that oxidation of the N-type work-function layer 616 would lead to unwanted increase of threshold voltage of the semiconductor device 600. However, since oxidation of the N-type work-function layer 616 is mitigated, the unwanted increase of the threshold voltage can be addressed.

Moreover, since silicon atoms from the silicon-containing gas or plasma are diffused into the N-type work-function layer 616 rather than deposited over the N-type work-function layer 616, a thickness of a combination of the remaining N-type work-function layer 616 and the silicon-containing layer 620 is substantially the same as a thickness of the N-type work-function layer 616 before the treatment 618. The treatment 618 therefore results in formation of the silicon-containing layer 620 with substantially no thickness increase of layers deposited in the gate trench GT4, which in turn will mitigate potential problems associated with challenge of subsequently filling the gate trench GT4 with other metals. In some other embodiments, a few silicon atoms are deposited over the N-type work-function layer 616 and thereby lead to slight increase of thickness of layers formed in the gate trench GT4.

Figure 21:
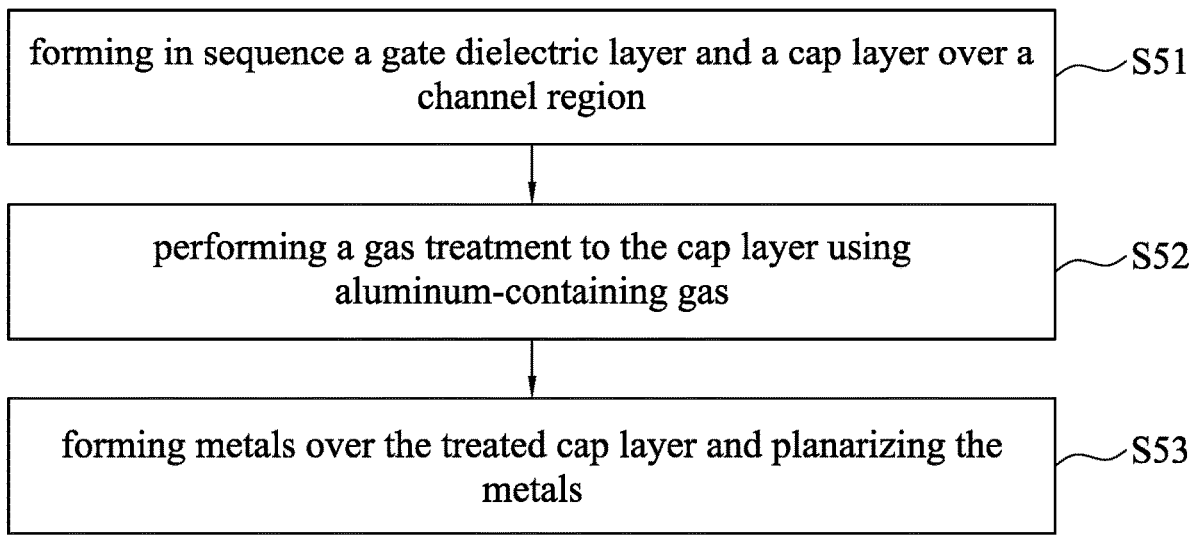
FIG. 21 is a flow chart of a method of forming a gate stack in accordance with some embodiments.

Some embodiments of the present disclosure employ a different gas (or plasma) than the silicon-containing gas (or plasma) in the treatment to improve control of threshold voltage of a transistor. For example, referring now to FIG. 21, illustrated is a method M5 that includes a treatment using an aluminum-containing gas or plasma in accordance with some embodiments of the present disclosure. Similar to the method M1, the method M5 may be implemented on either a planar device or a multi-gate device, and may be applicable to either one of a gate-last process or a gate first process.

Figure 22A:
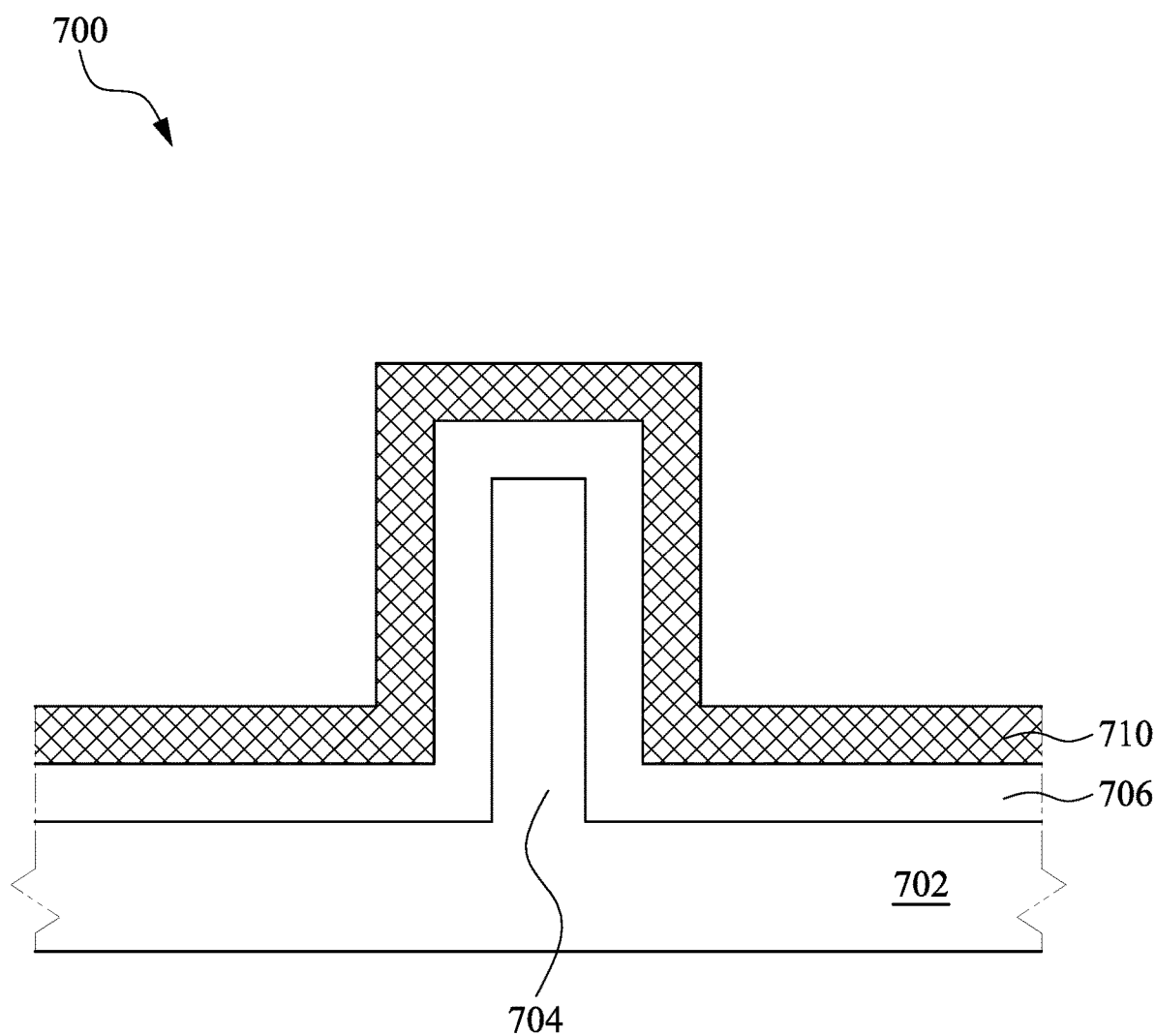
FIGS. 22A, 23A and 24A are cross-sectional views of a semiconductor device at various stages of the method of FIG. 21 along a first cut in some embodiments of the present disclosure.
Figure 22B:
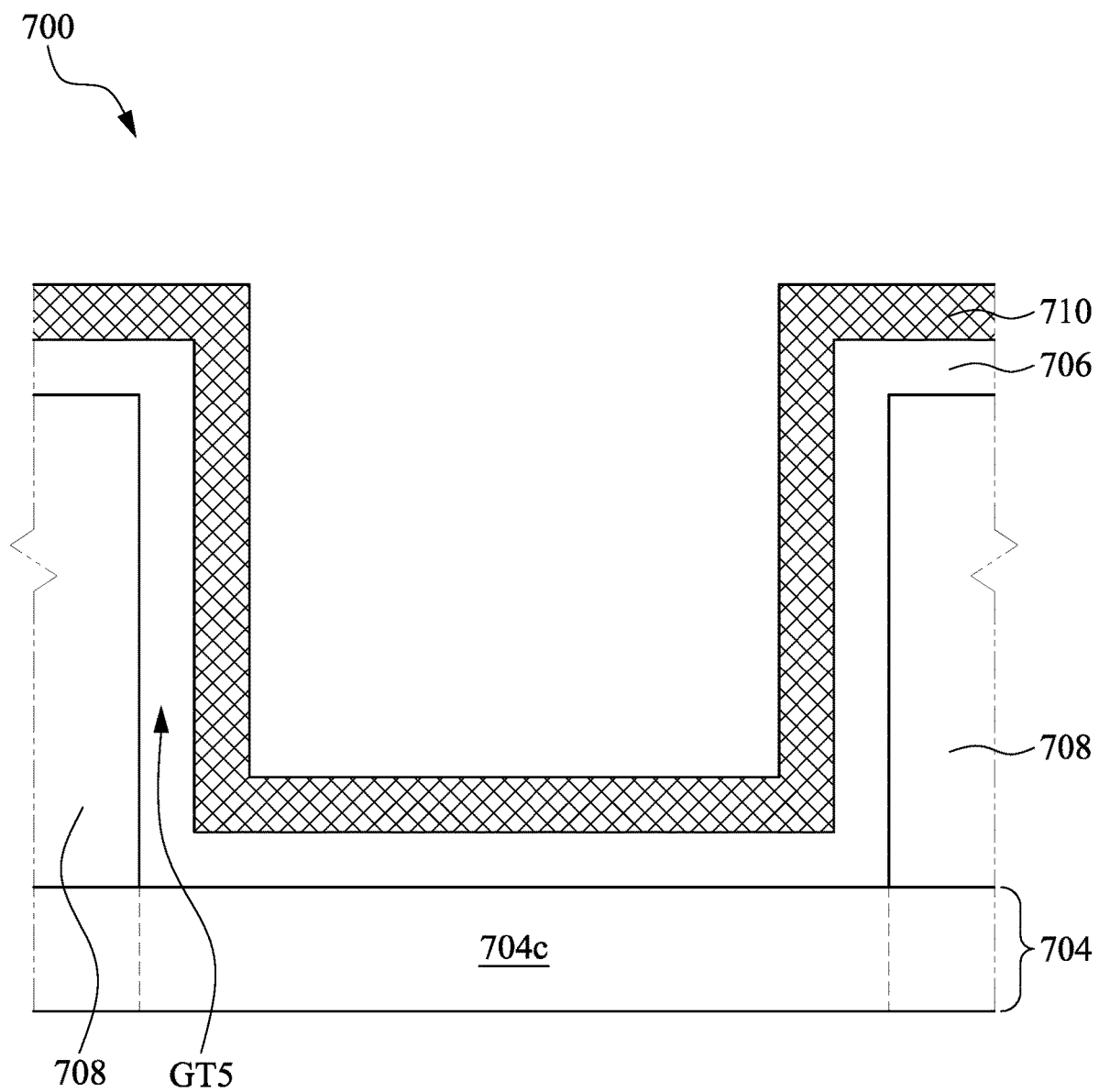
FIGS. 22B, 23B and 24B are cross-sectional views of the semiconductor device at various stages of the method of FIG. 21 along a second cut in some embodiments of the present disclosure.
Figure 23A:
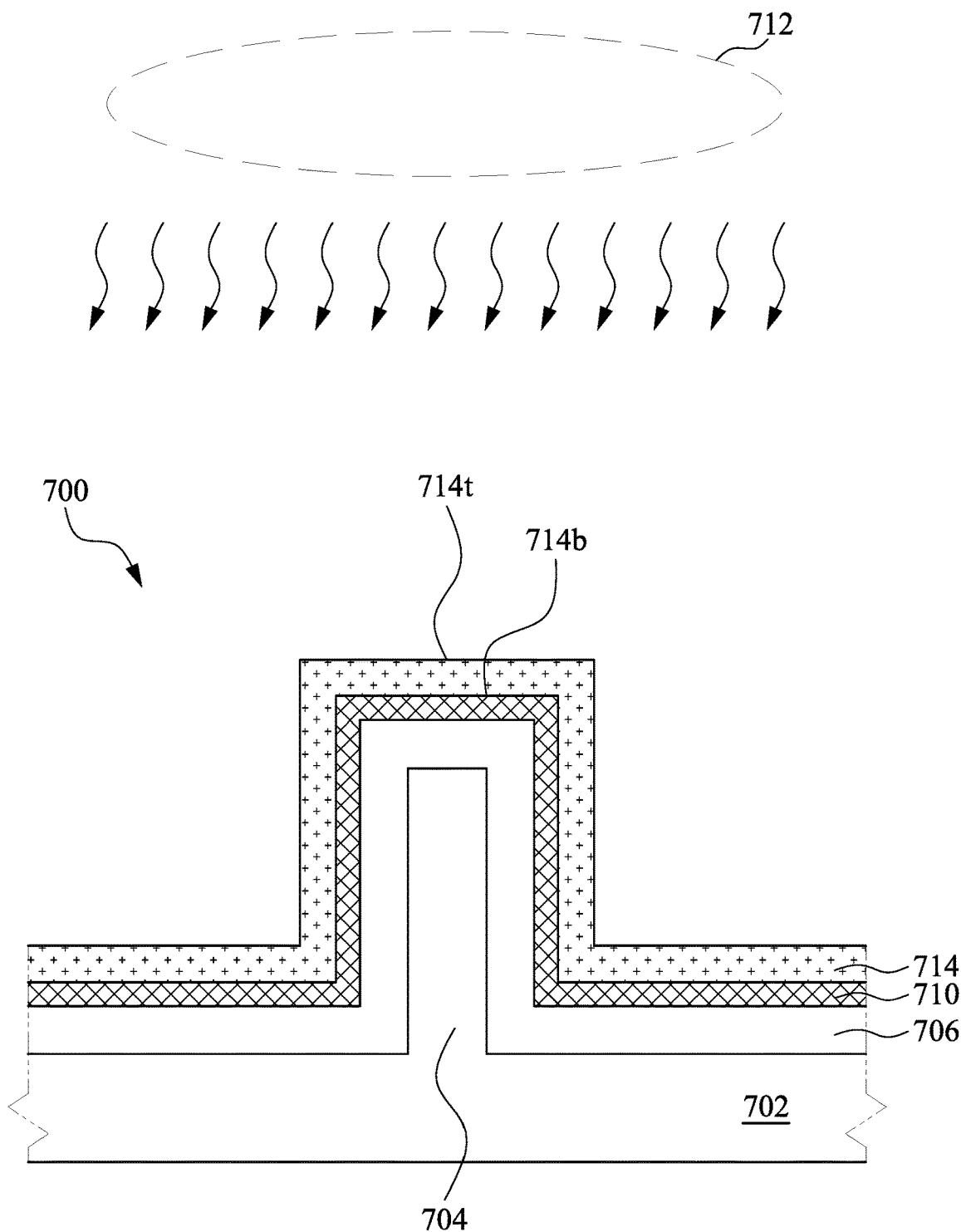
Figure 23B:
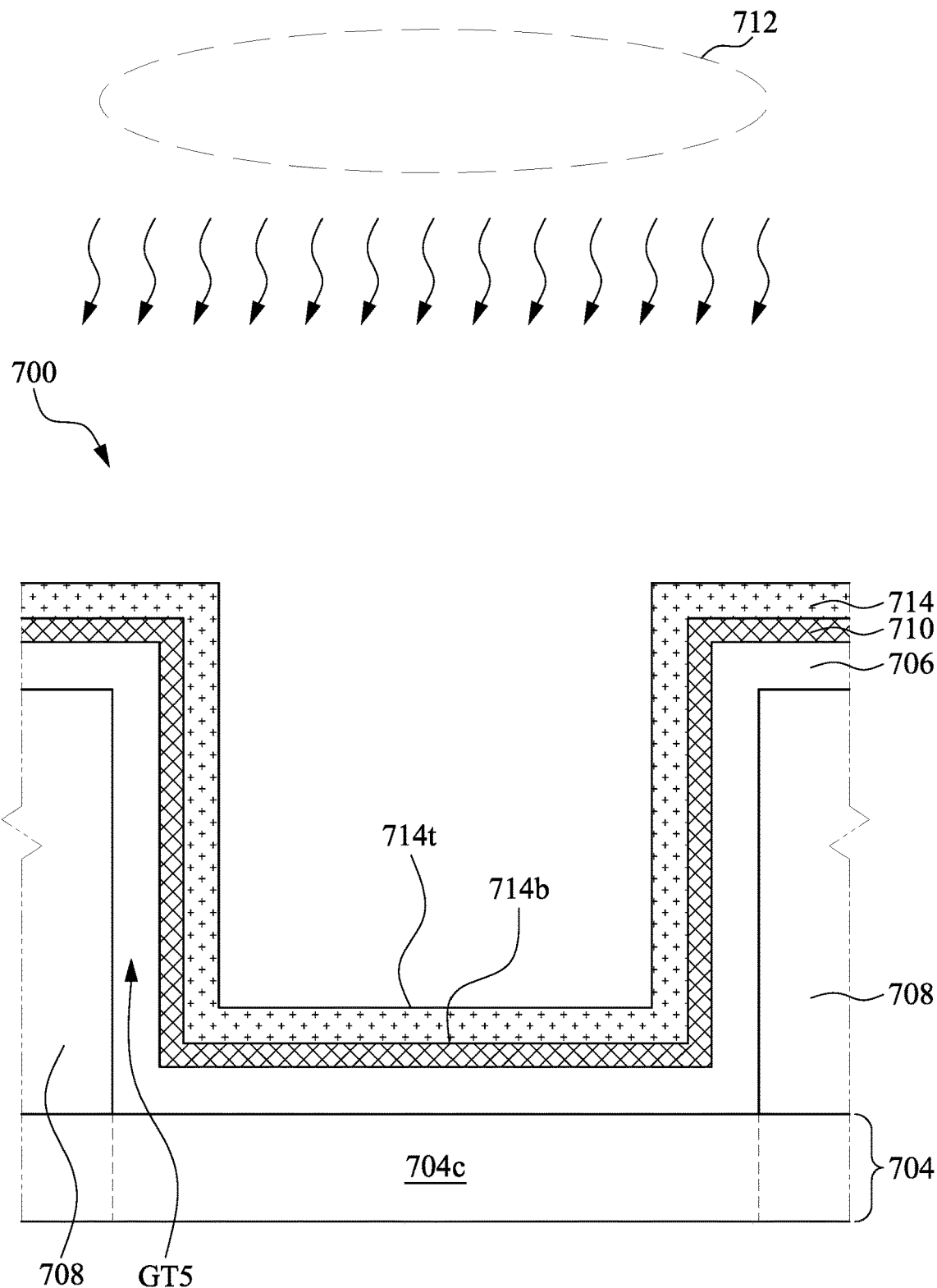
Figure 24A:
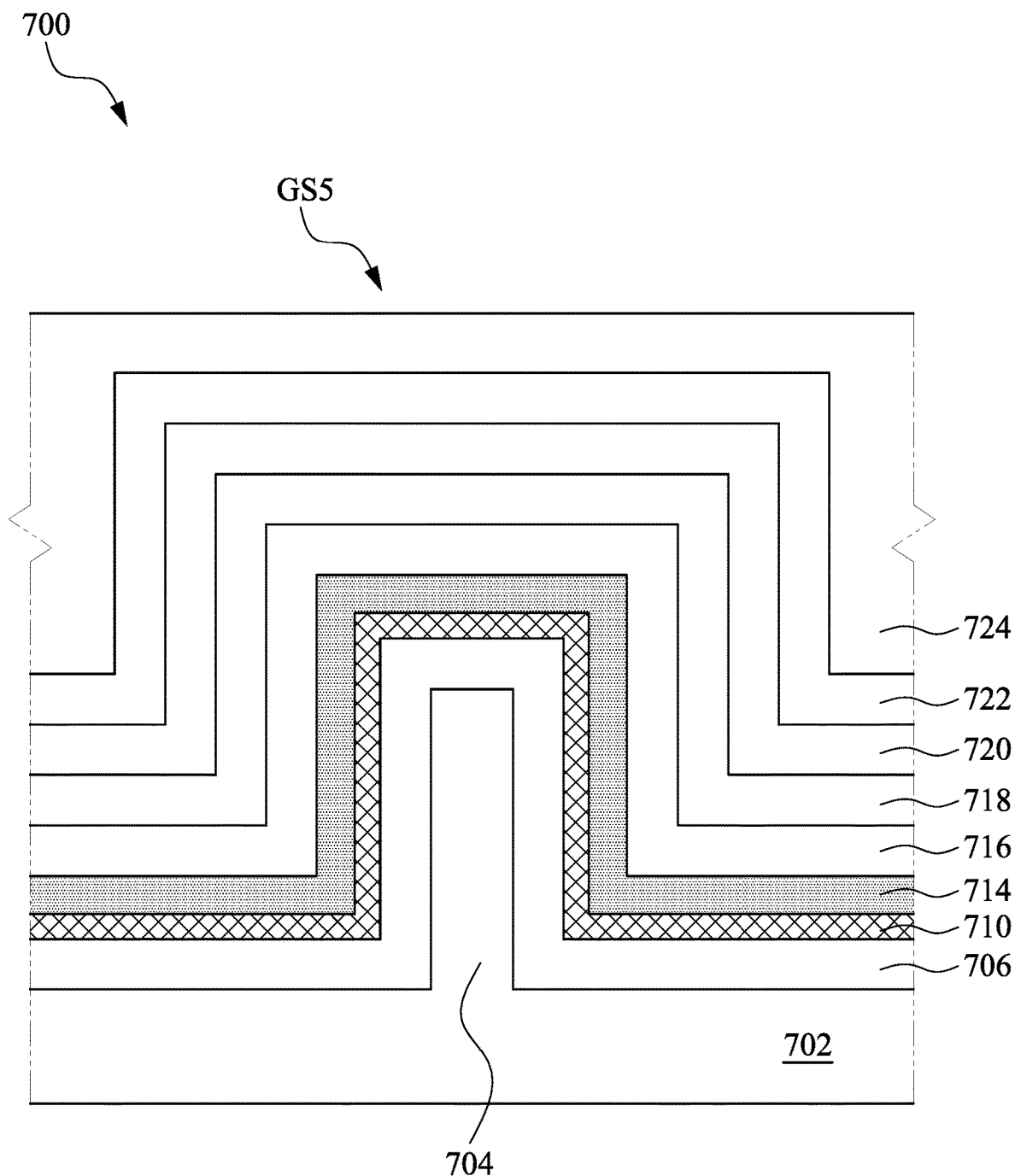
Figure 24B:
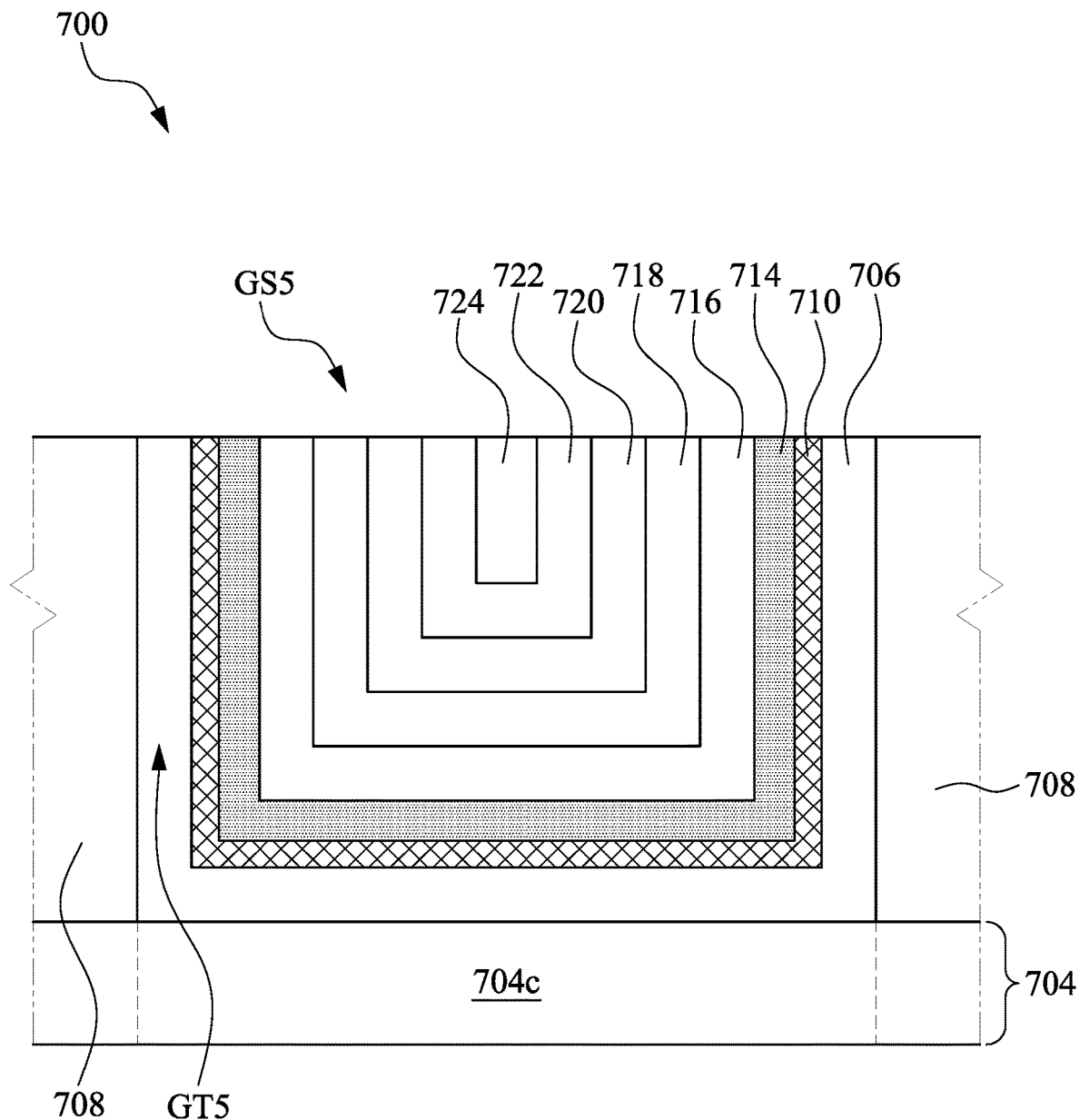

FIGS. 22A, 23A and 24A are cross-sectional views of a semiconductor device 700 at various stages of the method M5 of FIG. 21 along a first cut (e.g., A-A' cut in FIG. 2) in some embodiments of the present disclosure. FIGS. 22B, 23B and 24B are cross-sectional views of the semiconductor device 700 at various stages of the method M5 of FIG. 21 along a second cut (e.g., B-B' cut in FIG. 2) in some embodiments of the present disclosure. FIGS. 22A-24B illustrate fabrication of a gate stack of a FinFET device using a gate-last process. The illustration is merely exemplary and is not intended to be limiting beyond what is specifically recited in the claims that follow. It is understood that additional operations may be provided before, during, and after the operations shown by FIG. 21, and some of the operations described below can be replaced or eliminated for additional embodiments of the method. The order of the operations/processes may be interchangeable.

The method M5 begins at block S51 where a gate dielectric layer and a cap layer are formed in sequence over a channel region. Referring to FIGS. 22A and 22B, in some embodiments of block S51, a gate dielectric layer 706 and a cap layer 710 are formed in sequence over a semiconductor fin 704 extending from a substrate 702 and in a gate trench GT5 between gate spacers 708. A portion of the semiconductor fin 704 under the gate trench GT5 can serve as a channel region 704c of the semiconductor device 700. The gate dielectric layer 706 may be substantially the same as the gate dielectric layer 306, as described above. The cap layer 710 may be substantially the same as the cap layer 310 not treated with the treatment 312.

The method M5 then proceeds to block S52 where a treatment using aluminum-containing gas or plasma is performed to the cap layer. With reference to FIGS. 23A and 23B, in some embodiments of block S52, a treatment 712 using aluminum-containing gas or plasma is carried out such that a constituent (e.g., aluminum) of the aluminum-containing gas or plasma is diffused into the exposed cap layer 710. In this way, some aluminum atoms diffuse through grain boundaries of the cap layer 710 (e.g., grain boundaries of TiN) into the cap layer 710, some aluminum atoms are bond with atoms in the cap layer 310 to form an aluminum compound (e.g., aluminum nitride or aluminum carbide). As a result, a surface layer (i.e., a top portion) of the cap layer 710 is converted to an aluminum-containing layer 714 with higher aluminum concentration than the remaining underlying cap layer 710. In some embodiments, the cap layer 710 and the aluminum-containing layer 714 are in combination referred to as a metal element-containing layer, wherein the aluminum-containing layer 714 is a top portion of the metal element-containing layer, and the cap layer 710 is a bottom portion of the metal element-containing layer. In some embodiments, the aluminum concentration of the aluminum-containing layer 714 (i.e., the atomic ratio of aluminum to all chemical elements in the aluminum-containing layer 714, expressed in terms of percentage) ranges from about 5% to about 30%, while the aluminum concentration of the underlying cap layer 710 (i.e., the atomic ratio of aluminum to all chemical elements in the cap layer 710, expressed in terms of percentage) is less than about 1%. The resulting aluminum-containing layer 714 has a thickness in a range from about 5 Angstroms to about 50 Angstroms. If the thickness of the aluminum-containing layer 714 is greater than about 50 Angstroms, aluminum concentration in the gate stack might be out of a desired range. If the thickness of the aluminum-containing layer 714 is less than about 5 Angstroms, the aluminum-containing layer 714 might be too thin to lower the threshold voltage. As discussed above, aluminum is an N-type work-function with a work function lower than the mid-gap work function of silicon, thereby benefiting in reducing the threshold voltage of an N-type transistor. Thus, at least some advantages of the present disclosure include improving device Vt of an N-type transistor by using the treatment 712 with aluminum-containing gas or plasma.

In some embodiments, the aluminum-containing layer 714 may be equivalently referred to as a dopant-containing layer that comprises a dopant of the dopant-containing gas (i.e., aluminum of the aluminum-containing gas). In some embodiments, the aluminum-containing layer 714 has a chemical element the same as a chemical element of the cap layer 710 because the aluminum-containing layer 714 includes a doped region of the cap layer 710. By way of example, in some embodiments where the cap layer 710 is TiN, the aluminum-containing layer 714 includes nitrogen as well. Aluminum diffusion (or aluminum migration) attributed to the treatment 712 may lead to a spatially varied aluminum concentration in the aluminum-containing layer 714. For example, a top portion 714t of the aluminum-containing layer 714 has an aluminum concentration higher than an aluminum concentration of a bottom portion 714b of the aluminum-containing layer 714 that is in a position lower than the top portion 714t. In some embodiments, the aluminum-containing layer 714 has a gradient aluminum concentration that decreases along a direction from the top portion 714t to the bottom portion 714b.

In some embodiments, the treatment 712 is a thermal soaking process to soak the semiconductor device 700 in an aluminum-containing gas in a non-plasma ambient at an elevated temperature. By way of example, during the treatment 712, a gas mixture of the aluminum-containing gas and an argon gas (serving as a carrier gas) may be introduced into a processing chamber of the processing system (e.g., where the processing chamber houses the substrate having the cap layer), for example, at a temperature from about 200° C. to about 500° C., at a pressure from about 3 torr to about 10 torr, at an aluminum-containing-gas-to-argon-gas flow rate ratio approximately from about 0.5 to 2, and for a duration approximately from 10 seconds to 600 seconds. If the flow rate ratio is higher than about 2, unwanted aluminum-containing particles might be formed on the surface of the aluminum-containing layer 714. If the flow rate is lower than about 0.5, the aluminum-containing layer 714 might be too thin to lower the threshold voltage. If the temperature is higher than 500° C., unwanted chemical reaction between the aluminum-containing gas and other gases might occur. If the temperature is lower than about 200° C., diffusion of the aluminum atoms might not occur. If the pressure is higher than about 10 torr, unwanted aluminum-containing particles might be formed on the aluminum-containing layer 714. If the pressure is lower than about 3 torr, diffusion of the aluminum atoms might not occur. If the duration is longer than about 600 seconds, the aluminum concentration might be out of a desired range. If the duration is shorter than about 10 seconds, diffusion of the aluminum atoms might not occur.

In some embodiments, the treatment 712 is performed with the plasma, such that the aluminum-containing gas can be ionized. The plasma power is in a range from about 50 W to about 500 W. The power supply voltage is in a range from about 15 V to about 30 V. The carrier gas is an argon gas. If the plasma power and the power supply voltage are out of the selected ranges as described above, the aluminum concentration of the aluminum-containing layer 714 might be unsatisfactory for the gate stack. The treatment 712 with plasma is performed, for example, at a temperature from about 200° C. to about 500° C., at a pressure from about 3 torr to about 10 torr, at an aluminum-containing-gas-to-argon-gas flow rate ratio approximately from about 0.5 to 2, and for a duration approximately from 10 seconds to 600 seconds. If the flow rate ratio is higher than about 2, unwanted aluminum-containing particles might be formed on the surface of the aluminum-containing layer 714. If the flow rate is lower than about 0.5, the aluminum-containing layer 714 might be too thin to lower the threshold voltage. If the temperature is higher than about 500° C., unwanted chemical reaction between the aluminum-containing gas and other gases might occur. If the temperature is lower than about 200° C., diffusion of the aluminum atoms might not occur. If the pressure is higher than about 10 torr, unwanted aluminum-containing particles might be formed on the aluminum-containing layer 714. If the pressure is lower than about 3 torr, diffusion of the aluminum atoms might not occur. If the duration is longer than about 600 seconds, the aluminum concentration might be out of a desired range. If the duration is shorter than about 10 seconds, diffusion of the aluminum atoms might not occur. The aluminum-containing layer 714 resulting from the treatment 712 with plasma has a thickness from about 5 Angstroms to about 50 Angstroms.

It is noted that aluminum compound with low molecular weight, such as aluminum hydride, has higher tendency to dissociate than other aluminum compounds. Thus, in some embodiments, aluminum-containing gas made of the low-molecular-weight aluminum compound (e.g. aluminum hydride) can be employed in the treatment 712, which in turn will be advantageous for producing more aluminum atoms to diffuse into underlying layers. Examples of aluminum hydride gas employed in the treatment 712 include $AlH_3$, $Al_2H_6$, the like, or combinations thereof. In some embodiments, other gas (e.g., carrier gas) employed in the treatment 712 includes an inert gas or other gas that does not react with the aluminum compound of aluminum-containing gas, so as to facilitate dissociation of the aluminum compound. Examples of the carrier gas include Ar, He, the like, or combinations thereof.

As discussed above, since aluminum atoms from the aluminum-containing gas or plasma are diffused into the cap layer 710 rather than deposited over the cap layer 710, a thickness of a combination of the remaining cap layer 710 and the aluminum-containing layer 714 is substantially the same as a thickness of the cap layer 710 before the treatment 712. Accordingly, the treatment 712 results in formation of the aluminum-containing layer 714 with substantially no thickness increase of layers deposited in the gate trench GT5. Thus, forming the aluminum-containing layer 714 by using the treatment 712 is also advantageous for mitigating potential problems associated with challenge of subsequently filling the gate trench GT5 with metals.

In some embodiments, aluminum compounds other than aluminum hydride can be used as the aluminum-containing gas. For example, the aluminum-containing gas include trimethylaluminum ($Al(CH_3)_3$, also referred to as TMA), triethylaluminum ($Al(C_2H_5)_3$, also referred to as TEA), the like, or combinations thereof. In such embodiments, the treatment 712 may result in deposition of aluminum carbide (AlC) over the cap layer 710, which in turn leads to slight increase of a thickness of a combination of the aluminum-containing layer 714 and the remaining cap layer 710, as illustrated in FIGS. 23A and 23B. Because the carbon-containing aluminum compounds, such as TMA or TEA, have lower tendency to dissociate to form aluminum atoms than the aluminum hydride, an additional reducing gas can be employed in the treatment 712 to react with the aluminum-containing gas, so as to produce aluminum atoms to diffuse into the cap layer 710, according to some embodiments. By way of example, during the treatment 712, the reducing gas reduces the bond(s) in the ligand of the aluminum compound, releasing the ligand from the aluminum center and leaving aluminum atoms or ions to diffuse into the cap layer 710.

In some embodiments where the aluminum-containing gas is TMA gas, a reducing gas such as hydrogen gas can be employed to react with TMA and thus dissociate TMA, thereby converting the $CH_3$ ligand(s) of TMA into $CH_4$ gas. The $CH_4$ gas will be discharged and thus aluminum atoms can be diffused into the cap layer 710. As a result, deposition of aluminum carbide over the cap layer 710 can be reduced, which in turn will result in substantially no thickness increase of layers deposited in the gate trench GT5.

In some embodiments, the treatment 712 and deposition of the cap layer 710 are in-situ performed, for example, within a processing system using an ALD cluster tool. In some other embodiments, the treatment 712 is a separate ex-situ process subsequent to the deposition of the cap layer 710, which indicates that the treatment 712 and deposition of the cap layer 710 are performed in different chambers or different processing tools. In some embodiments where the treatment 712 and the deposition of the cap layer 710 are ex-situ performed, a surface clean process is optionally performed to remove unwanted materials (e.g. oxide) on the cap layer 710. For example, the surface clean process is a plasma process. In some embodiments, the plasma process involves argon bombardment, helium bombardment or the like.

The method M5 then proceeds to block S53 where metals are formed over the treated cap layer and planarized to form a gate stack. With reference to FIGS. 24A and 24B, in some embodiments of block S53, an ESL 716, a P-type work-function layer 718, an N-type work-function layer 720, a glue layer (or wetting layer) 722, and a fill layer 724 are formed in sequence into the gate trench GT5 and over the aluminum-containing layer 714. The gate dielectric layer 706, the cap layer 710, the aluminum-containing layer 714, the ESL 716, the P-type work-function layer 718, the N-type work-function layer 720, the glue layer 722 and the fill layer 724 are in combination referred to as a gate stack GS5. The ESL 716, the P-type work-function layer 718, the N-type work-function layer 720, the glue layer 722 and the fill layer 724 are substantially the same as the ESL 316, the P-type work-function layer 318, the N-type work-function layer 320, the glue layer 322 and the fill layer 324, respectively.

As discussed above, because the treatment 712 using the aluminum-containing gas or plasma can reduce the threshold voltage of an N-type transistor, the N-type work-function layer 320 can be thinner compared to an N-type work-function layer of an N-type transistor not treated by the aluminum-containing gas or plasma. Thus, potential problems associated with challenge of depositing the N-type work-function layer 320, the glue layer 322 and the fill layer 324 can be mitigated.

Figure 25:
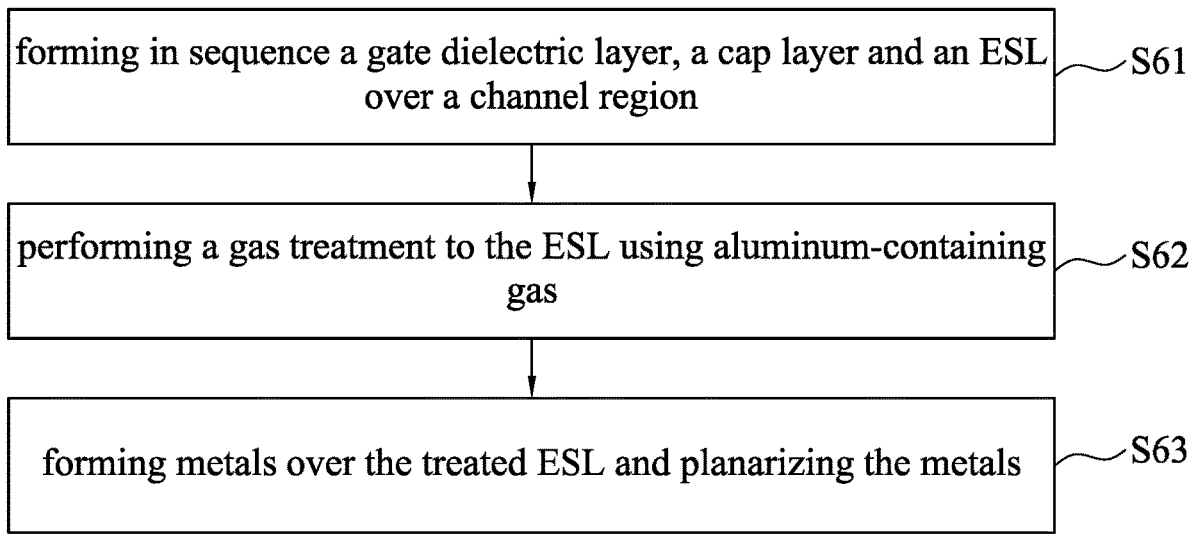
FIG. 25 is a flow chart of a method of forming a gate stack in accordance with some embodiments.

The treatment using the aluminum-containing gas or plasma as discussed above can be used to treat other layers of the gate stack. For example, referring now to FIG. 25, illustrated is a method M6 that includes a treatment performed to an ESL in a gate stack in accordance with some embodiments. The method M6 may be implemented on either a planar device or a multi-gate device, and may be applicable to either one of a gate-last process or a gate first process.

Figure 26A:
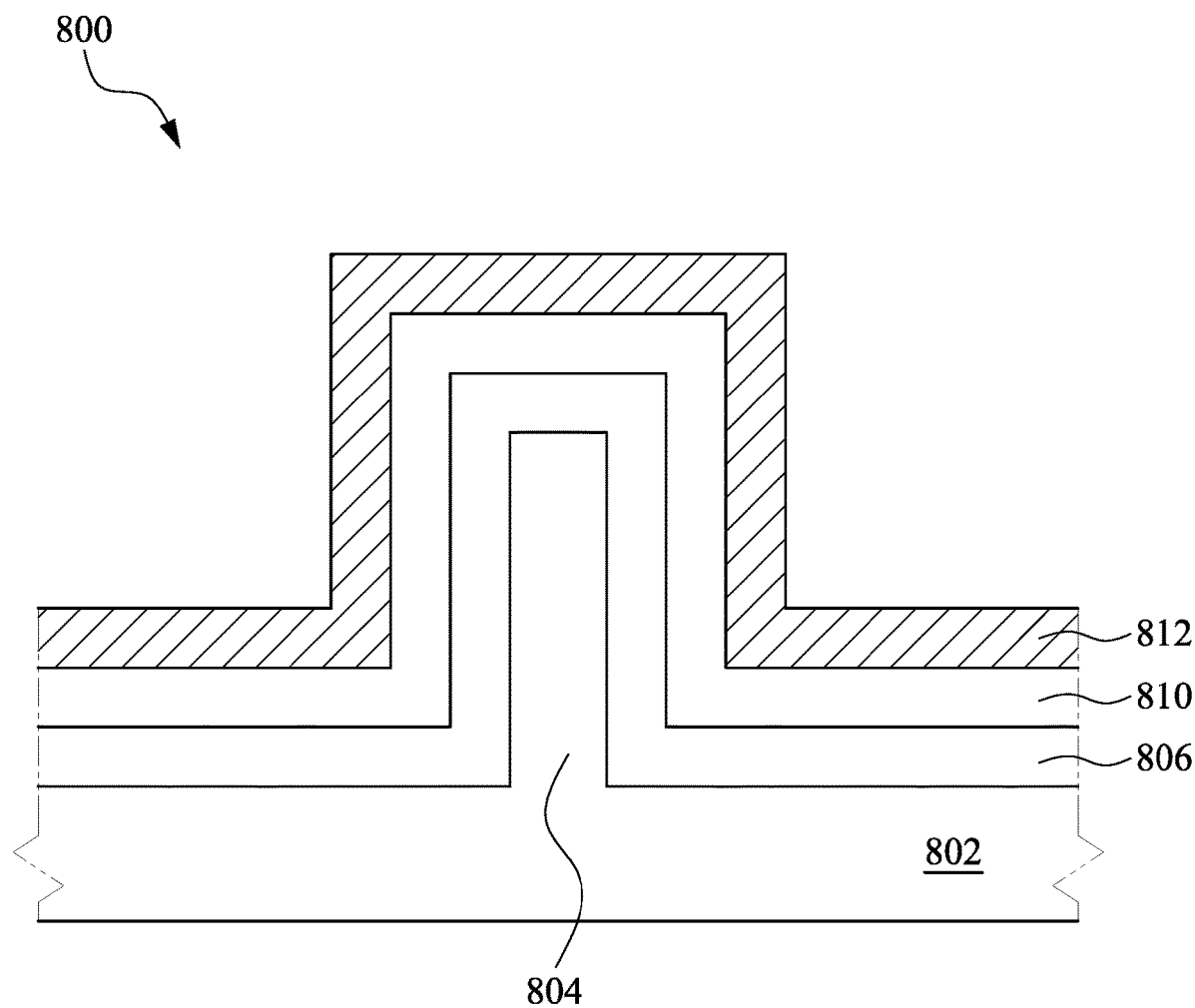
FIGS. 26A, 27A and 28A are cross-sectional views of a semiconductor device at various stages of the method of FIG. 25 along a first cut in some embodiments of the present disclosure.
Figure 26B:
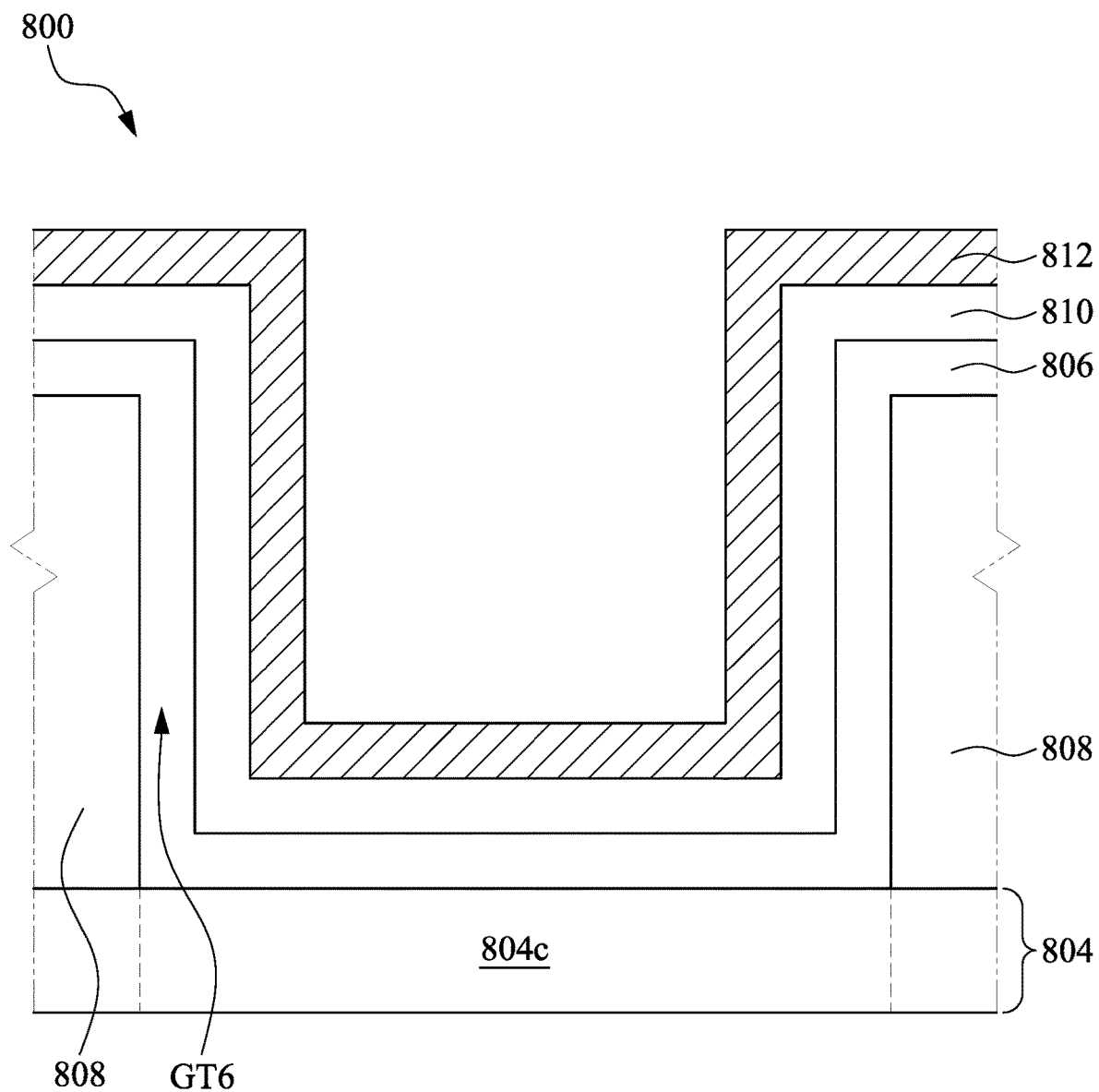
FIGS. 26B, 27B and 28B are cross-sectional views of the semiconductor device at various stages of the method of FIG. 25 along a second cut in some embodiments of the present disclosure.
Figure 27A:
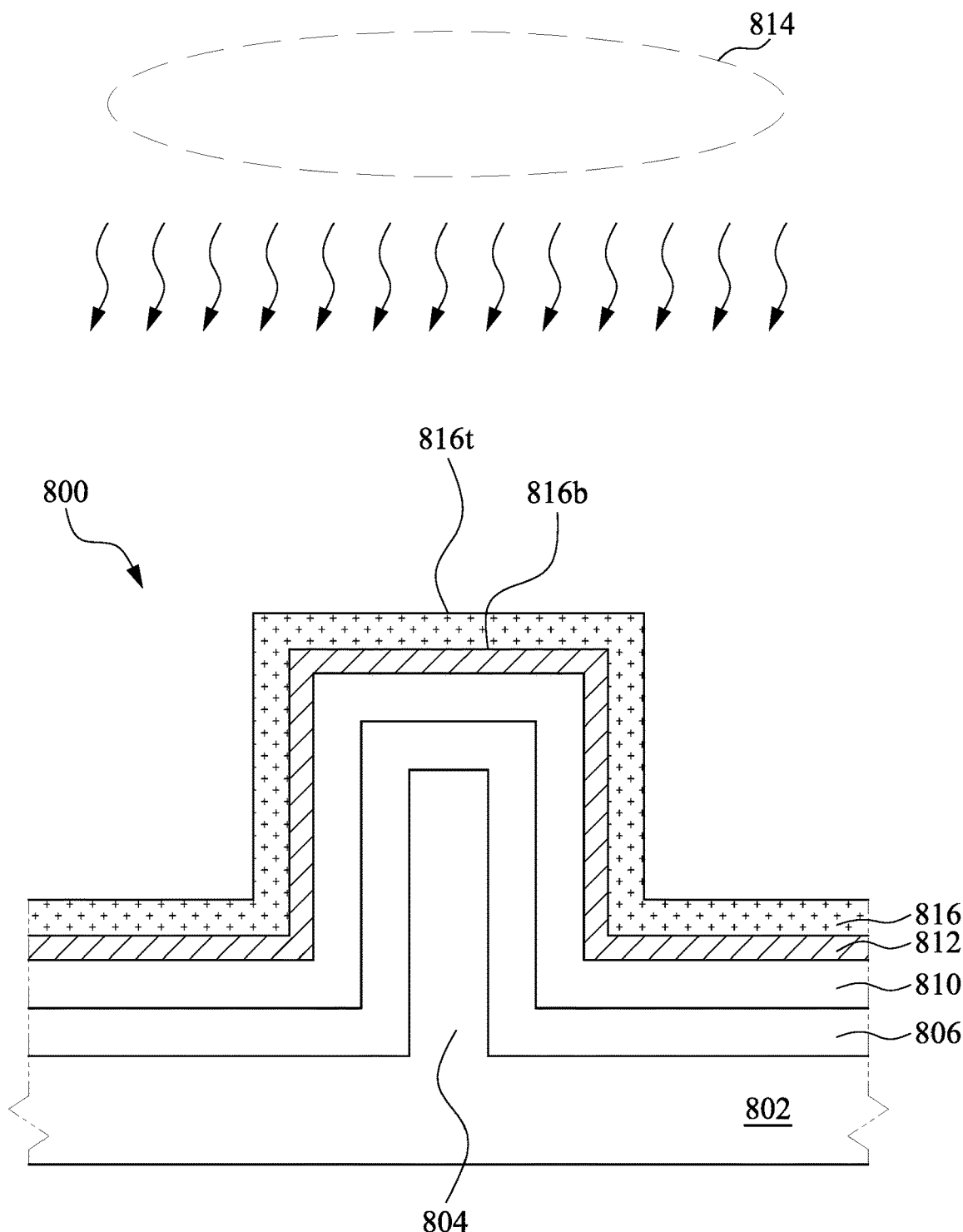
Figure 27B:
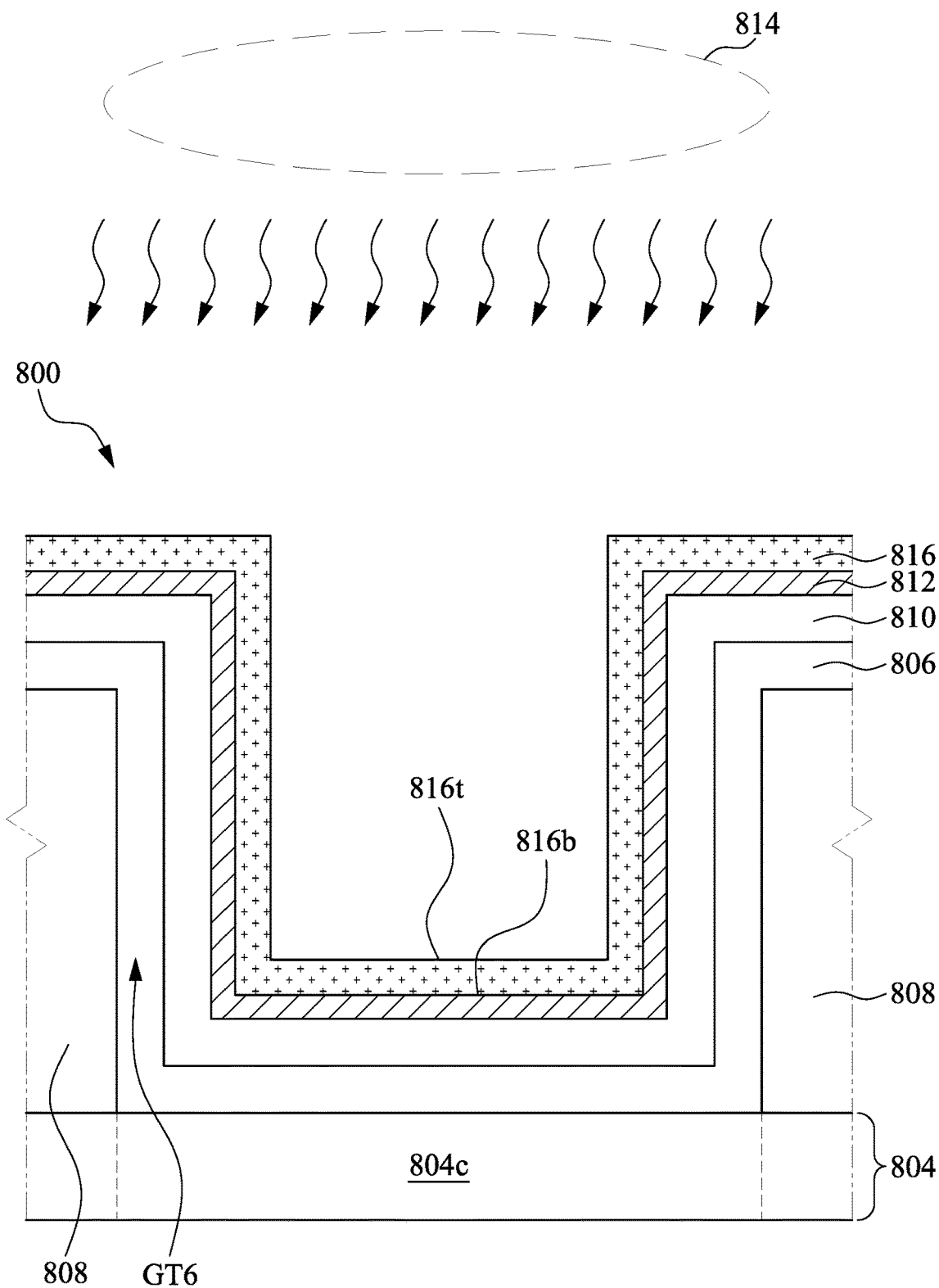
Figure 28A:
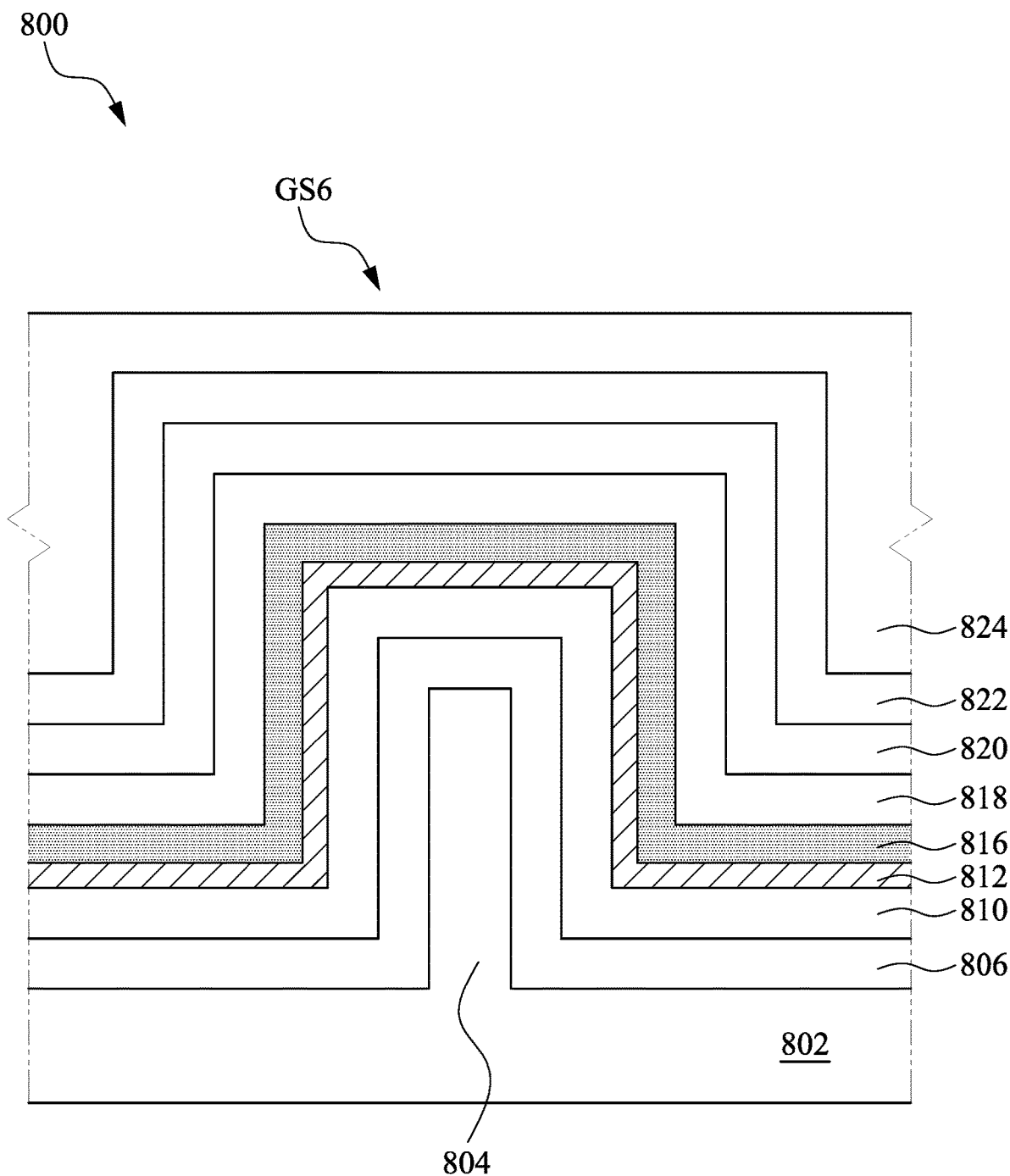
Figure 28B:
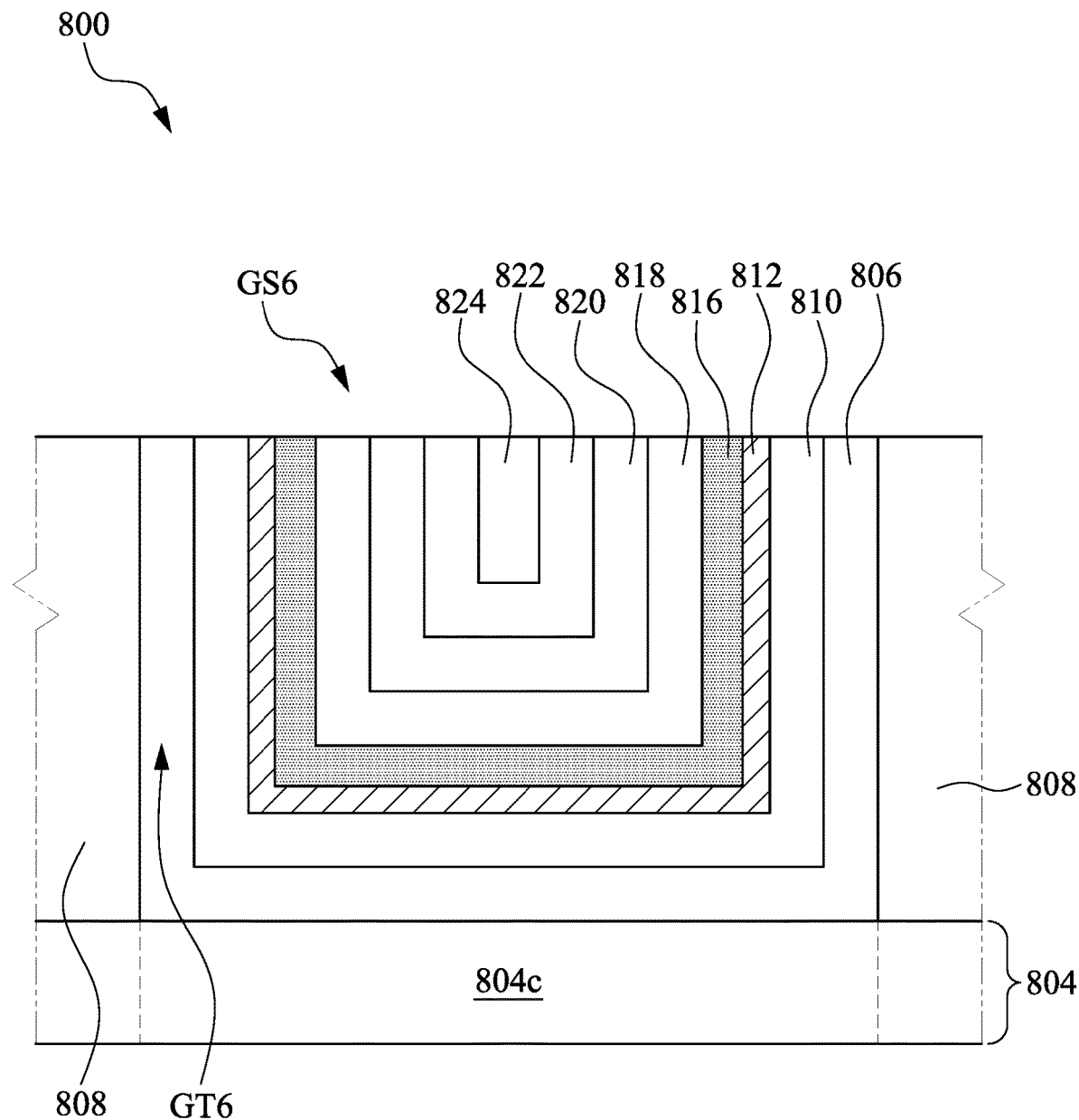

FIGS. 26A, 27A and 28A are cross-sectional views of a semiconductor device 800 at various stages of the method M6 of FIG. 25 along a first cut (e.g., A-A' cut in FIG. 2) in some embodiments of the present disclosure. FIGS. 26B, 27B and 28B are cross-sectional views of the semiconductor device 800 at various stages of the method M6 of FIG. 25 along a second cut (e.g., B-B' cut in FIG. 2) in some embodiments of the present disclosure. FIGS. 26A-28B illustrate fabrication of a gate stack of a FinFET device using a gate-last process. The illustration is merely exemplary and is not intended to be limiting beyond what is specifically recited in the claims that follow. It is understood that additional operations may be provided before, during, and after the operations shown by FIG. 25, and some of the operations described below can be replaced or eliminated for additional embodiments of the method. The order of the operations/processes may be interchangeable.

The method M6 begins at block S61 where a gate dielectric layer, a cap layer and an ESL are formed in sequence over a channel region. Referring to FIGS. 26A and 26B, in some embodiments of block S61, a gate dielectric layer 806, a cap layer 810 and an ESL 812 are formed in sequence over a semiconductor fin 804 extending from a substrate 802 and in a gate trench GT6 between gate spacers 808. A portion of the semiconductor fin 804 under the gate trench GT6 can serve as a channel region 804c of the semiconductor device 800. The gate dielectric layer 806 may be substantially the same as the gate dielectric layer 306, as described above. The cap layer 710 may be substantially the same as the cap layer 310 not treated with the treatment 312. The ESL 812 may be substantially the same as the ESL 316, as described above.

The method M6 then proceeds to block S62 where a treatment using an aluminum-containing gas or plasma is performed to the cap layer. With reference to FIGS. 27A and 27B, in some embodiments of block S62, a gas treatment 814 using the aluminum-containing gas or plasma is carried out such that a constituent (e.g., aluminum) of the aluminum-containing gas is diffused into the exposed ESL 812. In this way, some aluminum atoms are bond with atoms in the ESL 812 to form an aluminum compound (e.g., aluminum nitride or aluminum carbide). As a result, a surface layer (i.e., a top portion) of the ESL 812 is converted to an aluminum-containing layer 816 with higher aluminum concentration than the remaining underlying ESL 812. In some embodiments, the ESL 812 and the aluminum-containing layer 816 are in combination referred to as a metal element-containing layer, wherein the aluminum-containing layer 816 is a top portion of the metal element-containing layer, and the ESL 812 is a bottom portion of the metal element-containing layer. In some embodiments, the aluminum concentration of the aluminum-containing layer 816 (i.e., the atomic ratio of aluminum to all chemical elements in the aluminum-containing layer 816, expressed in terms of percentage) ranges from about 5% to about 30%, while the aluminum concentration of the underlying ESL 812 (i.e., the atomic ratio of aluminum to all chemical elements in the ESL 812, expressed in terms of percentage) is less than about 1%. The resulting aluminum-containing layer 816 has a thickness from about 5 Angstroms to about 50 Angstroms. If the thickness of the aluminum-containing layer 816 is greater than about 50 Angstroms, aluminum concentration in the gate stack might be out of a desired range. If the thickness of the aluminum-containing layer 816 is less than about 5 Angstroms, the aluminum-containing layer 816 might be too thin to lower the threshold voltage. In some embodiments, the aluminum-containing layer 816 may be equivalently referred to as a dopant-containing layer that comprises a dopant of the dopant-containing gas (i.e., aluminum of the aluminum-containing gas). As discussed above, aluminum is an N-type work-function with a work function lower than the mid-gap work function of silicon, and hence the treatment 814 can benefit in reducing the threshold voltage of an N-type transistor.

Aluminum diffusion (or aluminum migration) attributed to the treatment 814 may lead to a spatially varied aluminum concentration in the aluminum-containing layer 816. For example, a top portion 816t of the aluminum-containing layer 816 has an aluminum concentration higher than an aluminum concentration of a bottom portion 816b of the aluminum-containing layer 816 that is in a position lower than the top portion 816t. In some embodiments, the aluminum-containing layer 816 has a gradient aluminum concentration that decreases along a direction from the top portion 816t to the bottom portion 816b. In some embodiments, the treatment 814 is a thermal soaking process with plasma turned off or turned on, as described above with respect to the treatment 712. In some embodiments, a surface clean process, such as a plasma process, is performed to the ESL 812 prior to the treatment 814, so as to remove unwanted materials (e.g., oxide) on the ESL 812.

The method M6 then proceeds to block S63 where metals are formed over the treated ESL and planarized to form a gate stack. With reference to FIGS. 28A and 28B, in some embodiments of block S63, a P-type work-function layer 818, an N-type work-function layer 820, a glue layer (or wetting layer) 822, and a fill layer 824 are formed in sequence into the gate trench GT6 and over the aluminum-containing layer 816. The gate dielectric layer 806, the cap layer 810, the ESL 812, the aluminum-containing layer 816, the P-type work-function layer 818, the N-type work-function layer 820, the glue layer 822 and the fill layer 824 are in combination referred to as a gate stack GS6. The P-type work-function layer 818, the N-type work-function layer 820, the glue layer 822 and the fill layer 824 are substantially the same as the P-type work-function layer 318, the N-type work-function layer 320, the glue layer 322 and the fill layer 324, respectively.

Figure 29:
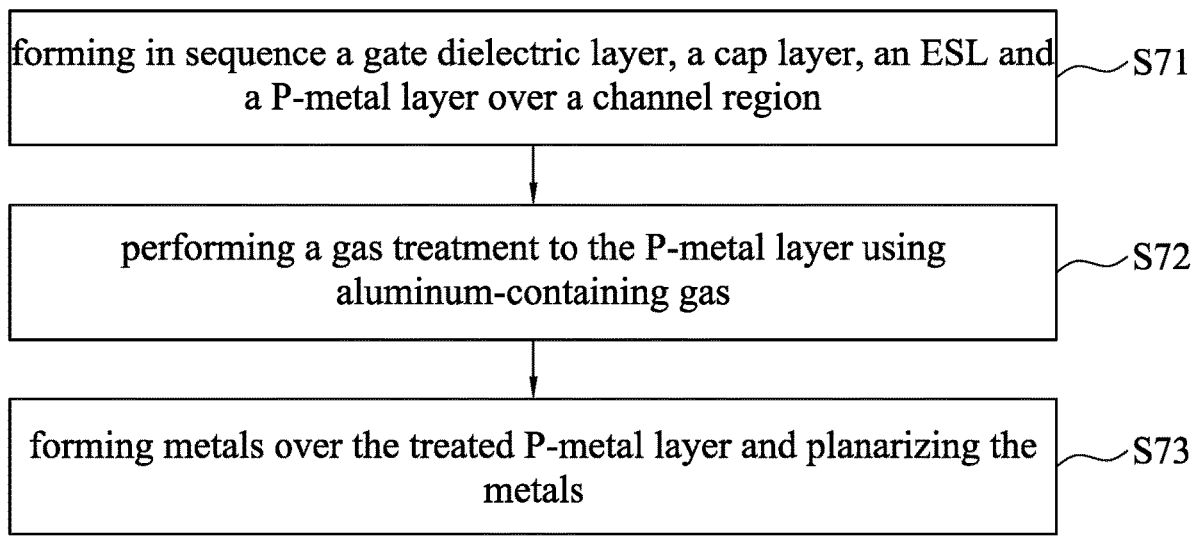
FIG. 29 is a flow chart of a method of forming a gate stack in accordance with some embodiments.

FIG. 29 illustrates another method M7 that includes a treatment performed to a P-type work-function layer in a gate stack in accordance with some embodiments. The method M7 may be implemented on either a planar device or a multi-gate device, and may be applicable to either one of a gate-last process or a gate first process.

Figure 30A:
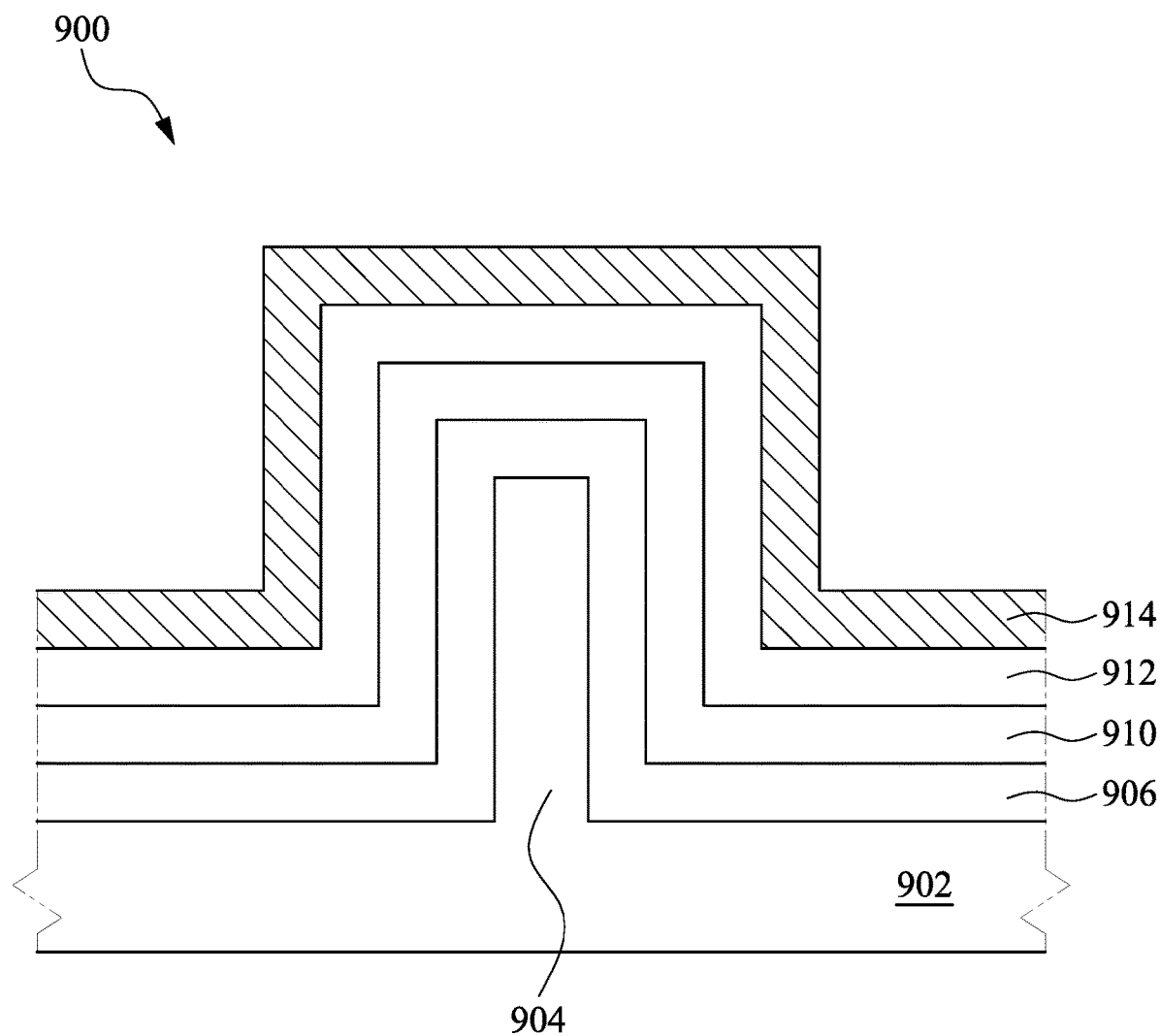
FIGS. 30A, 31A and 32A are cross-sectional views of a semiconductor device at various stages of the method of FIG. 29 along a first cut in some embodiments of the present disclosure.
Figure 30B:
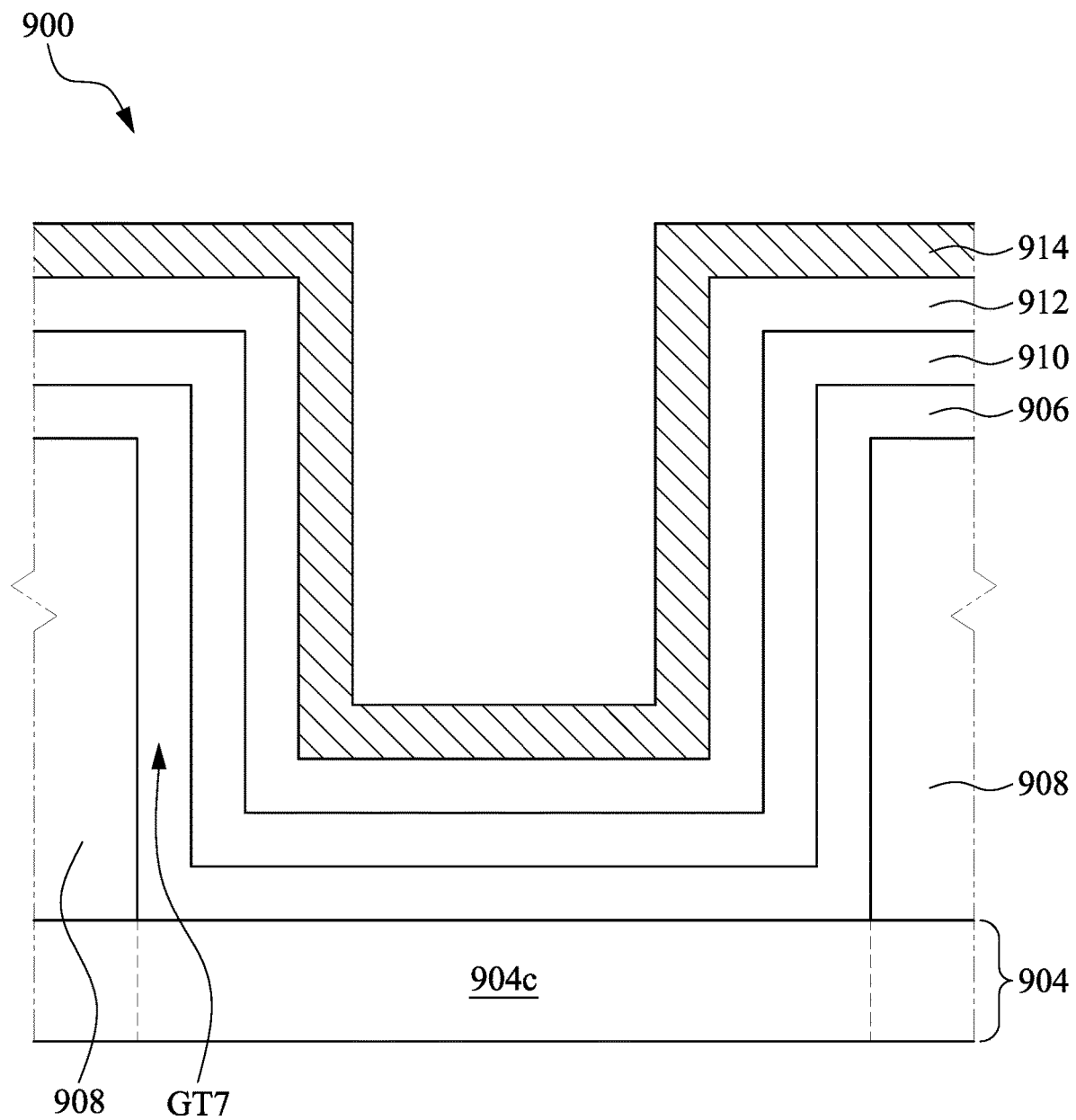
FIGS. 30B, 31B and 32B are cross-sectional views of the semiconductor device at various stages of the method of FIG. 29 along a second cut in some embodiments of the present disclosure.
Figure 31A:
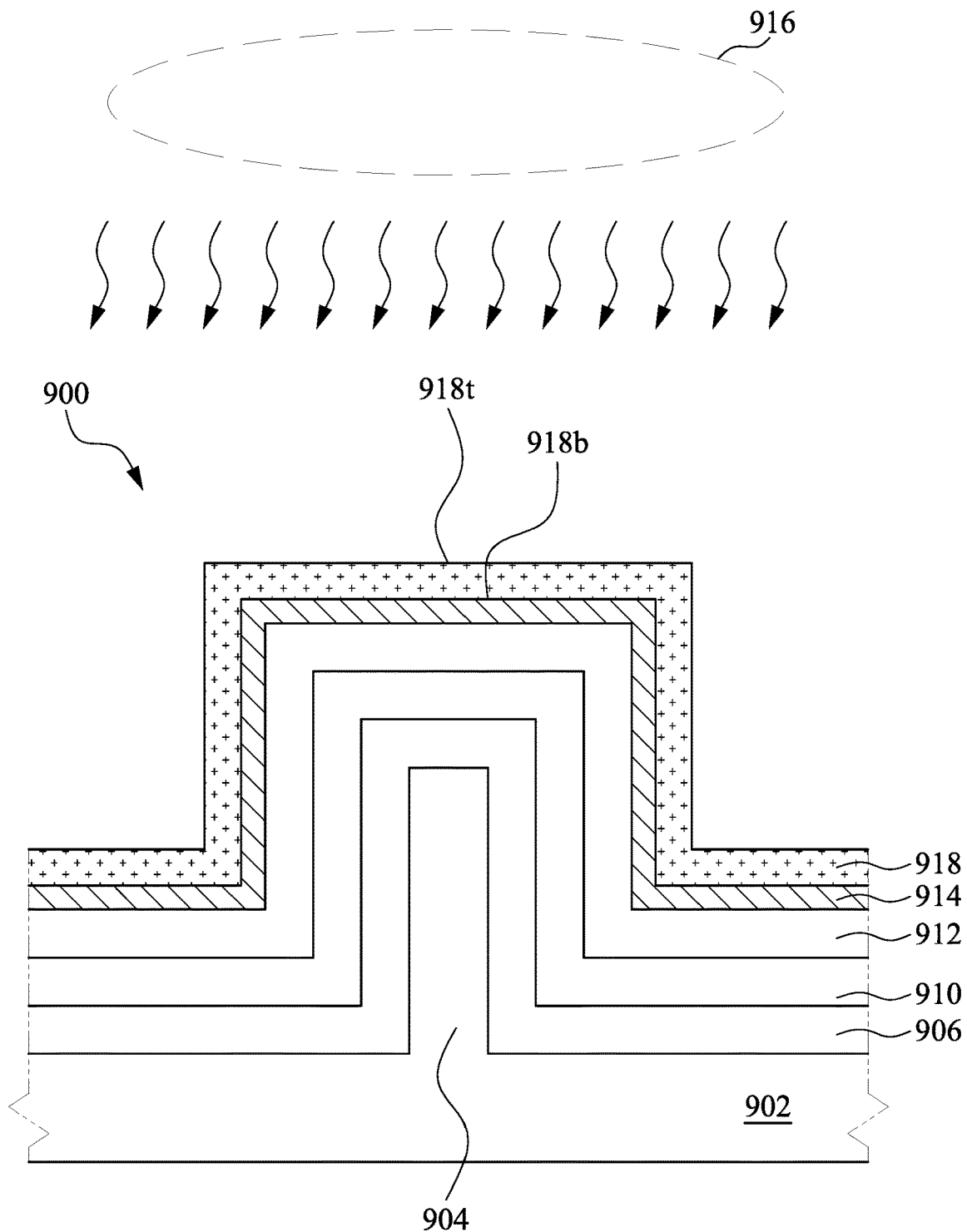
Figure 31B:
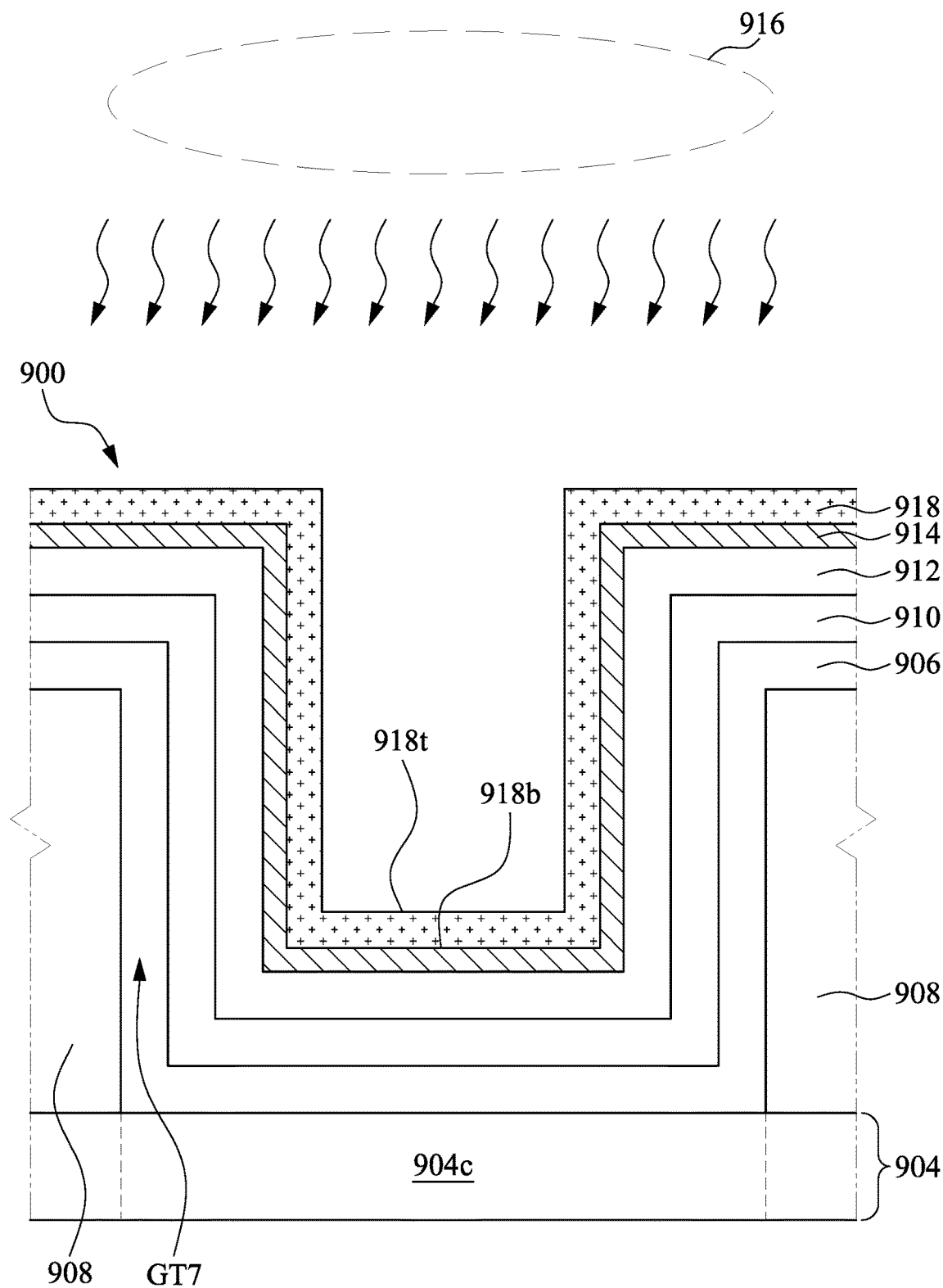
Figure 32A:
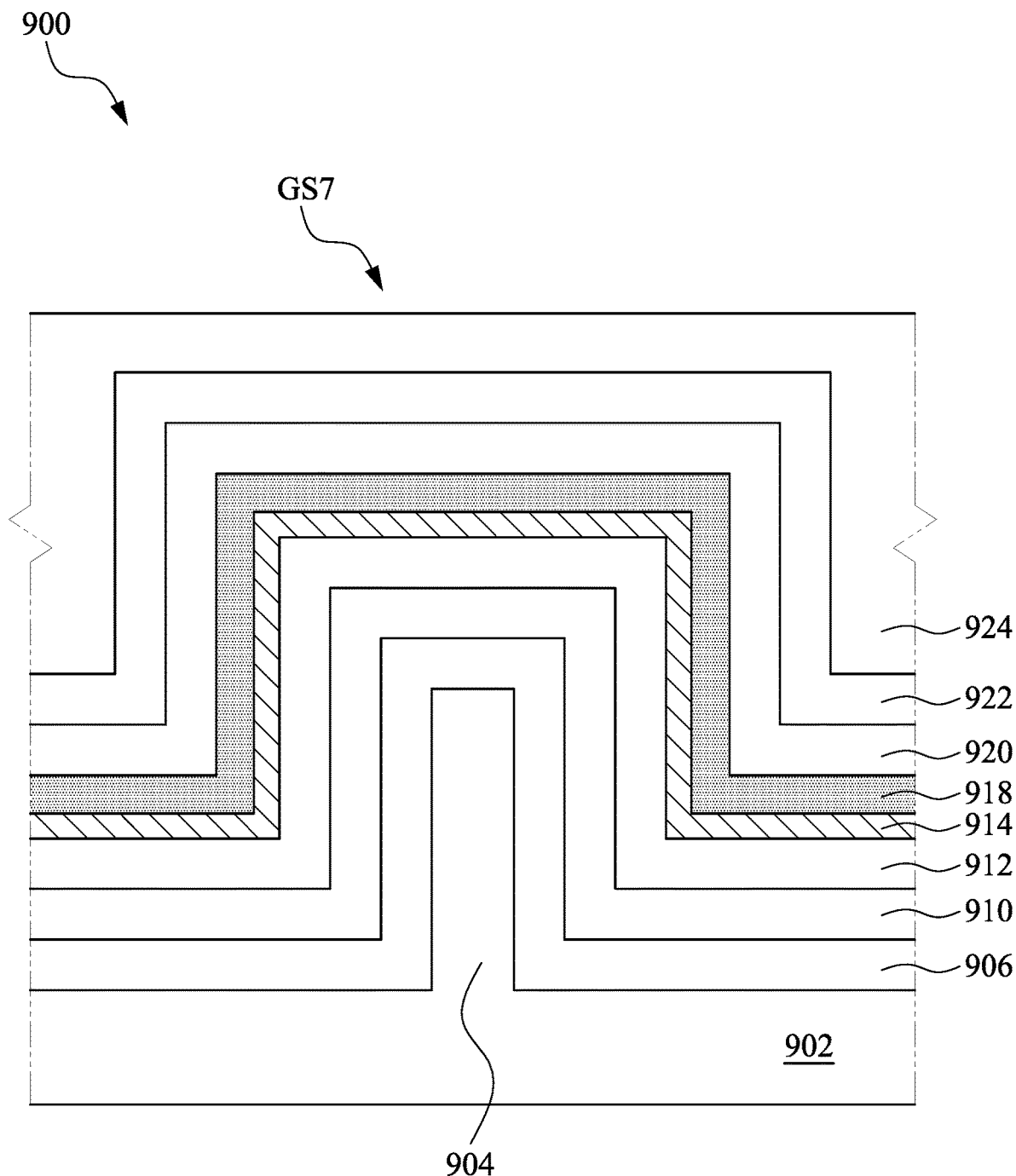
Figure 32B:
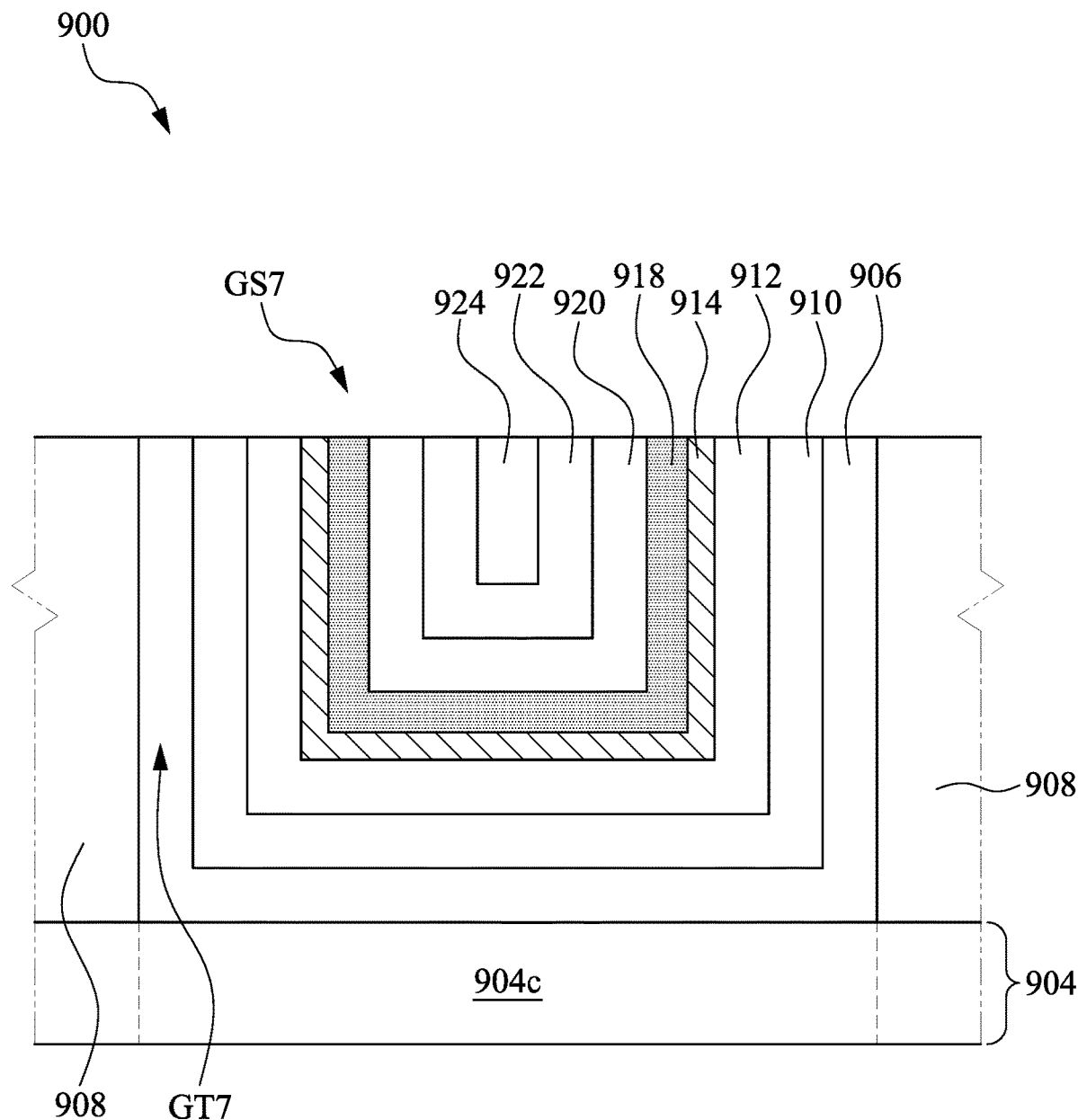

FIGS. 30A, 31A and 32A are cross-sectional views of a semiconductor device 900 at various stages of the method M6 of FIG. 25 along a first cut (e.g., A-A' cut in FIG. 2) in some embodiments of the present disclosure. FIGS. 30B, 31B and 32B are cross-sectional views of the semiconductor device 900 at various stages of the method M7 of FIG. 29 along a second cut (e.g., B-B' cut in FIG. 2) in some embodiments of the present disclosure. FIGS. 30A-32B illustrate fabrication of a gate stack of a FinFET device using a gate-last process. The illustration is merely exemplary and is not intended to be limiting beyond what is specifically recited in the claims that follow. It is understood that additional operations may be provided before, during, and after the operations shown by FIG. 29, and some of the operations described below can be replaced or eliminated for additional embodiments of the method. The order of the operations/processes may be interchangeable.

The method M7 begins at block S71 where a gate dielectric layer, a cap layer, an ESL and a P-type work-function layer are formed in sequence over a channel region. Referring to FIGS. 30A and 30B, in some embodiments of block S71, a gate dielectric layer 906, a cap layer 910, an ESL 912 and a P-type work-function layer 914 are formed in sequence over a semiconductor fin 904 extending from a substrate 802 and in a gate trench GT7 between gate spacers 908. A portion of the semiconductor fin 904 under the gate trench GT7 can serve as a channel region 904c of the semiconductor device 900. The gate dielectric layer 906 may be substantially the same as the gate dielectric layer 306, as described above. The cap layer 910 may be substantially the same as the cap layer 310 not treated with the treatment 312. The ESL 912 and the P-type work-function layer 914 may be substantially the same as the ESL 316 and the P-type work-function layer 318, respectively.

The method M7 then proceeds to block S72 where a treatment using an aluminum-containing gas or plasma is performed to the cap layer. With reference to FIGS. 31A and 31B, in some embodiments of block S72, a treatment 916 using the aluminum-containing gas or plasma is carried out such that a constituent (e.g., aluminum) of the aluminum-containing gas or plasma is diffused into the exposed P-type work-function layer 914. In this way, some aluminum atoms diffuse through grain boundaries of the P-type work-function layer 914 into the P-type work-function layer 914, some aluminum atoms are bond with atoms in the P-type work-function layer 914 to form an aluminum compound (e.g., aluminum nitride or aluminum carbide). As a result, a surface layer (i.e., a top portion) of the P-type work-function layer 914 is converted to an aluminum-containing layer 918 with higher aluminum concentration than the remaining underlying P-type work-function layer 914. In some embodiments, the P-type work-function layer 914 and the aluminum-containing layer 918 are in combination referred to as a metal element-containing layer, wherein the aluminum-containing layer 918 is a top portion of the metal element-containing layer, and the P-type work-function layer 914 is a bottom portion of the metal element-containing layer. In some embodiments, the aluminum concentration of the aluminum-containing layer 918 (i.e., the atomic ratio of aluminum to all chemical elements in the aluminum-containing layer 918, expressed in terms of percentage) ranges from about 5% to about 30%, while the aluminum concentration of the P-type work-function layer 914 (i.e., the atomic ratio of aluminum to all chemical elements in the P-type work-function layer 914, expressed in terms of percentage) is less than about 1%. The resulting aluminum-containing layer 918 has a thickness from about 5 Angstroms to about 50 Angstroms. If the thickness of the aluminum-containing layer 918 is greater than about 50 Angstroms, aluminum concentration in the gate stack might be out of a desired range. If the thickness of the aluminum-containing layer 918 is less than 5 Angstroms, the aluminum-containing layer 918 might be too thin to lower the threshold voltage. In some embodiments, the aluminum-containing layer 918 may be equivalently referred to as a dopant-containing layer that comprises a dopant of the dopant-containing gas (i.e., aluminum of the aluminum-containing gas). As discussed above, aluminum is an N-type work-function with a work function lower than the mid-gap work function of silicon, and hence the treatment 916 can benefit in reducing the threshold voltage of an N-type transistor.

Aluminum diffusion (or aluminum migration) attributed to the treatment 916 may lead to a spatially varied aluminum concentration in the aluminum-containing layer 918. For example, a top portion 918$t$ of the aluminum-containing layer 918 has an aluminum concentration higher than an aluminum concentration of a bottom portion 918$b$ of the aluminum-containing layer 918 that is in a position lower than the top portion 918$t$. In some embodiments, the aluminum-containing layer 918 has a gradient aluminum concentration that decreases along a direction from the top portion 918$t$ to the bottom portion 918$b$. In some embodiments, the treatment 814 is a thermal soaking process with plasma turned off or turned on, as described above with respect to the treatment 712. In some embodiments, a surface clean process, such as a plasma process, is performed to the P-type work-function layer 914 prior to the treatment 916, so as to remove unwanted materials (e.g., oxide) on the P-type work-function layer 914.

The method M7 then proceeds to block S73 where metals are formed over the treated P-type work-function layer and planarized to form a gate stack. With reference to FIGS. 32A and 32B, in some embodiments of block S73, an N-type work-function layer 920, a glue layer (or wetting layer) 922, and a fill layer 924 are formed in sequence into the gate trench GT7 and over the aluminum-containing layer 918. The gate dielectric layer 906, the cap layer 910, the ESL 912, the P-type work-function layer 914, the aluminum-containing layer 918, the N-type work-function layer 920, the glue layer 922 and the fill layer 924 are in combination referred to as a gate stack GS7. The N-type work-function layer 920, the glue layer 922 and the fill layer 924 are substantially the same as the N-type work-function layer 320, the glue layer 322 and the fill layer 324, respectively.

Figure 33:
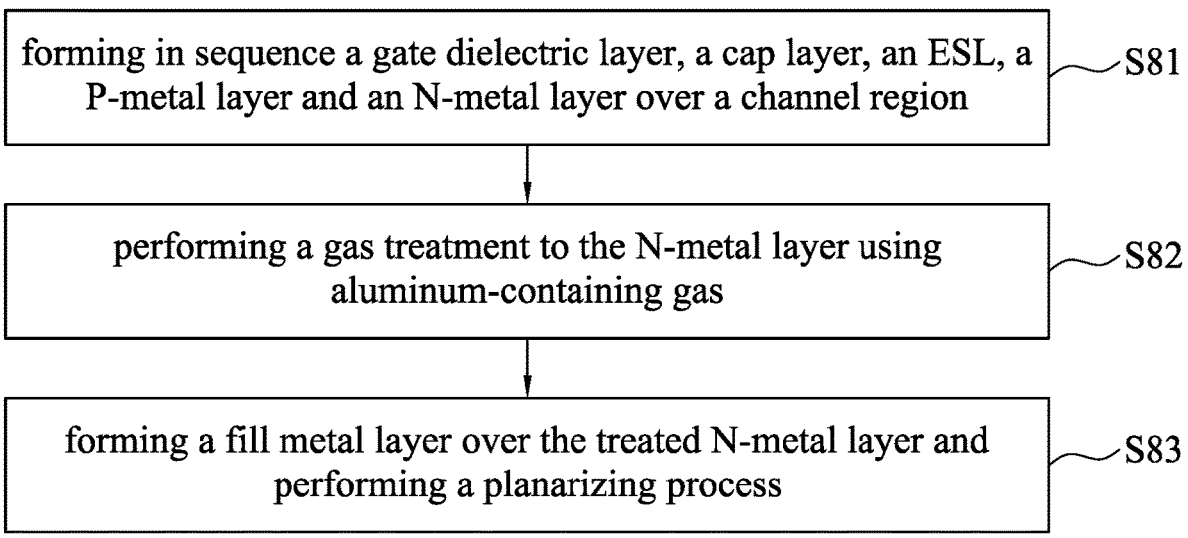
FIG. 33 is a flow chart of a method of forming a gate stack in accordance with some embodiments.

FIG. 33 illustrates another method M8 that includes a treatment performed to an N-type work-function layer in a gate stack in accordance with some embodiments. The method M8 may be implemented on either a planar device or a multi-gate device, and may be applicable to either one of a gate-last process or a gate first process.

Figure 34A:
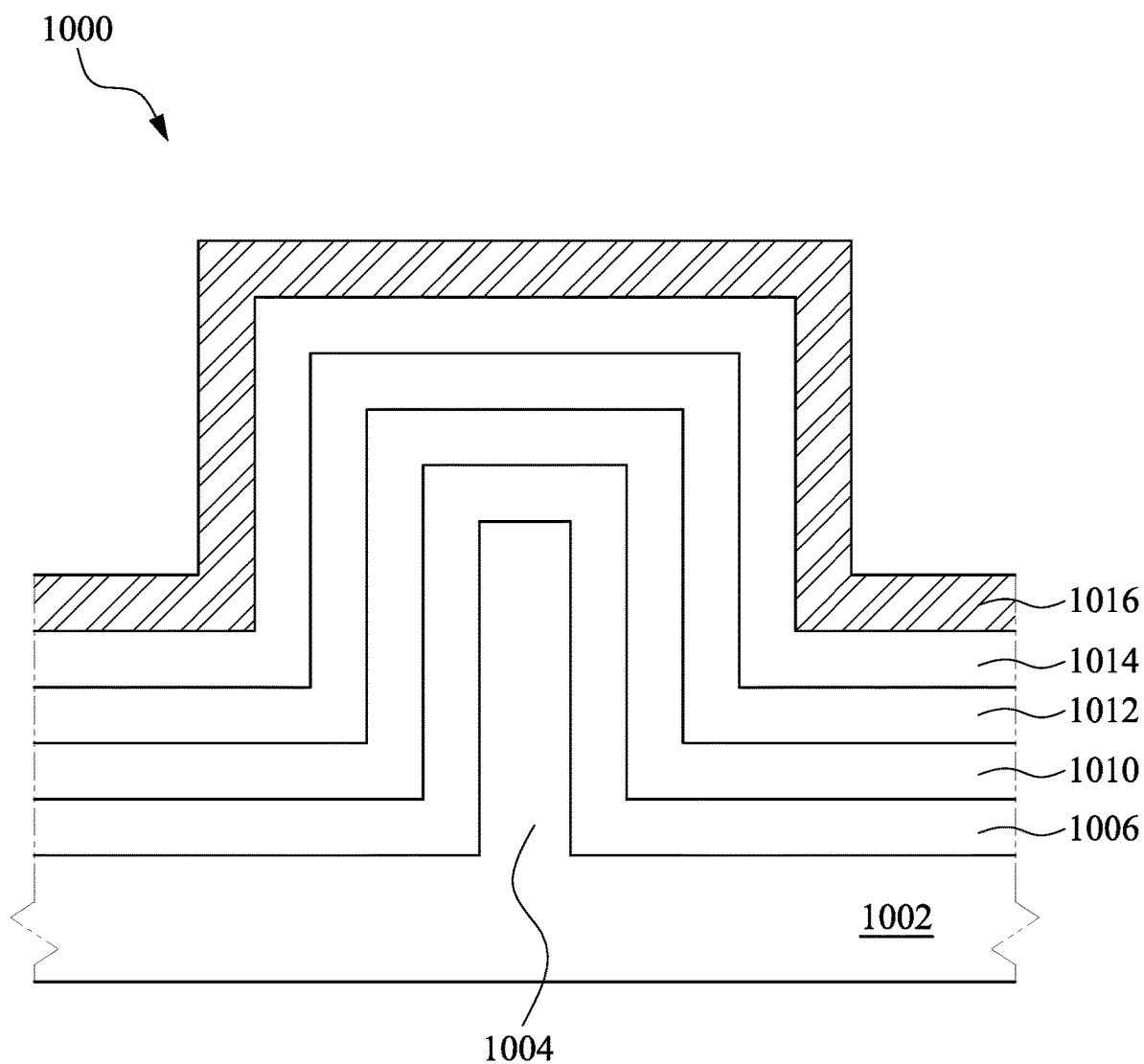
FIGS. 34A, 35A and 36A are cross-sectional views of a semiconductor device at various stages of the method of FIG. 33 along a first cut in some embodiments of the present disclosure.
Figure 34B:
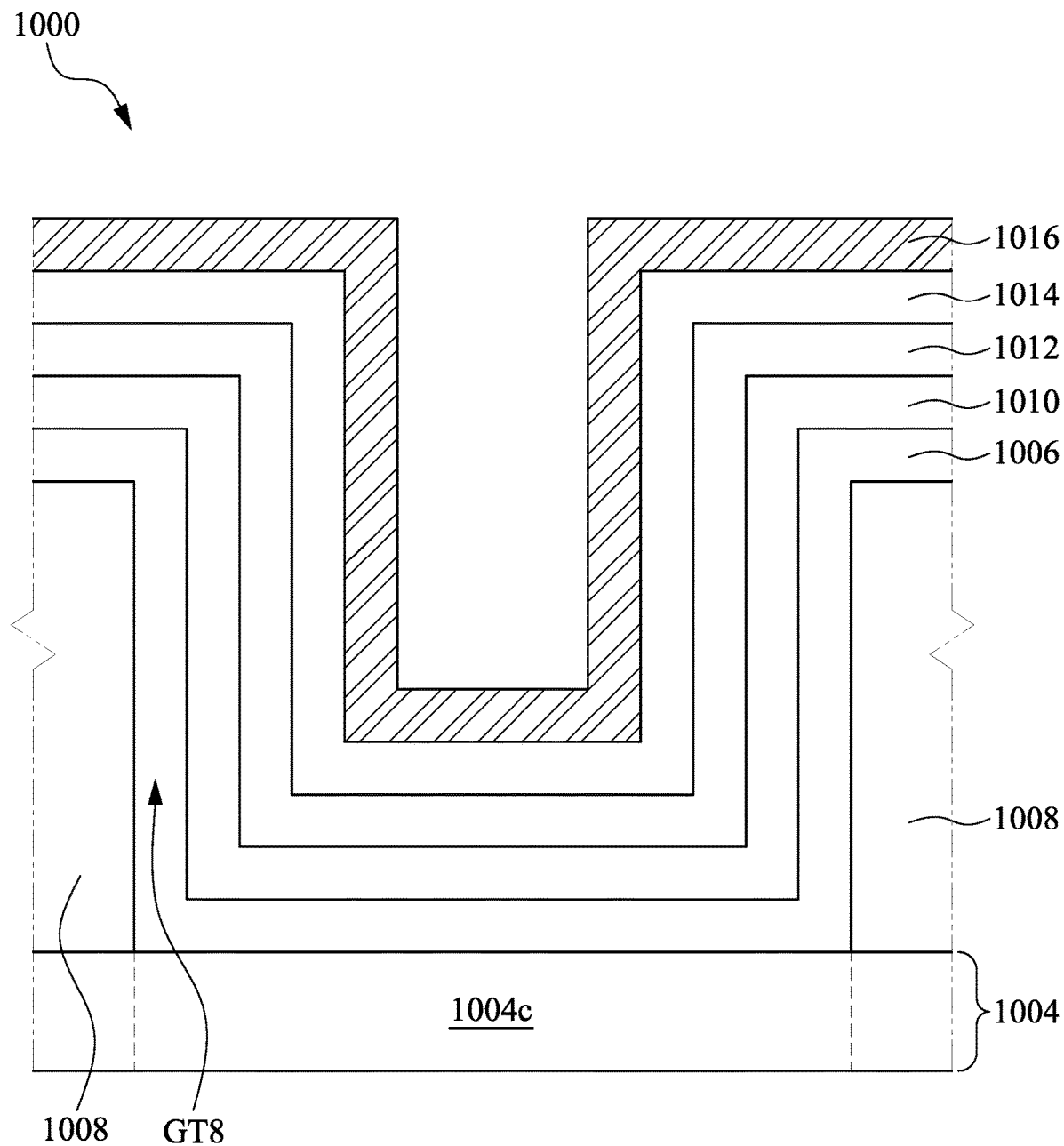
FIGS. 34B, 35B and 36B are cross-sectional views of the semiconductor device at various stages of the method of FIG. 33 along a second cut in some embodiments of the present disclosure.
Figure 35A:
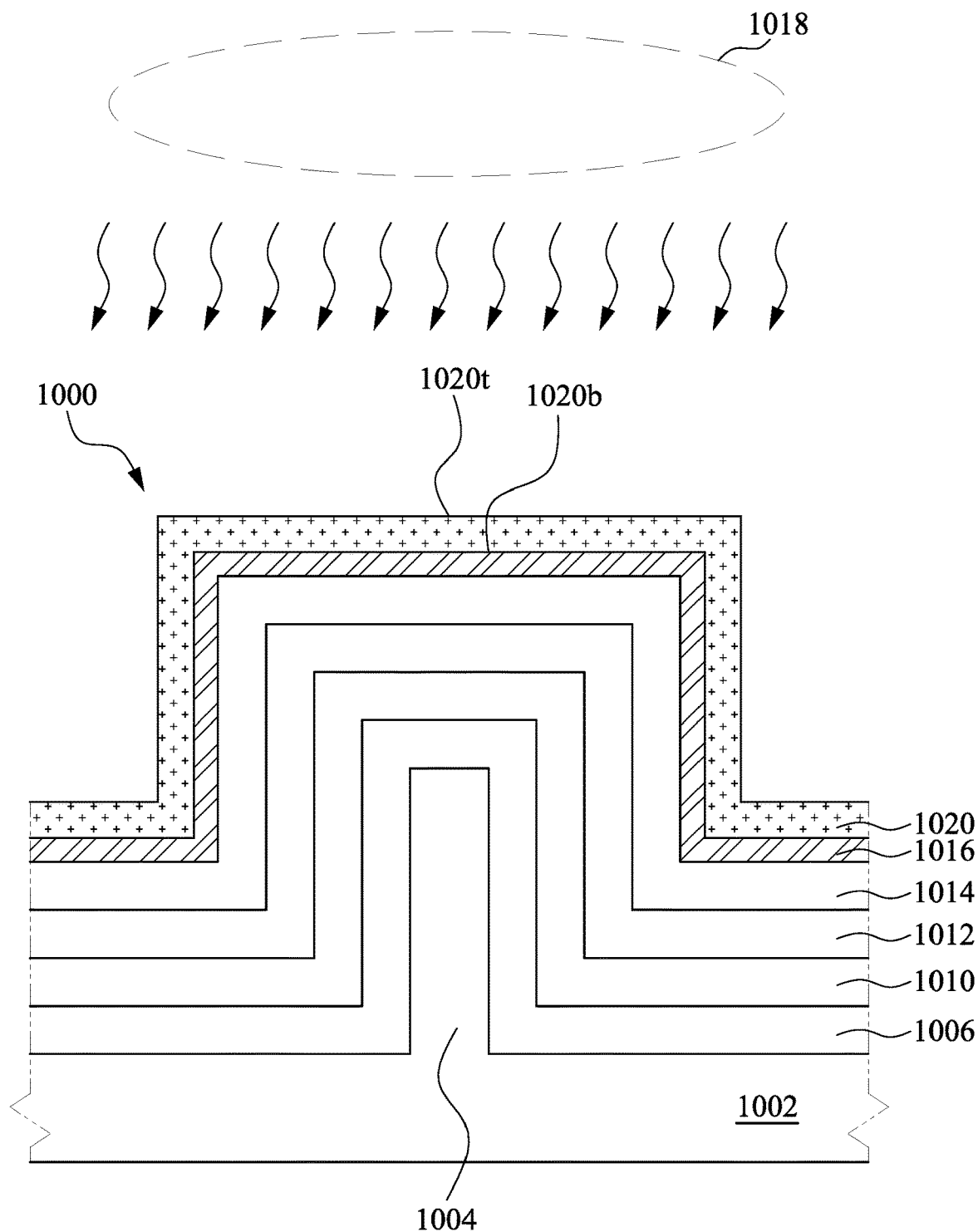
Figure 35B:
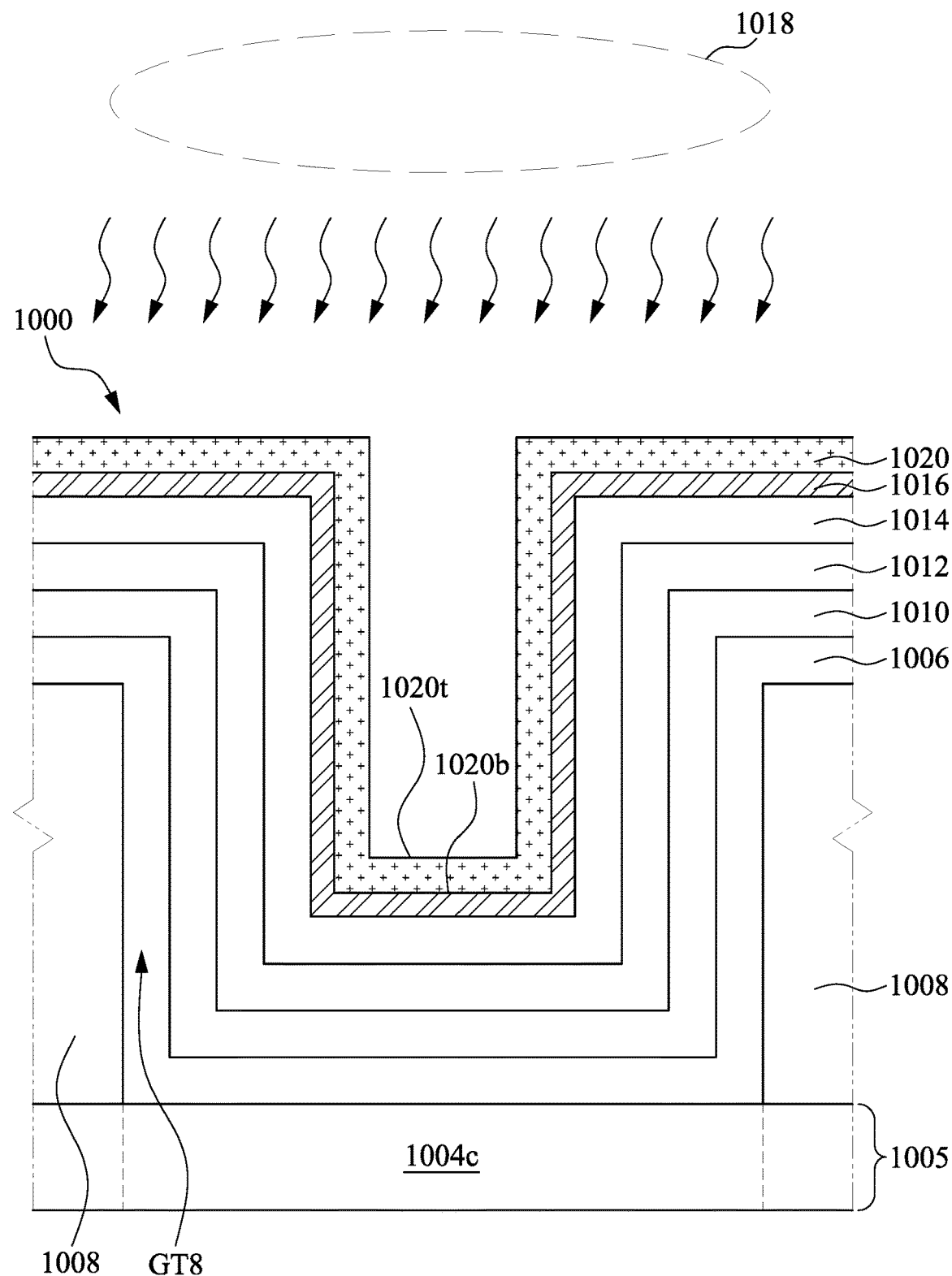
Figure 36A:
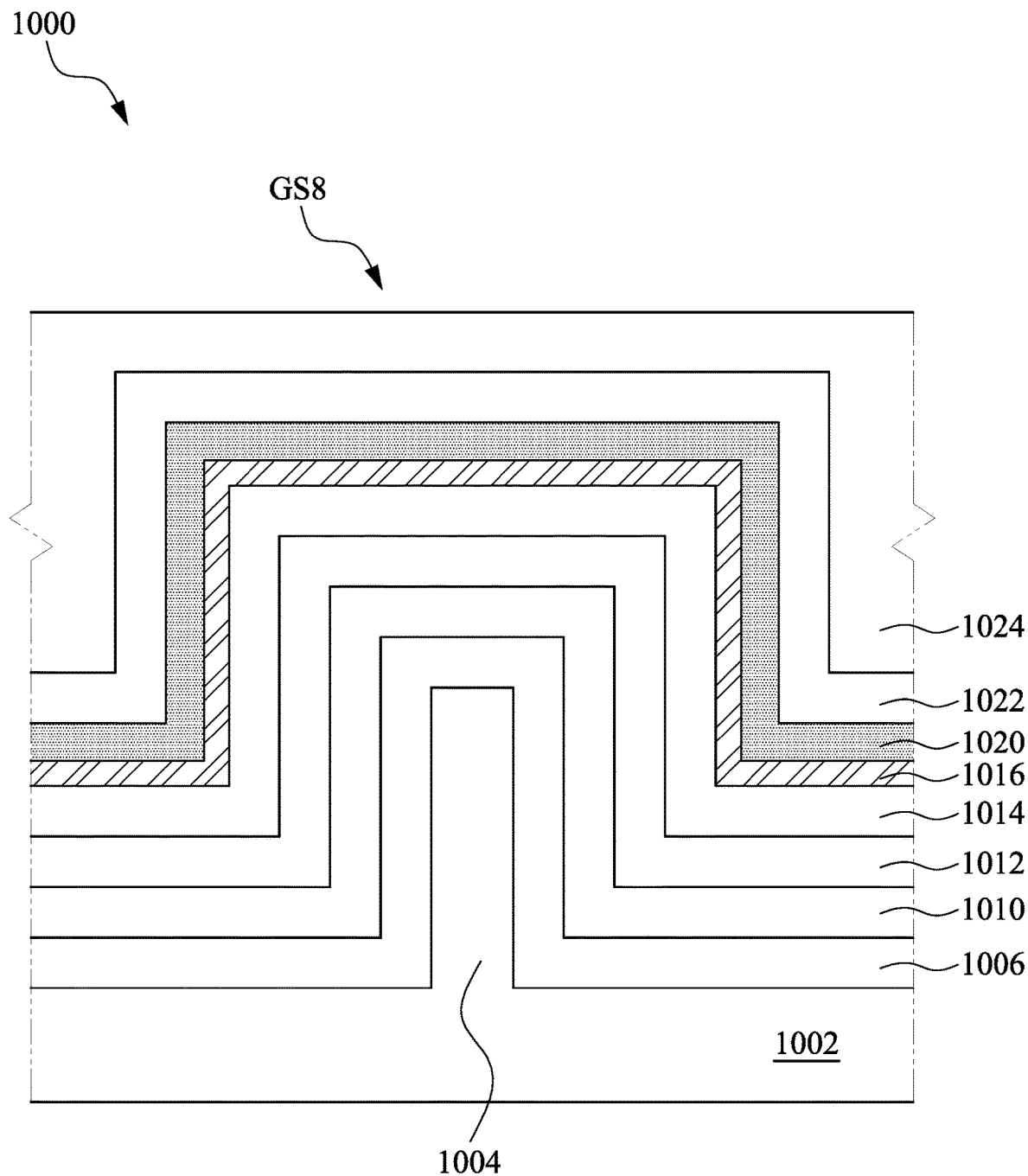
Figure 36B:
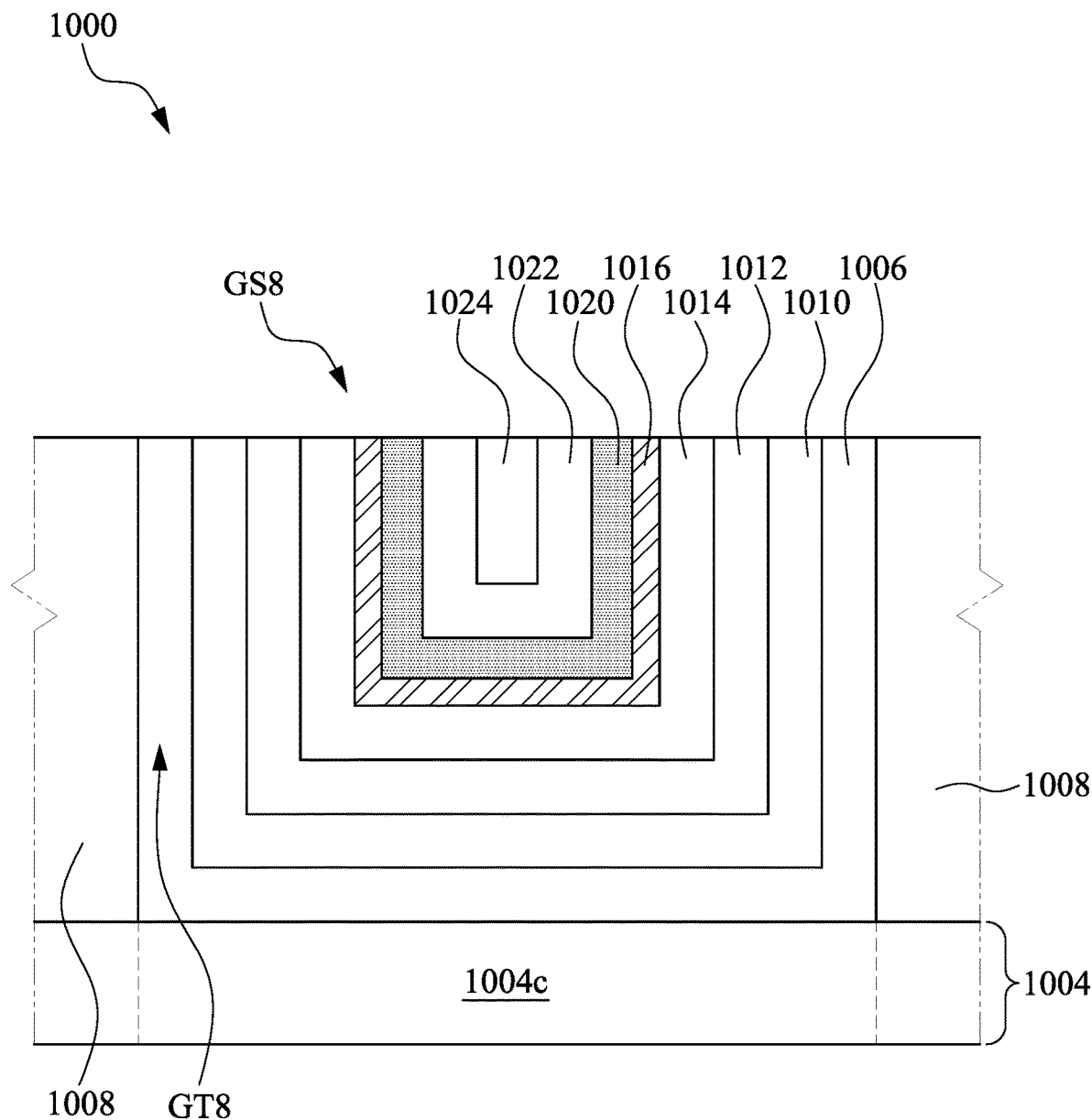

FIGS. 34A, 35A and 36A are cross-sectional views of a semiconductor device 1000 at various stages of the method M8 of FIG. 33 along a first cut (e.g., A-A' cut in FIG. 2) in some embodiments of the present disclosure. FIGS. 34B, 35B and 36B are cross-sectional views of the semiconductor device 1000 at various stages of the method M8 of FIG. 33 along a second cut (e.g., B-B' cut in FIG. 2) in some embodiments of the present disclosure. FIGS. 34A-36B illustrate fabrication of a gate stack of a FinFET device using a gate-last process. The illustration is merely exemplary and is not intended to be limiting beyond what is specifically recited in the claims that follow. It is understood that additional operations may be provided before, during, and after the operations shown by FIG. 33, and some of the operations described below can be replaced or eliminated for additional embodiments of the method. The order of the operations/processes may be interchangeable.

The method M8 begins at block S81 where a gate dielectric layer, a cap layer, an ESL, a P-type work-function layer and an N-type work-function layer are formed in sequence over a channel region. Referring to FIGS. 34A and 34B, in some embodiments of block S81, a gate dielectric layer 1006, a cap layer 1010, an ESL 1012, a P-type work-function layer 1014 and an N-type work-function layer 1016 are formed in sequence over a semiconductor fin 1004 extending from a substrate 1002 and in a gate trench GT8 between gate spacers 1008. A portion of the semiconductor fin 1004 under the gate trench GT8 can serve as a channel region 1004$c$ of the semiconductor device 1000. The gate dielectric layer 1006 may be substantially the same as the gate dielectric layer 306, as described above. The cap layer 1010 may be substantially the same as the cap layer 310 not treated with the treatment 312. The ESL 1012, the P-type work-function layer 1014 and the N-type work-function layer 1016 may be substantially the same as the ESL 316, the P-type work-function layer 318 and the N-type work-function layer 320, respectively.

The method M8 then proceeds to block S82 where a treatment using an aluminum-containing gas or plasma is performed to the N-type work-function layer. With reference to FIGS. 35A and 35B, in some embodiments of block S82, a treatment 1018 using the aluminum-containing gas or plasma is carried out such that a constituent (e.g., aluminum) of the aluminum-containing gas or plasma is diffused into the exposed N-type work-function layer 1016. In this way, some aluminum atoms diffuse through grain boundaries of the N-type work-function layer 1016 into the N-type work-function layer 1016, some aluminum atoms are bond with atoms in the N-type work-function layer 1016 to form an aluminum compound (e.g., aluminum nitride or aluminum carbide). As a result, a surface layer (i.e., a top portion) of the N-type work-function layer 1016 is converted to an aluminum-containing layer 1020 with higher aluminum concentration than the remaining underlying N-type work-function layer 1016. In some embodiments, the N-type work-function layer 1016 and the aluminum-containing layer 1020 are in combination referred to as a metal element-containing layer, wherein the aluminum-containing layer 1020 is a top portion of the metal element-containing layer, and the N-type work-function layer 1016 is a bottom portion of the metal element-containing layer. In some embodiments, the aluminum concentration of the aluminum-containing layer 1020 (i.e., the atomic ratio of aluminum to all chemical elements in the aluminum-containing layer 1020, expressed in terms of percentage) ranges from about 5% to about 30%, while the aluminum concentration of the underlying N-type work-function layer 1016 (i.e., the atomic ratio of aluminum to all chemical elements in the N-type work-function layer 1016, expressed in terms of percentage) is less than about 1%. The resulting aluminum-containing layer 1020 has a thickness from about 5 Angstroms to about 50 Angstroms. If the thickness of the aluminum-containing layer 1020 is greater than about 50 Angstroms, aluminum concentration in the gate stack might be out of a desired range. If the thickness of the aluminum-containing layer 1020 is less than about 5 Angstroms, the aluminum-containing layer 1020 might be too thin to lower the threshold voltage. In some embodiments, the aluminum-containing layer 1020 may be equivalently referred to as a dopant-containing layer that comprises a dopant of the dopant-containing gas (i.e., aluminum of the aluminum-containing gas). As discussed above, aluminum is an N-type work-function with a work function lower than the mid-gap work function of silicon, and hence the treatment 1018 can benefit in reducing the threshold voltage of an N-type transistor.

Aluminum diffusion (or aluminum migration) attributed to the treatment 1018 may lead to a spatially varied aluminum concentration in the aluminum-containing layer 1020. For example, a top portion 1020t of the aluminum-containing layer 1020 has an aluminum concentration higher than an aluminum concentration of a bottom portion 1020b of the aluminum-containing layer 1020 that is in a position lower than the top portion 1020t. In some embodiments, the aluminum-containing layer 1020 has a gradient aluminum concentration that decreases along a direction from the top portion 1020t to the bottom portion 1020b. In some embodiments, the treatment 1018 is a thermal soaking process with plasma turned off or turned on, as described above with respect to the treatment 712. In some embodiments, a surface clean process, such as a plasma process, is performed to the N-type work-function layer 1016 prior to the treatment 1018, so as to remove unwanted materials (e.g., oxide) on the N-type work-function layer 1016.

The method M8 then proceeds to block S53 where metals are formed over the treated N-type work-function layer and planarized to form a gate stack. With reference to FIGS. 36A and 36B, in some embodiments of block S83, a glue layer (or wetting layer) 1022 and a fill layer 1024 are formed in sequence into the gate trench GT8 and over the aluminum-containing layer 1020. The gate dielectric layer 1006, the cap layer 1010, the ESL 1012, the P-type work-function layer 1014, the N-type work-function layer 1016, the aluminum-containing layer 1020, the glue layer 1022 and the fill layer 1024 are in combination referred to as a gate stack GS8. The glue layer 1022 and the fill layer 1024 are substantially the same as the glue layer 322 and the fill layer 324, respectively.

Figure 37:
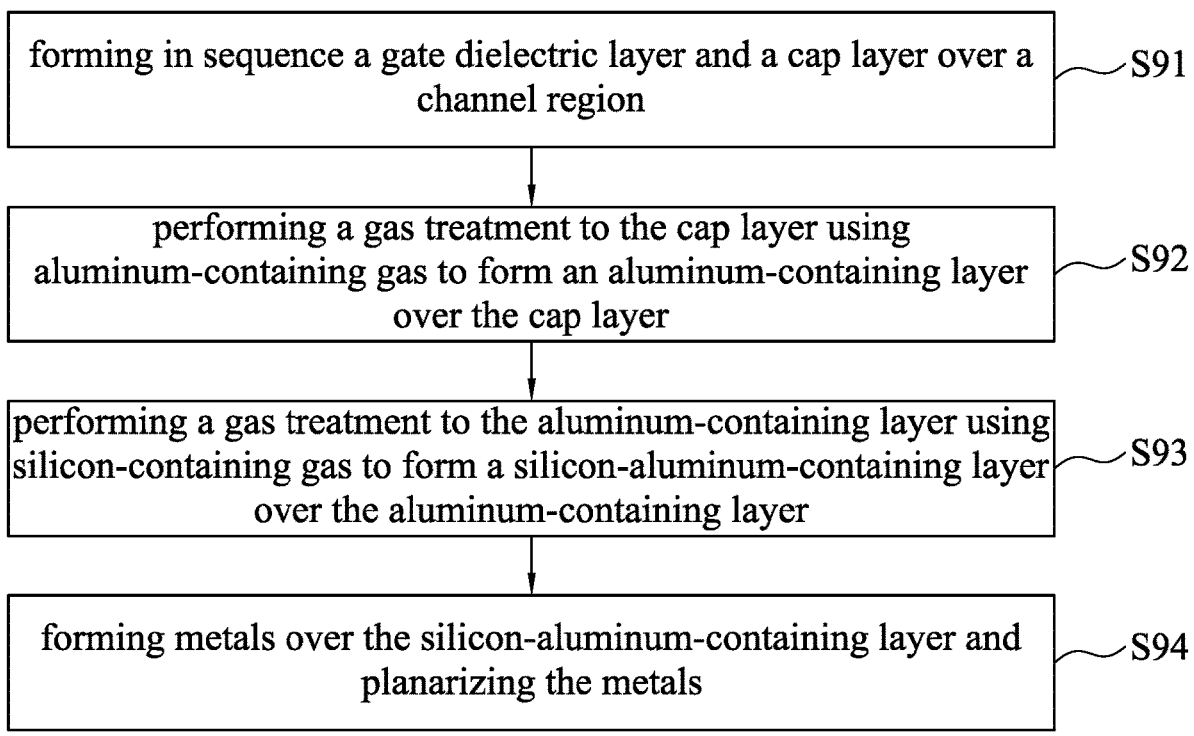
FIG. 37 is a flow chart of a method of forming a gate stack in accordance with some embodiments.

Some embodiments of the present disclosure employ multiple treatments with different gases to improve control of threshold voltage of a transistor. For example, referring now to FIG. 37, illustrated is a method M9 that includes two treatments using different gases in accordance with some embodiments of the present disclosure. The method M9 may be implemented on either a planar device or a multi-gate device, and may be applicable to either one of a gate-last process or a gate first process.

FIGS. 38A, 39A, 40A and 41A are cross-sectional views of a semiconductor device 1100 at various stages of the method M9 of FIG. 37 along a first cut (e.g., A-A' cut in FIG. 2) in some embodiments of the present disclosure. FIGS. 38B, 39B, 40B and 41B are cross-sectional views of the semiconductor device 1100 at various stages of the method M9 of FIG. 37 along a second cut (e.g., B-B' cut in FIG. 2) in some embodiments of the present disclosure. FIGS. 38A-41B illustrate fabrication of a gate stack of a FinFET device using a gate-last process. The illustration is merely exemplary and is not intended to be limiting beyond what is specifically recited in the claims that follow. It is understood that additional operations may be provided before, during, and after the operations shown by FIG. 37, and some of the operations described below can be replaced or eliminated for additional embodiments of the method. The order of the operations/processes may be interchangeable.

Figure 38A:
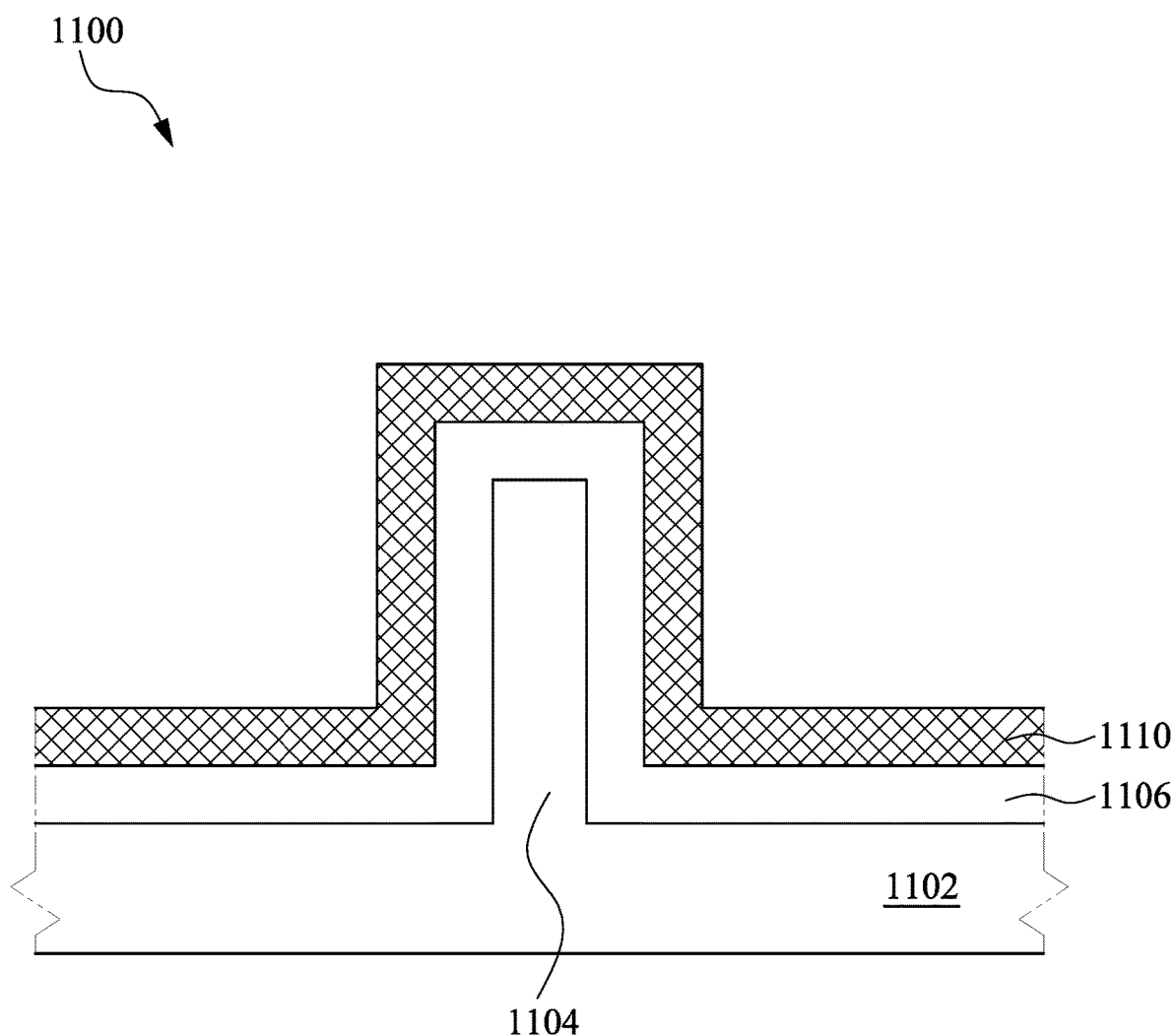
FIGS. 38A, 39A, 40A and 41A are cross-sectional views of a semiconductor device at various stages of the method of FIG. 37 along a first cut in some embodiments of the present disclosure.
Figure 38B:
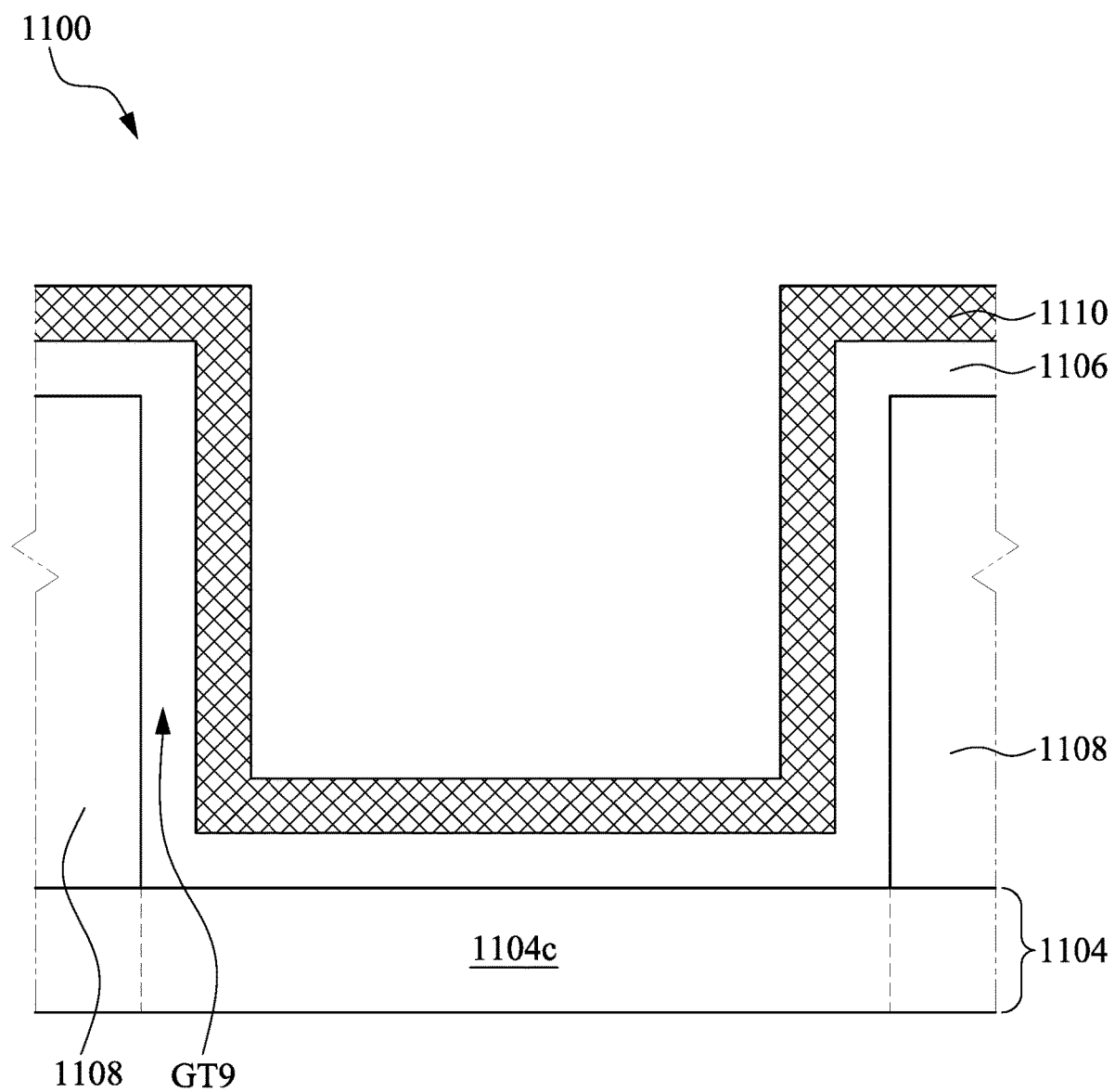
FIGS. 38B, 39B, 40B and 41B are cross-sectional views of the semiconductor device at various stages of the method of FIG. 37 along a second cut in some embodiments of the present disclosure.
Figure 39A:
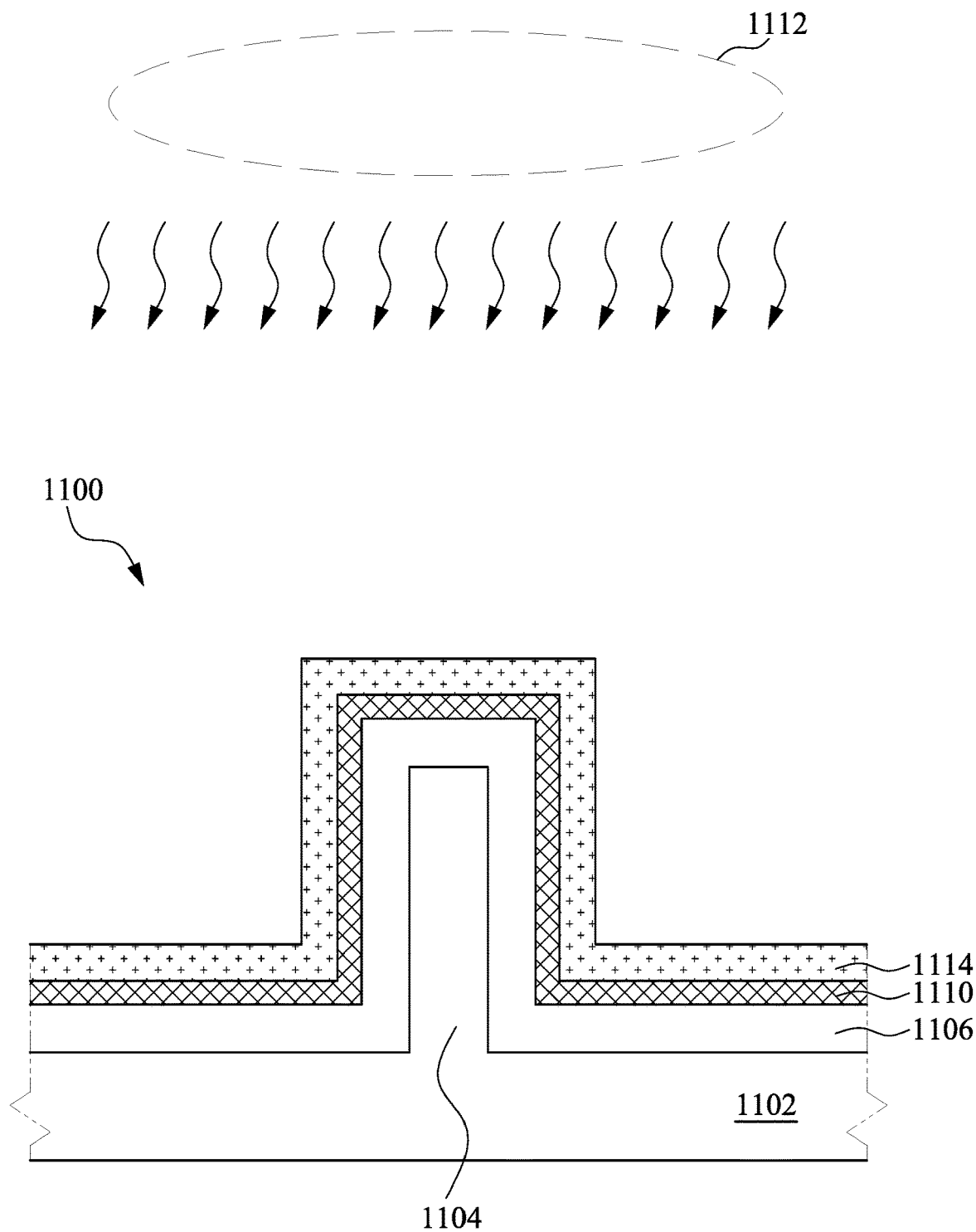
Figure 39B:
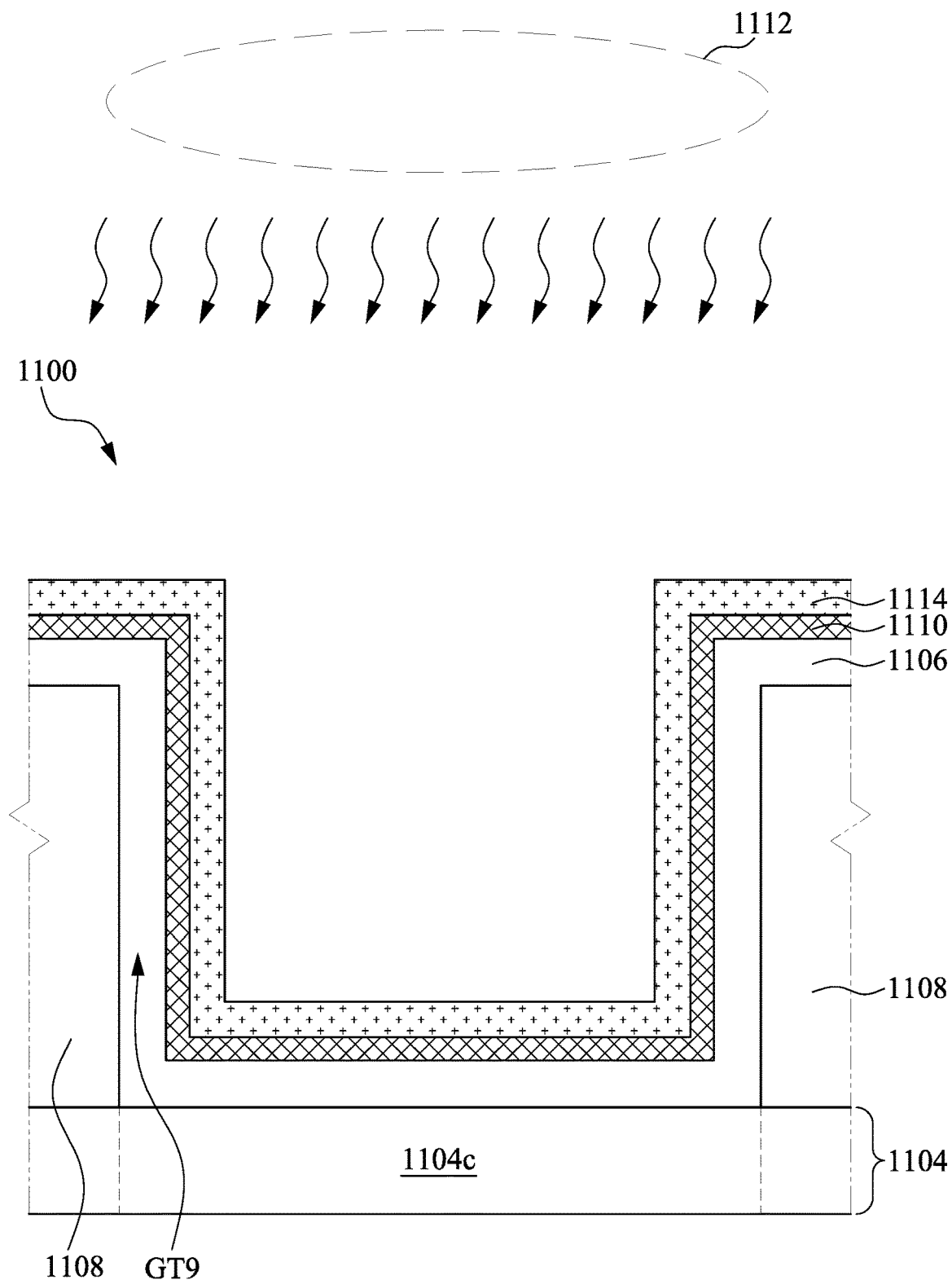

Blocks S91 and S92 of the method M9 are substantially the same as blocks S51 and S52 of the method M5, as discussed above. Referring to FIGS. 38A and 38B, in some embodiments, of block S51, a gate dielectric 1106 and a cap layer 1110 are formed in sequence over a channel region 1104c of a semiconductor fin 1104 extending from a substrate 1102 and in a gate trench GT9 between gate spacers 1108. Referring to FIGS. 39A and 39B, in some embodiments of block S92, a treatment 1112 using an aluminum-containing gas or plasma is carried out such that a constituent (e.g., aluminum) of the aluminum-containing gas or plasma is diffused diffuse into the exposed cap layer 1110. In this way, a surface layer (i.e., a top portion) of the cap layer 1110 is converted to an aluminum-containing layer 1114 with higher aluminum concentration than the remaining underlying cap layer 1110. In some embodiments, the cap layer 1110 and the aluminum-containing layer 1114 are in combination referred to as a metal element-containing layer, wherein the aluminum-containing layer 1114 is a top portion of the metal element-containing layer, and the cap layer 1110 is a bottom portion of the metal element-containing layer. In some embodiments, the aluminum concentration of the aluminum-containing layer 1114 (i.e., the atomic ratio of aluminum to all chemical elements in the aluminum-containing layer 1114, expressed in terms of percentage) ranges from about 5% to about 30%, while the aluminum concentration of the underlying cap layer 1110 (i.e., the atomic ratio of aluminum to all chemical elements in the cap layer 1110, expressed in terms of percentage) is less than about 1%. The resulting aluminum-containing layer 1114 has a thickness from about 5 Angstroms to about 50 Angstroms. If the thickness of the aluminum-containing layer 1114 is greater than about 50 Angstroms, aluminum concentration in the gate stack might be out of a desired range. If the thickness of the aluminum-containing layer 1114 is less than about 5 Angstroms, the aluminum-containing layer 1114 might be too thin to lower the threshold voltage. As discussed above, aluminum is an N-type work-function with a work function lower than the mid-gap work function of silicon, and hence the treatment 1112 can benefit in reducing the threshold voltage of an N-type transistor. In some embodiments, the treatment 1112 is a thermal soaking process with plasma turned off or turned on, as described above with respect to the treatment 712.

Figure 40A:
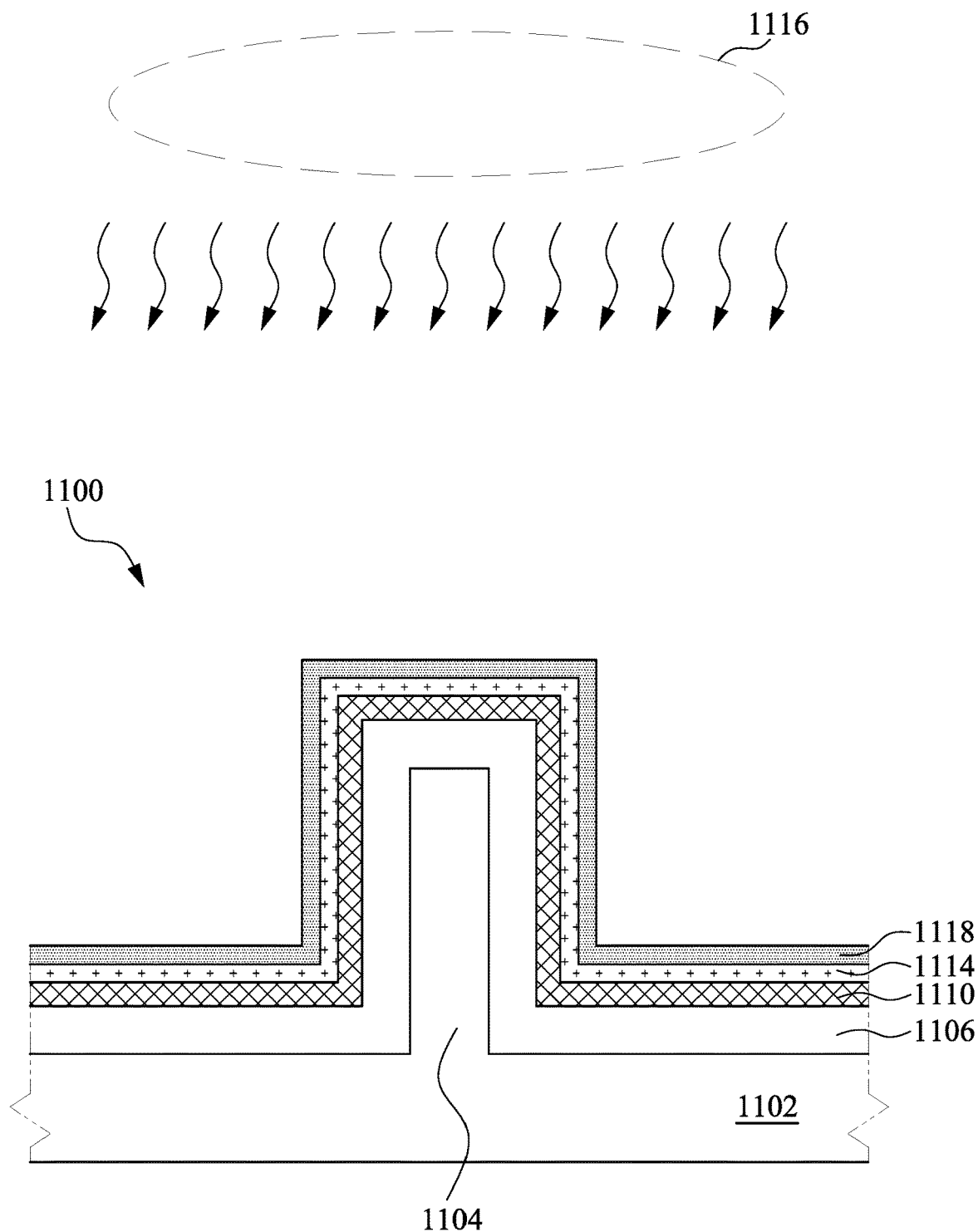
Figure 40B:
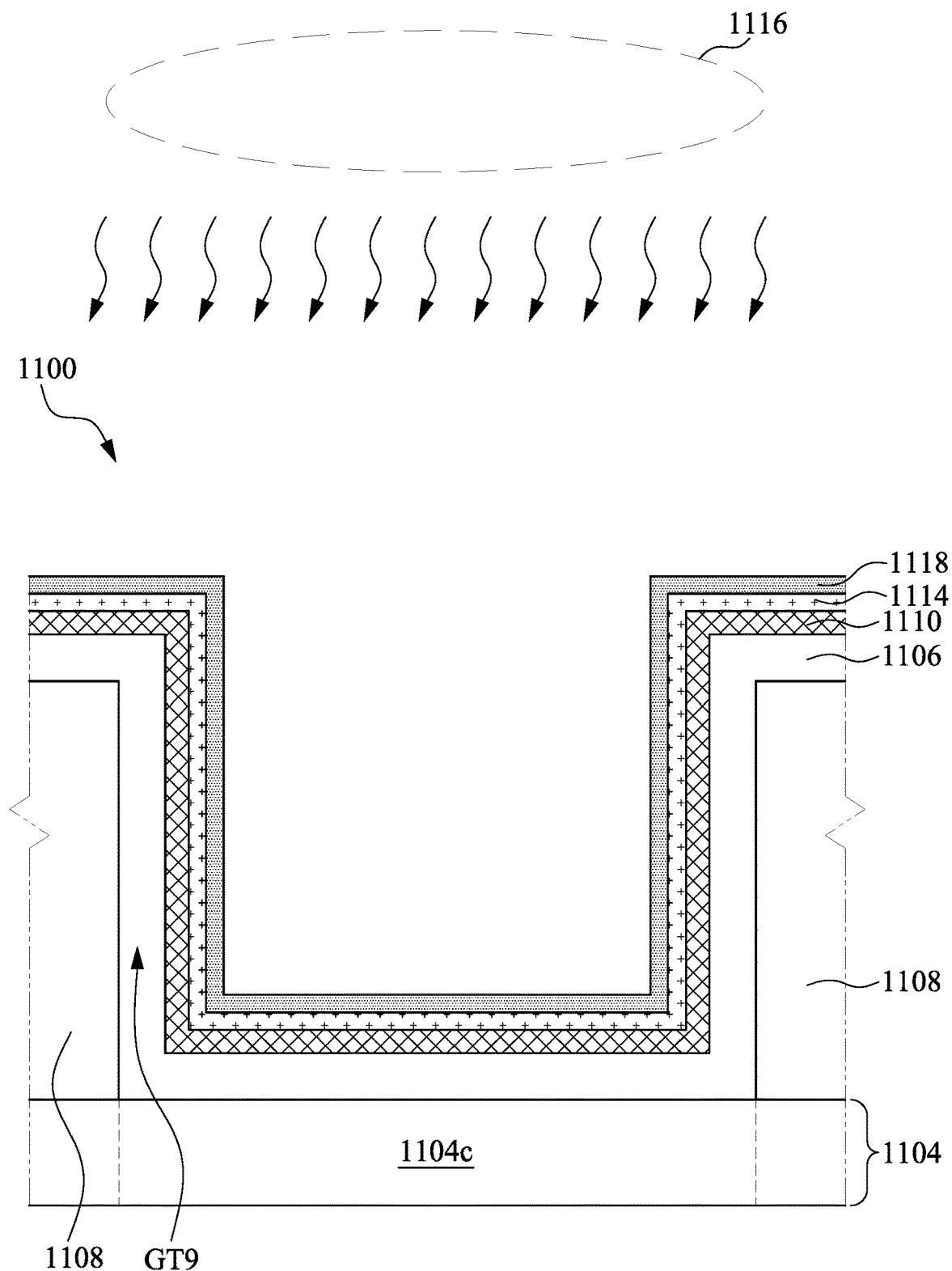

The method M9 then proceeds to block S93 where a treatment using a silicon-containing gas or plasma is performed to the aluminum-containing layer. With reference to FIGS. 40A and 40B, in some embodiments of block S93, a treatment 1116 using the silicon-containing gas or plasma is carried out such that a constituent (e.g., silicon) of the silicon-containing gas or plasma is diffused into the exposed aluminum-containing layer 1114. In this way, some silicon atoms diffuse into the aluminum-containing layer 1114 and in turn bond with atoms in the aluminum-containing layer 1114 to form a silicon compound (e.g., silicon nitride). As a result, a surface layer (i.e. a top portion) of the aluminum-containing layer 1114 is converted to a silicon-aluminum-containing layer 1118 with higher silicon concentration than the remaining underlying aluminum-containing layer 1114. For example, the silicon concentration of the silicon-aluminum-containing layer 1118 (i.e., the atomic ratio of silicon to all chemical elements in the silicon-aluminum-containing layer 1118, expressed in terms of percentage) ranges from about 5% to about 30%, while the silicon concentration of the underlying aluminum-containing layer 1114 (i.e., the atomic ratio of silicon to all chemical elements in the aluminum-containing layer 1114, expressed in terms of percentage) is less than about 1%. The resulting silicon-aluminum-containing layer 1118 has a thickness from about 5 Angstroms to about 50 Angstroms. If the thickness of the silicon-aluminum-containing layer 1118 is greater than about 50 Angstroms, the threshold voltage of the gate stack might be unsatisfactory. If the thickness of the silicon-aluminum-containing layer 1118 is less than about 5 Angstroms, the silicon-aluminum-containing layer 1118 might be too thin to prevent oxidation of the aluminum-containing layer 1114. In some embodiments, the treatment 1116 is a thermal soaking process with plasma turned off or turned on, as described above with respect to the treatment 312.

In some embodiments, the silicon-containing gas (or plasma) treatment 1116 and aluminum-containing gas (or plasma) treatment 1112 are in-situ performed, for example, within a processing system using an ALD cluster tool. This is advantageous to prevent the aluminum-containing layer 1114 from oxidation because the aluminum-containing layer 1114 is covered by the silicon-aluminum-containing layer 1118 in an in-situ process. It is understood that oxidation of the aluminum-containing layer 1114 would lead to unwanted increase of threshold voltage of an N-type transistor. However, since oxidation of the aluminum-containing layer 1114 is mitigated, the unwanted increase of the threshold voltage can be addressed.

Figure 41A:
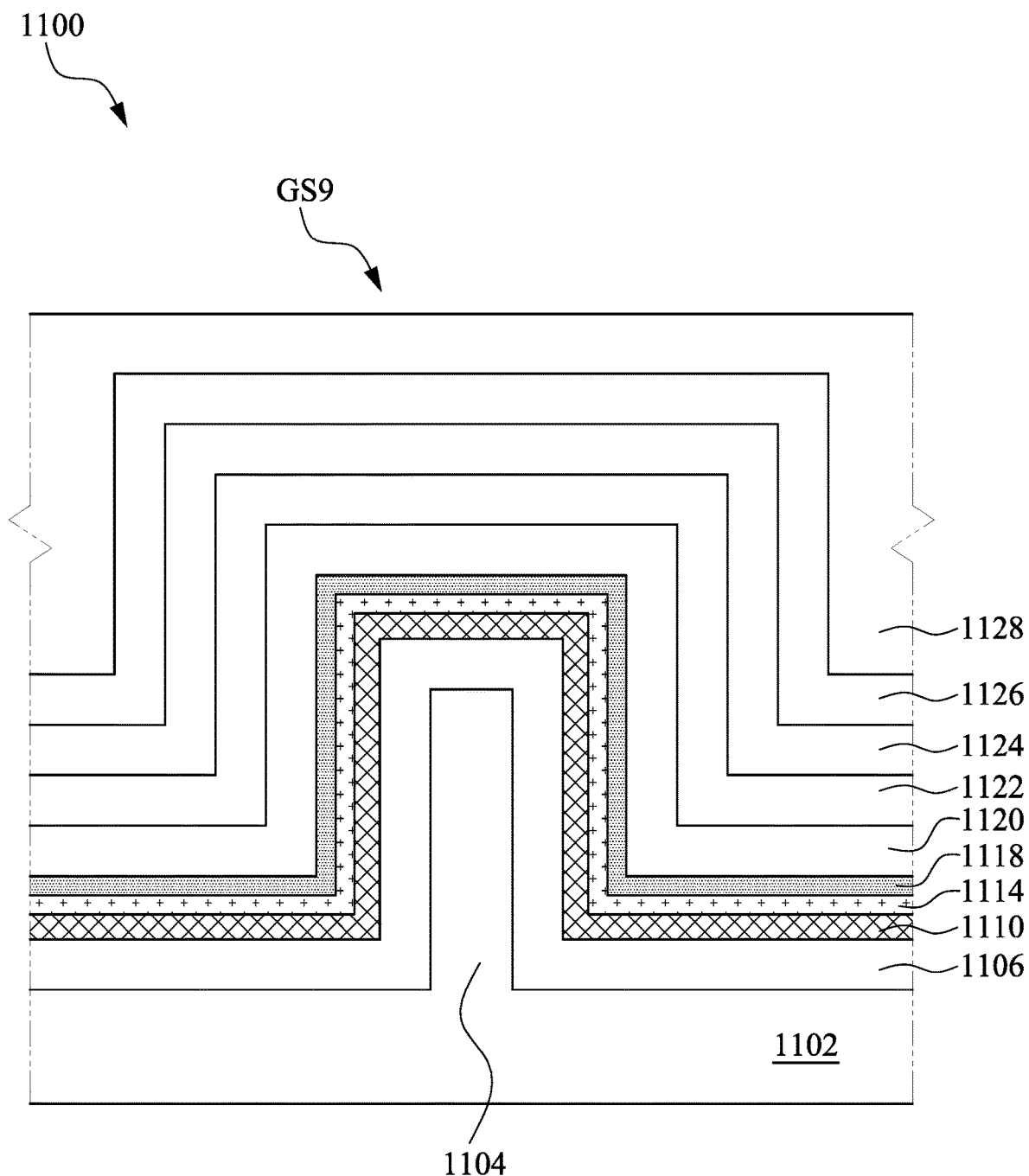
Figure 41B:
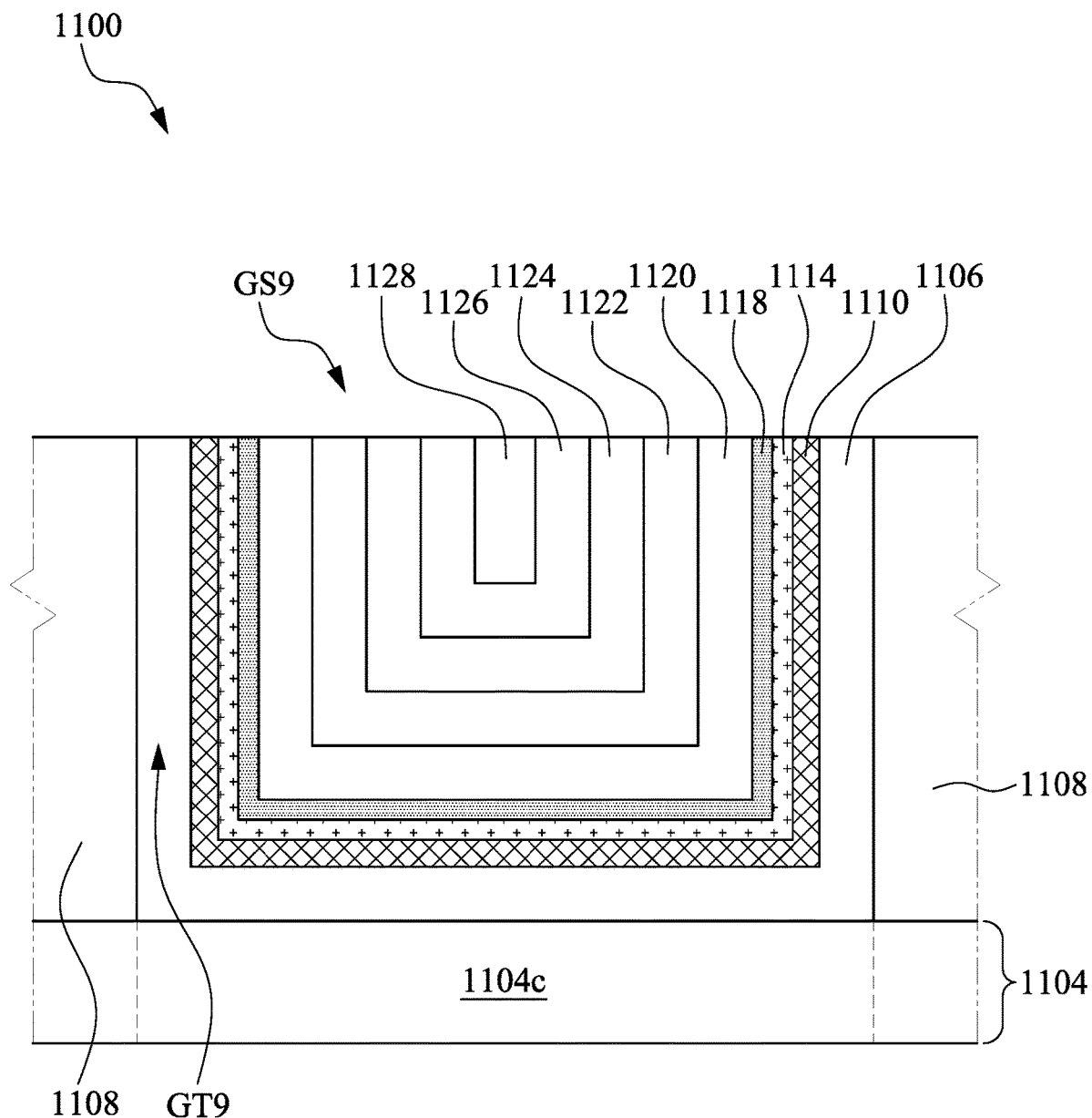

The method M9 then proceeds to block S94 where metals are formed over the silicon-aluminum-containing layer and planarized to form a gate stack. With reference to FIGS. 41A and 41B, in some embodiments of block S94, an ESL 1120, a P-type work-function layer 1122, an N-type work-function layer 1124, a glue layer (or wetting layer) 1126, and a fill layer 1128 are formed in sequence into the gate trench GT9 and over the silicon-aluminum-containing layer 1118. The gate dielectric layer 1106, the cap layer 1110, the aluminum-containing layer 1114, the silicon-aluminum-containing layer 1118, the ESL 1120, the P-type work-function layer 1122, the N-type work-function layer 1124, the glue layer 1126 and the fill layer 1128 are in combination referred to as a gate stack GS9. The ESL 1120, the P-type work-function layer 1122, the N-type work-function layer 1124, the glue layer 1126 and the fill layer 1128 are substantially the same as the ESL 316, the P-type work-function layer 318, the N-type work-function layer 320, the glue layer 322 and the fill layer 324, respectively.

The concepts of multiple treatments using different gases or plasmas as discussed above can be used to treat other layers of the gat stack. For example, a treatment using a silicon-containing gas or plasma is performed after block S62 of the method M6 as shown in FIG. 25, so that a surface layer of the aluminum-containing layer (e.g., aluminum-containing layer 816 as shown in FIGS. 27A and 27B) over the ESL (e.g., ESL 812 as shown in FIGS. 27A and 27B) is converted to a silicon-aluminum-containing layer. Similarly, a treatment using a silicon-containing gas or plasma can be performed after block S72 of the method M7 as shown in FIG. 29, so that a surface layer of the aluminum-containing layer (e.g., aluminum-containing layer 918 as shown in FIGS. 31A and 31B) over the P-type work-function layer (e.g., P-type work-function layer 914 as shown in FIGS. 31A and 31B) is converted to a silicon-aluminum-containing layer. Further, a treatment using a silicon-containing gas or plasma can be performed after block S82 of the method M8 as shown in FIG. 33, so that a surface layer of the aluminum-containing layer (e.g., aluminum-containing layer 1020 as shown in FIGS. 35A and 35B) over the N-type work-function layer (e.g., N-type work-function layer 1016 as shown in FIGS. 35A and 35B) is converted to a silicon-aluminum-containing layer.

Figure 42:
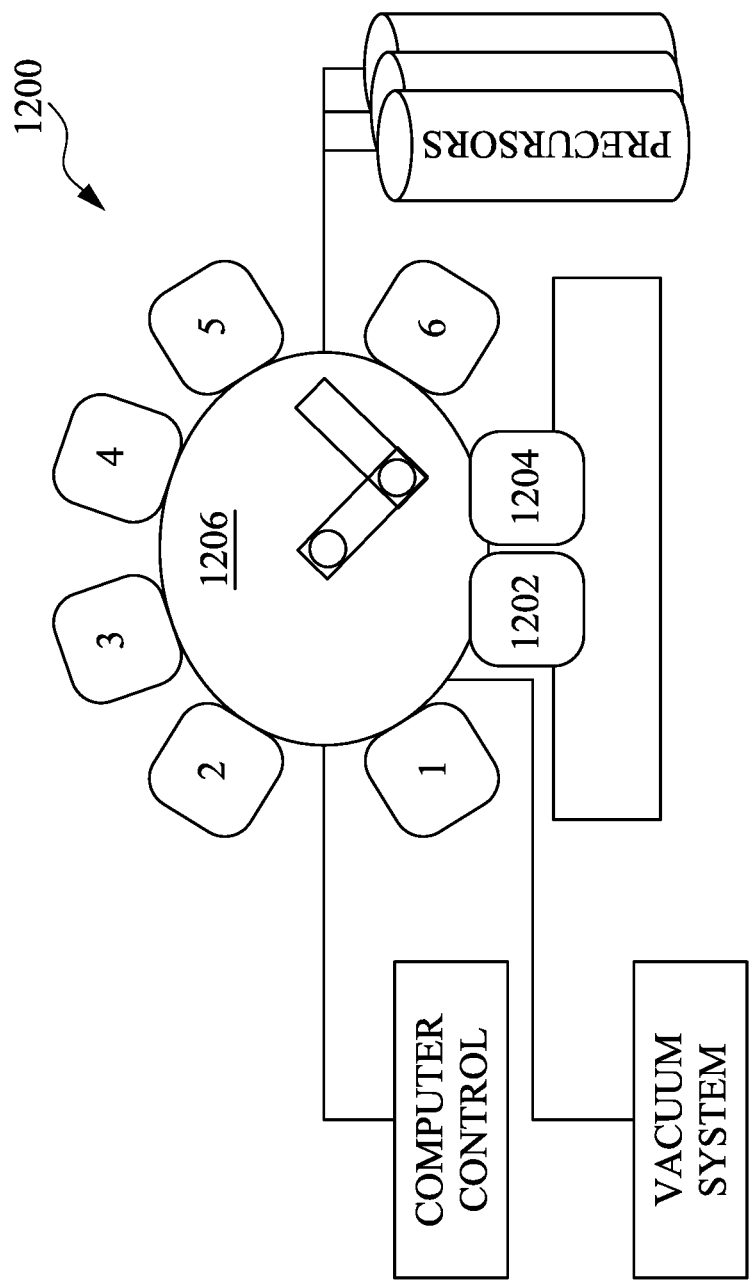
FIG. 42 is a schematic top-view diagram of an exemplary multi-chamber processing system, in accordance with some embodiments.

Referring now to FIG. 42, illustrated therein is a schematic top-view diagram of an exemplary multi-chamber processing system 1200. In some embodiments, the system 1200 may be equivalently referred to as a "cluster tool". The system 1200 may generally include load lock chambers 1202, 1204, a wafer handling chamber 1206, and a plurality of processing chambers 1-6. In some embodiments, the load lock chambers 1202 and 1204 provide for the transfer of substrates into and out of the system 1200. In various embodiments, the system 1200 is under vacuum, and the load lock chambers 1202 and 1204 may "pump down" the substrates introduced into the system 1200 (e.g., by way of a mechanical pump and/or a turbomolecular pump). In some embodiments, the load lock chambers 1202 and 1204 may be adapted to receive a single wafer or a plurality of wafers (e.g., loaded into a cassette). By way of example, the load lock chambers 1202 and 1204 may be separated from the wafer handling chamber 1206 by way of a gate valve, allowing the wafer handling chamber 1206 to remain under vacuum when one or both of the load lock chambers 1202 and 1204 are vented.

In some embodiments, the wafer handling chamber 1206 is equipped with an automated, robotic arm that may move smoothly along any of a horizontal, vertical, and/or rotational axis so as to transfer substrates between the load lock chambers 1202, 1204 and any of the substrate processing chambers 1-6. Each processing chamber 1-6 may be configured to perform a number of substrate processing operations such as ALD, CVD, PVD, etching, as well as a number of metrology operations such as XPS analysis, AFM analysis, and/or other suitable processing or metrology operations. In various embodiments, the system 1200 may have more or less processing chambers.

In some embodiments, the treatment using silicon-containing gas (or plasma) or aluminum containing gas (or plasma) is in-situ performed after the deposition of a metal element-containing layer (e.g., a cap layer, an ESL, a P-type work-function layer, or an N-work function layer). By way of example, the treatment and deposition of the metal element-containing layer are performed in the same processing chamber (e.g., one of the processing chambers 1-6 that is an ALD processing chamber). In some embodiments, the metal element-containing layer is not exposed to an external environment external to the processing chamber (e.g., the one of the processing chambers 1-6) after deposition of the metal element-containing layer and before performing the treatment. In this way, oxidation of the deposited metal element-containing layer can be prevented.

In some embodiments, the treatment using the silicon-containing gas or plasma is in-situ performed after the treatment using the aluminum-containing gas or plasma, as discussed above. By way of example, the treatment using the silicon-containing gas or plasma and the treatment using the aluminum-containing gas or plasma are performed in the same process chamber (e.g., one of the processing chambers 1-6 that is an ALD processing chamber). In some embodiments, the metal element-containing layer after treated with the aluminum-containing gas or plasma is not exposed to an external environment external to the processing chamber (e.g., the one of the processing chambers 1-6) after before being treated with the silicon-containing gas or plasma. In this way, oxidation of the aluminum-containing layer formed by the aluminum-containing gas (or plasma) treatment can be prevented.

The silicon-containing gas (or plasma) and the aluminum-containing gas (or plasma) employed in the treatments as discussed above are some examples for describing the concept of tuning a threshold voltage of a transistor using one or more gas (or plasma) treatments. Other gases can be employed in some other embodiments. Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that oxidation of a gate metal can be prevented by using a silicon-containing gas (or plasma) treatment, which in turn will reduce unwanted threshold voltage increase. Another advantage is that fluorine contamination to a gate metal can be prevented by using a silicon-containing gas (or plasma) treatment, which in turn will reduce unwanted threshold voltage increase. Yet another advantage is that a threshold voltage of an N-type transistor can be reduced by using an aluminum-containing gas (or plasma) treatment.

According to some embodiments, a method includes forming a gate dielectric layer over a semiconductor substrate, forming a first metal element-containing layer over the gate dielectric layer, and thermal soaking the first metal element-containing layer in a first gas, such that a constituent of the first gas is diffused into the first metal element-containing layer.

According to some embodiments, forming the first metal element-containing layer and thermal soaking the first metal element-containing layer are performed in a same processing chamber.

According to some embodiments, thermal soaking the first metal element-containing layer is performed at a temperature from about 200° C. to about 500° C.

According to some embodiments, the method further includes forming a second metal element-containing layer over the first metal element-containing layer using a precursor, wherein the constituent of the first gas diffused into the first metal element-containing layer bonds with a constituent of the precursor.

According to some embodiments, the constituent of the first gas includes an N-work function metal or silicon.

According to some embodiments, the method further includes thermal soaking the first metal element-containing layer in a second gas after thermal soaking the first metal element-containing layer in the first gas.

According to some embodiments, thermal soaking the first metal element-containing layer in the first gas and thermal soaking the first metal element-containing layer in the second gas are performed in a same processing chamber.

According to some embodiments, the first gas is an aluminum-containing gas, and the second gas is a silicon-containing gas.

According to some embodiments, thermal soaking the first metal element-containing layer is performed without using plasma.

According to some embodiments, the method further includes providing a second gas to react with the first gas, such that a compound of the first gas is dissociated.

According to some embodiments, a method includes forming a gate dielectric layer over a channel region, forming a first metal element-containing layer over the gate dielectric layer, and treating the first metal element-containing layer with a first dopant-containing plasma, such that a first dopant is doped into a surface layer of the first metal element-containing layer from the first dopant-containing plasma to convert the surface layer of the first metal element-containing layer to a first dopant-containing layer.

According to some embodiments, the method further includes forming a second metal element-containing layer over the first dopant-containing layer using a precursor, wherein the first dopant in the first dopant-containing layer bonds with a constituent of the precursor.

According to some embodiments, the first dopant in the first dopant-containing layer is silicon, and the method further includes forming a second metal element-containing layer over the first dopant-containing layer using a fluorine-containing precursor, wherein fluorine in the fluorine-containing precursor bonds with the silicon in the first dopant-containing layer.

According to some embodiments, the first dopant-containing plasma is a hydride plasma.

According to some embodiments, the hydride plasma includes a silicon hydride or an aluminum hydride.

According to some embodiments, the first dopant-containing plasma includes a trimethylaluminum plasma or a triethylaluminum plasma.

According to some embodiments, the method further includes treating the first dopant-containing layer with a second dopant-containing plasma, such that a surface layer of the first dopant-containing layer is converted to a second dopant-containing layer comprising a second dopant of the second dopant-containing plasma.

According to some embodiments, a semiconductor device includes a semiconductor substrate and a gate stack over the semiconductor substrate. The gate stack includes a gate dielectric layer over the semiconductor substrate and a metal element-containing layer over the gate dielectric layer. The metal element-containing layer has a bottom portion, a top portion over the bottom portion and a dopant. A first concentration of the dopant in the top portion of the metal element-containing layer is higher than a second concentration of the dopant in the bottom portion of the metal element-containing layer.

According to some embodiments, the bottom portion of the metal element-containing layer is substantially free of the dopant.

According to some embodiments, the dopant comprises an N-work function metal.

In some embodiments, a semiconductor device includes a semiconductor substrate, a pair of source/drain regions, and a gate stack. The pair of source/drain regions is on the semiconductor substrate. The gate stack is laterally between the pair of source/drain regions and includes a gate dielectric layer over the semiconductor fin, a metal element-containing layer over the gate dielectric layer, and a fill layer over the metal element-containing layer. The metal element-containing layer has a dopant, and a concentration of the dopant in an upper portion of the metal element-containing layer is higher than a concentration of the dopant in a bottom portion of the metal element-containing layer.

In some embodiments, a semiconductor device includes a substrate, a semiconductor fin, a pair of source/drain regions, a gate dielectric layer, an aluminum-containing layer, a silicon-containing layer, and a work function metal layer. The semiconductor fin extends upwardly from the substrate. The pair of source/drain regions is on the semiconductor fin. The gate dielectric layer is laterally between the pair of source/drain regions. The aluminum-containing layer is over the gate dielectric layer. The silicon-containing layer is over the aluminum-containing layer. The work function metal layer is over the silicon-containing layer.

In some embodiments, a semiconductor device includes a substrate, a semiconductor fin, a gate dielectric layer, a silicon-free cap layer, a silicon-containing layer, a work function metal layer, and a tungsten layer. The semiconductor fin extends upwardly from the substrate. The gate dielectric layer is over the semiconductor fin. The silicon-free cap layer is over the gate dielectric layer. The silicon-containing layer is over the silicon-free cap layer. The work function metal layer is over the silicon-containing. The tungsten layer is over the work function metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate;
   a semiconductor fin extending from the substrate;
   a gate dielectric layer over the semiconductor fin;
   a metal nitride layer comprising a first portion over the gate dielectric layer, a second portion over the first portion, and a third portion over the second portion, wherein the second portion is doped with aluminum, and the third portion is doped with aluminum and silicon, and the second portion has an aluminum concentration greater than an aluminum concentration of the first portion; and
   a fill layer over the metal nitride layer.

2. The device of claim 1, further comprising:
   a p-type work function layer between the metal nitride layer and the fill layer.

3. The device of claim 1, further comprising:
   an n-type work function layer between the metal nitride layer and the fill layer.

4. The device of claim 1, wherein the aluminum concentration of the second portion of the metal nitride layer is in a range from about 5% to about 30%, wherein the aluminum concentration of the second portion of the metal nitride layer is an atomic ratio of aluminum to all chemical elements in the second portion of the metal nitride layer.

5. The device of claim 1, wherein the aluminum concentration of the first portion of the metal nitride layer is less than about 1%, wherein the aluminum concentration of the first portion of the metal nitride layer is an atomic ratio of aluminum to all chemical elements in the first portion of the metal nitride layer.

6. The device of claim 1, wherein the second portion of the metal nitride layer has a thickness in a range from about 5 Angstroms to about 50 Angstroms.

7. The device of claim 1, wherein there is a gradient of the aluminum concentration in the second portion of the metal nitride layer.

8. The device of claim 1, wherein both the first portion and the second portion of the metal nitride layer comprise titanium nitride or tantalum nitride.

9. The device of claim 1, wherein the third portion has a silicon concentration greater than a silicon concentration of the second portion of the metal nitride layer.

10. The device of claim 1, wherein the third portion of the metal nitride layer comprises titanium nitride doped with aluminum and silicon.

11. A device comprising:
    a semiconductor fin protruding above a substrate;
    a gate dielectric layer over the semiconductor fin;
    a metal nitride layer capping the gate dielectric layer, the metal nitride layer comprising a lower portion, a middle portion over the lower portion, and an upper portion over the middle portion, wherein the middle portion is doped with aluminum, and the upper portion is doped with aluminum and silicon, wherein the upper portion of the metal nitride layer has a silicon concentration greater than a silicon concentration of the lower portion of the metal nitride layer; and
    a work function layer over the metal nitride layer and having a work function lower than a work function of metal nitride of the metal nitride layer.

12. The device of claim 11, wherein the silicon concentration of the upper portion of the metal nitride layer is in a range from about 5% to about 30%, wherein the silicon concentration of the upper portion of the metal nitride layer is an atomic ratio of silicon to all chemical elements in the upper portion of the metal nitride layer.

13. The device of claim 11, wherein the silicon concentration of the lower portion of the metal nitride layer is less than about 1%, wherein the silicon concentration of the lower portion of the metal nitride layer is an atomic ratio of silicon to all chemical elements in the lower portion of the metal nitride layer.

14. The device of claim 11, wherein the upper portion of the metal nitride layer has a thickness in a range from about 5 Angstroms to about 50 Angstroms.

15. The device of claim 11, wherein the work function of the metal nitride of the metal nitride layer is higher than a mid-gap work function that is at a middle level of a valance band and a conduction band of silicon.

16. The device of claim 11, wherein the work function of the work function layer is lower than a mid-gap work function that is at a middle level of a valance band and a conduction band of silicon.

17. A device comprising:
a semiconductor fin over a substrate;
a gate dielectric layer over the semiconductor fin;
a cap layer, formed of a p-type work function material, over the gate dielectric layer, wherein a first portion of the p-type work function material is doped with aluminum; and
an n-type work function layer over the aluminum-doped first portion of the p-type work function material, wherein the n-type work function layer is spaced apart from the aluminum-doped first portion of the p-type work function material.

18. The device of claim 17, wherein the first portion of the p-type work function material has an aluminum concentration greater than an aluminum concentration of a second portion of the p-type work function material, wherein the second portion is below the first portion.

19. The device of claim 17, wherein the first portion of the p-type work function material has an aluminum concentration increasing as a distance from the substrate increases.

20. The device of claim 17, wherein a second portion of the p-type work function material is doped with aluminum and silicon, and the second portion of the p-type work function material is over the first portion of the p-type work function material.

* * * * *